(12) United States Patent
Xie et al.

(10) Patent No.: US 12,253,874 B2
(45) Date of Patent: Mar. 18, 2025

(54) HOUSEHOLD APPLIANCE KNOB

(71) Applicant: FOSHAN SHUNDE MIDEA ELECTRICAL HEATING APPLIANCES MANUFACTURING CO., LTD., Foshan (CN)

(72) Inventors: Zhaojia Xie, Foshan (CN); Yunfeng Wang, Foshan (CN); Shufeng Huang, Foshan (CN); Deyong Jiang, Foshan (CN); Taiyang Jiang, Foshan (CN); Liang Zheng, Foshan (CN)

(73) Assignee: FOSHAN SHUNDE MIDEA ELECTRICAL HEATING APPLIANCES MANUFACTURING CO., LTD., Foshan (CN)

( * ) Notice: Subject to any disclaimer, the term of this patent is extended or adjusted under 35 U.S.C. 154(b) by 195 days.

(21) Appl. No.: 17/772,901

(22) PCT Filed: Nov. 30, 2020

(86) PCT No.: PCT/CN2020/132938
§ 371 (c)(1),
(2) Date: Apr. 28, 2022

(87) PCT Pub. No.: WO2021/143377
PCT Pub. Date: Jul. 22, 2021

(65) Prior Publication Data
US 2022/0342437 A1    Oct. 27, 2022

(30) Foreign Application Priority Data

Jan. 19, 2020 (CN) .......................... 202010060482.5
Jan. 19, 2020 (CN) .......................... 202010060522.6
(Continued)

(51) Int. Cl.
*G05G 1/10*    (2006.01)

(52) U.S. Cl.
CPC ...................................... *G05G 1/10* (2013.01)

(58) Field of Classification Search
CPC ... G05G 1/10; G05G 1/02; G05G 5/03; F24C 7/082; G06F 3/0362; G06F 3/0393; H03K 17/97

See application file for complete search history.

(56) References Cited

U.S. PATENT DOCUMENTS

| 4,233,593 A | 11/1980 | Bigelow |
| 9,466,446 B2 | 10/2016 | Heimann et al. |
(Continued)

FOREIGN PATENT DOCUMENTS

| CN | 101277558 A | 10/2008 |
| CN | 101350604 A | 1/2009 |
(Continued)

OTHER PUBLICATIONS

Is Plastic an insulator or conductor? Microsoft Bing, Apr. 4, 2024 (Year: 2024).*
(Continued)

*Primary Examiner* — Vinh Luong
(74) *Attorney, Agent, or Firm* — Anova Law Group, PLLC

(57) ABSTRACT

A knob includes a first assembly and a second assembly. The first assembly includes a first sensing element. The second assembly is sleeved at the first assembly and includes a second sensing element. The first sensing element is configured to, when the second assembly rotates around a rotation axis, be fixed relative to the rotation axis. The second sensing element is configured to, when the second assembly rotates around the rotation axis, move around the rotation axis.

15 Claims, 55 Drawing Sheets

(30) Foreign Application Priority Data

| Jan. 19, 2020 | (CN) | 202010062899.5 |
| Jan. 19, 2020 | (CN) | 202010062913.1 |
| Jan. 19, 2020 | (CN) | 202010062920.1 |
| Jan. 19, 2020 | (CN) | 202010062922.0 |

(56) References Cited

U.S. PATENT DOCUMENTS

| 10,459,618 | B2 | 10/2019 | Merminod et al. | |
| 2005/0180585 | A1 | 8/2005 | Hsieh | |
| 2006/0070863 | A1 | 4/2006 | Yeh et al. | |
| 2007/0181410 | A1 | 8/2007 | Baier | |
| 2008/0068117 | A1* | 3/2008 | Boss | H03K 17/97 |
| | | | | 335/206 |
| 2010/0012647 | A1 | 1/2010 | Baier et al. | |
| 2013/0037536 | A1 | 2/2013 | Takehira et al. | |
| 2013/0220779 | A1* | 8/2013 | Kerner | H01H 25/06 |
| | | | | 200/4 |
| 2014/0021024 | A1 | 1/2014 | Heimann et al. | |
| 2018/0084937 | A1 | 3/2018 | Joo et al. | |
| 2018/0238552 | A1 | 8/2018 | Ha | |
| 2018/0299135 | A1* | 10/2018 | Bach | G05G 25/04 |
| 2019/0080864 | A1* | 3/2019 | Sawada | H01H 15/06 |
| 2019/0170364 | A1 | 6/2019 | Ha et al. | |
| 2019/0337389 | A1 | 11/2019 | Barvesten et al. | |
| 2021/0286396 | A1* | 9/2021 | Izumi | G05G 1/10 |
| 2022/0262583 | A1* | 8/2022 | Lee | H01H 25/06 |

FOREIGN PATENT DOCUMENTS

| CN | 101608390 A | 12/2009 | |
| CN | 201741057 U | 2/2011 | |
| CN | 102768594 A | 11/2012 | |
| CN | 204731676 U | 10/2015 | |
| CN | 105281732 A | 1/2016 | |
| CN | 105334903 A | 2/2016 | |
| CN | 106027022 A | 10/2016 | |
| CN | 106094974 A | 11/2016 | |
| CN | 106411306 A | 2/2017 | |
| CN | 106529141 A | 3/2017 | |
| CN | 106716580 A | 5/2017 | |
| CN | 206301238 U | 7/2017 | |
| CN | 108334156 A | 7/2018 | |
| CN | 108388179 A | 8/2018 | |
| CN | 108443483 A | 8/2018 | |
| CN | 109698088 A | 4/2019 | |
| CN | 109991910 A | 7/2019 | |
| CN | 209216854 U | 8/2019 | |
| CN | 209373462 U | 9/2019 | |
| CN | 110413186 A | 11/2019 | |
| CN | 209622871 U | 11/2019 | |
| CN | 209626106 U | 11/2019 | |
| CN | 111158429 A | 5/2020 | |
| CN | 211669567 U | 10/2020 | |
| DE | 102016124735 A1 | 6/2018 | |
| DE | 202018000111 U1 * | 5/2019 | G05G 1/10 |
| DE | 102018209550 A1 | 12/2019 | |
| EP | 4033509 A1 * | 7/2022 | H01H 25/06 |
| JP | 2007109649 A | 4/2007 | |
| WO | 2016075907 A1 | 5/2016 | |
| WO | 2016192642 A1 | 12/2016 | |
| WO | WO 2018/107840 A1 * | 6/2018 | G05G 1/10 |

OTHER PUBLICATIONS

What are electrodes of a capacitor? Microsoft Bing, Apr. 4, 2024 (Year: 2024).*

Translation of DE 202018000111 U1, May 16, 2019 (Year: 2019).*

The China National Intellectual Property Administration (CNIPA) The Notice of first review opinion for Chinese Application 202010062899.5 Aug. 30, 2022 23 Pages (With Translation).

The China National Intellectual Property Administration (CNIPA) The Notification to Grant Patent Right for Invention for Chinese Application 202010062913.1 Jul. 11, 2022 6 Pages (With Translation).

The Australian National Intellectual Property Office The Examination report No. 1 for Application 2020422732 May 17, 2023 5 Pages (With Translation).

The China National Intellectual Property Administration (CNIPA) The Notification to Grant Patent Right for Invention for Chinese Application 202010060522.6 May 9, 2023 4 Pages (With Translation).

The China National Intellectual Property Administration (CNIPA) The Notification to Grant Patent Right for Invention for Chinese Application 202010062899.5 Apr. 28, 2023 6 Pages (With Translation).

Japan Patent Office (JPO) The Notice of Reasons for Refusal For JP Application No. 2022-525119 Jul. 18, 2023 8 Pages (Translation Included).

The Australian National Intellectual Property Office The Examination report No. 2 for Application 2020422732 Aug. 31, 2023 4 Pages.

World Intellectual Property Organization (WIPO) International Search Report and Written Opinion for PCT/CN2020/132938 Mar. 1, 2021 16 pages (with translation).

The China National Intellectual Property Administration (CNIPA) The First Office Action for Chinese Application 202010060482.5 Nov. 11, 2021 18 Pages (With Translation).

The China National Intellectual Property Administration (CNIPA) Notification to Grant Patent Right for Invention for Chinese Application 202010060482.5 Apr. 8, 2022 6 Pages (With Translation).

The China National Intellectual Property Administration (CNIPA) The First Office Action for Chinese Application 202010062913.1 Nov. 12, 2021 10 Pages (With Translation).

The China National Intellectual Property Administration (CNIPA) The First Office Action for Chinese Application 202010060522.6 Nov. 30, 2022 12 Pages (With Translation).

The European Patent Office (EPO) The partial supplementary European Search Report for EP Application No. 20914674.5 Nov. 30, 2022 23 Pages.

The European Patent Office (EPO) The supplementary European Search Report for EP Application No. 20914674.5 Mar. 31, 2023 19 Pages.

China National Intellectual Property Administration (CNIPA) Office Action 1 for 202010062920.1 Jun. 28, 2024 17 Pages (including translation).

Korean Intellectual Property Office (KIPO) Request for the Submission of an Opinion for 2022-7028436 Apr. 19, 2024 8 Pages (including translation).

China National Intellectual Property Administration (CNIPA) Office Action 1 for 202010062922.0 Jul. 10, 2024 16 Pages (including translation).

* cited by examiner

HOUSEHOLD APPLIANCE KNOB

CROSS-REFERENCE TO RELATED APPLICATIONS

This application is a National Stage Entry under 35 U.S.C. § 371 of International Application No. PCT/CN2020/132938, filed Nov. 30, 2020, which claims priority to Chinese Patent Application Nos. 202010062913.1, 202010062899.5, 202010062920.1, 202010060522.6, 202010060482.5, and 202010062922.0, all filed Jan. 19, 2020, the entire contents of all of which are incorporated herein by reference.

TECHNICAL FIELD

The present disclosure relates to the field of household appliance technologies, and in particular to a knob, a household appliance, and a related method.

BACKGROUND

With the improvement of people's living standard, the consumer market of household appliances has also developed significantly, and many household appliances in the market include control structures. For example, in water heaters, gas cookers, microwave ovens, washing machines, cooking machines, induction cookers, rice cooker, etc., the control structure may be a touch panel or a button knob, etc., to realize functions such as adjustment and confirmation. For control structures such as knob, the function is single and inconvenient to use.

SUMMARY OF THE DISCLOSURE

The present disclosure provides a knob, a household appliance, and a related method, to solve the problem of a single function of the knob in the existing technologies.

The present disclosure provides a knob, including: a first assembly, including a first sensing element; and a second assembly, sleeved at the first assembly and including a second sensing element; wherein when the second assembly rotates around a rotation axis, the first sensing element is fixed relative to the rotation axis, and the second sensing element moves around the rotation axis.

The proposed knob includes a first assembly and a second assembly. The second assembly is sleeved at the first assembly and can rotate around a rotation axis. A first sensing element of the first assembly is fixed relative to the rotation axis, and a second sensing element of the second assembly can rotate around the rotation axis. The function of rotation adjustment is realized by the second sensing element, and the function of button confirmation by pressing or touching is realized by the first sensing element, integrating the function of rotation and button, which makes the operation more convenient.

The present disclosure provides a household appliance including the above knob.

The present disclosure provides a method for controlling a magnetic knob, including: in response to obtaining a first sensing signal, starting timing; wherein the first sensing signal is generated by a first sensing element in response to a magnetic knob being adjusted to a first gear; in response to obtaining a second sensing signal, stopping timing to determine a gear adjustment duration; wherein the second sensing signal is generated by a second sensing element in response to the magnetic knob being adjusted to a second gear; and adjusting a gear according to the gear adjustment duration and a gear difference between the first gear and the second gear.

By virtue of the control method, the duration of a certain sensing signal is calculated to determine the gear adjustment duration, so as to determine the rotation speed of the knob and achieve the corresponding adjustment, to avoid the problem that when the knob rotates too fast, some of the sensing elements fail to generate sensing signals, and enable precise control of the knob's gear adjustment.

The present disclosure further provides a method for controlling a magnetic knob, including: in response to a sensing value of a first sensing signal being greater than a set trigger threshold, performing a corresponding operation according to the first sensing signal; wherein the first sensing signal is generated by a first sensing element in response to the magnetic knob being adjusted; and turning down the sensing value of the first sensing signal, and/or turning down a sensing value of a second sensing signal of a second sensing element adjacent to the first sensing element.

By virtue of the control method, the sensing value of the first sensing signal is turned down, which can avoid the problem of the first sensing signal triggering again after the second sensing signal is triggered leading to gear retraction. The sensing value of the second sensing signal is turned down, which can avoid the problem of the second sensing signal mis-triggering after the first sensing signal is triggered. In this way, a precise control of the magnetic suction knob may be achieved.

The present disclosure provides a cooking device, configured to operate in response to an operation of a magnetic knob and including: a plurality of sensing elements, configured to sense a gear adjustment operation of the magnetic knob to generate a corresponding sensing signal; and a controller, connected to the plurality of sensing elements and configured to perform the method as described above.

The present disclosure further provides a method for controlling a magnetic knob, wherein the magnetic knob includes a first control key and a second control key; the method includes: obtaining a first sensing signal and a second sensing signal; wherein the first sensing signal is generated by a first sensing element sensing a manipulation of the first control key, and the second sensing signal is generated by any one of a plurality of second sensing elements sensing a manipulation of the second control key; in response to a sensing value of the first sensing signal being greater than a sensing value of the second sensing signal, performing a corresponding operation according to the first sensing signal; and in response to the sensing value of the second sensing signal being greater than the sensing value of the first sensing signal, performing a corresponding operation according to the second sensing signal.

By virtue of the control method, the problem of the existing technologies may be solved, that by comparing the sensing signal with the trigger threshold, triggering the corresponding function when the sensing signal is greater than the trigger threshold may lead to the first control key and the second control key being triggered at the same time, resulting in mis-operation. In the embodiments, by comparing the sensing signal of the first control key and the second control key, only the one with greater sensing value is triggered, which avoids the possibility of simultaneous triggering of both keys and facilitates the precise control of the magnetic suction knob.

The present disclosure further provides a cooking device, configured to operate in response to an operation of a magnetic knob; wherein the magnetic knob includes a first control key and a second control key; the cooking device includes: a first sensing element, configured to sense a manipulation of the first control key to generate a first sensing signal; a plurality of second sensing elements, configured to sense a manipulation of the second control key to generate a second sensing signal; and a controller, connected to the first sensing element and the plurality of second sensing elements and configured to perform the method as described above.

The present disclosure further provides an identification method for detecting manipulation of a magnetic control knob, including: detecting whether an auxiliary function sensing electrode is triggered; wherein the auxiliary function sensing electrode is disposed under a touch substrate and configured to sense a manipulation on an auxiliary key of the magnetic control knob to generate a corresponding sensing value; and in response to determining that the auxiliary function sensing electrode is triggered, generating a corresponding auxiliary identification instruction.

The identification method includes: detecting whether an auxiliary function sensing electrode is triggered; wherein the auxiliary function sensing electrode is disposed under a touch substrate and configured to sense a manipulation on an auxiliary key of the magnetic control knob to generate a corresponding sensing value; and in response to determining that the auxiliary function sensing electrode is triggered, generating a corresponding auxiliary identification instruction, enabling the magnetic control knob to have an auxiliary identification function.

The present disclosure further provides an identification method for detecting manipulation of a magnetic control knob, including: detecting sensing values of a plurality of gear/function sensing electrodes to determine whether there is a change in a sensing value of at least one gear/function sensing electrode in a first direction or a second direction that is greater than a first threshold; wherein the plurality of gear/function sensing electrodes are configured to sense a manipulation on a gear/function selection sensing block of the magnetic control knob, for generating a corresponding sensing value; and in response to determining that there is a change in the sensing value of at least one gear/function sensing electrode in the first direction or the second direction that is greater than the first threshold, generating a corresponding identification instruction; wherein the identification instruction includes a first identification instruction indicating the magnetic control knob is placed at a magnetic touch panel and/or a second identification instruction indicating the magnetic control knob is removed from the magnetic touch panel.

The present disclosure uses the capacitive sensing effect to determine whether the magnetic control knob is placed at the magnetic touch panel or removed from the magnetic touch panel according to the change in the sensing value of at least one gear/function sensing electrode, which can determine the state of the magnetic control knob without adding additional components and avoid adding additional costs.

The present disclosure further provides a magnetic touch panel, including: a touch substrate, an auxiliary function sensing electrode, a plurality of gear/function sensing electrodes, a storage device, and a processing device; wherein the auxiliary function sensing electrode and the plurality of gear/function sensing electrodes are arranged at the same side of the touch substrate, and are respectively configured to sense a manipulation of an auxiliary key and a gear/function selection sensing block of the magnetic control knob to generate corresponding sensing values; the storage device stores a program; the processing device is connected to the storage device, the auxiliary function sensing electrode, and the plurality of gear/function sensing electrodes to retrieve the program stored in the storage device for executing the identification method as described above.

The present disclosure further provides a computer-readable storage medium, storing program data; wherein when the program data is executed by a processor, the method as described above is performed.

DETAILED DESCRIPTION

The knobs provided in the present disclosure may be applied in household appliances to control the household appliances, for performing integrated functions of rotation adjustment and button confirmation. The specific structure is as follows.

Figure 1:
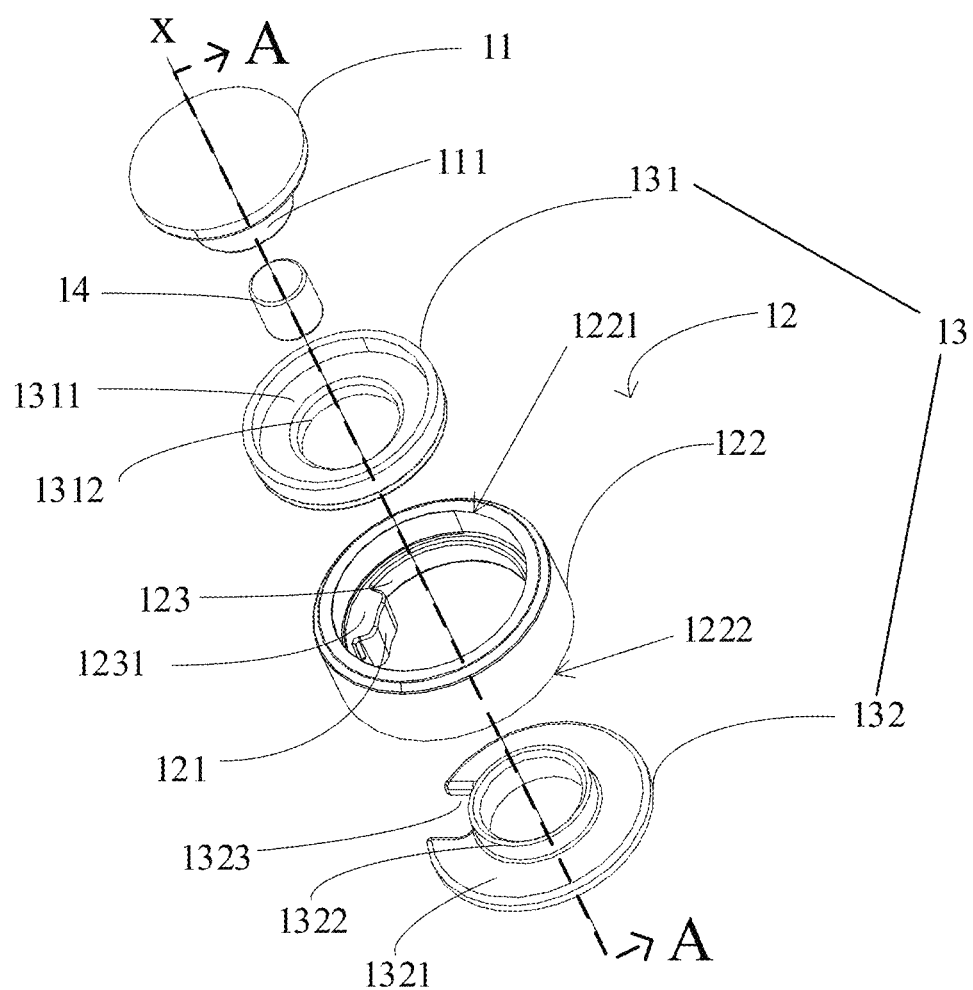
FIG. 1 is a schematic structural diagram of a knob according to an embodiment of the present disclosure.
Figure 2:
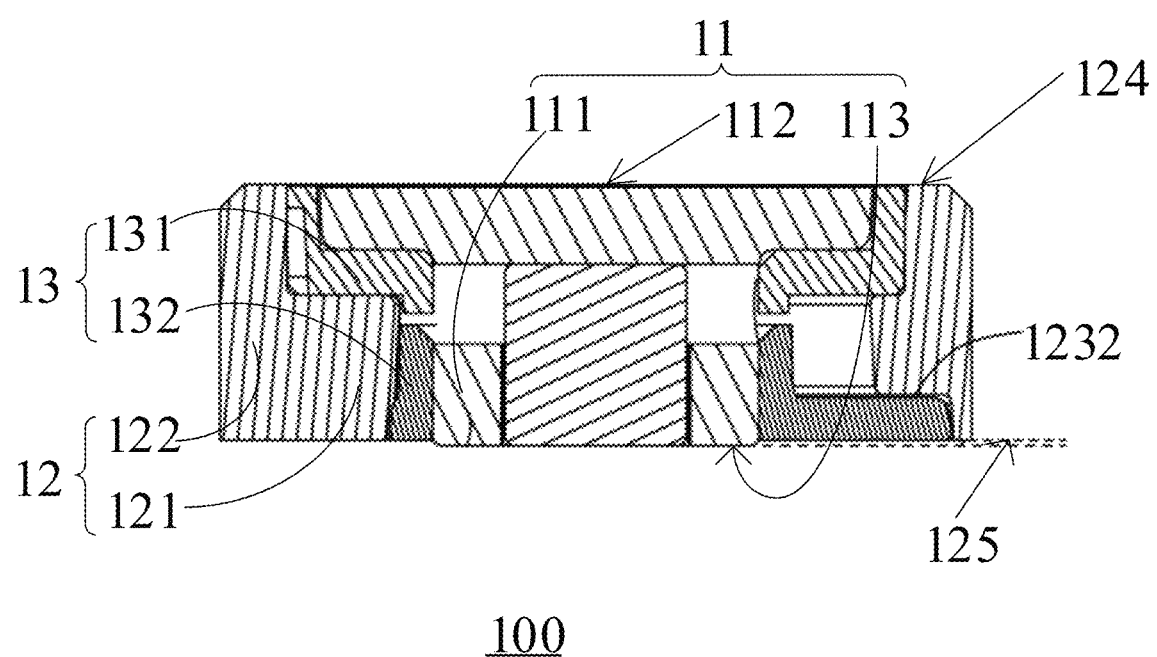
FIG. 2 is a schematic cross-sectional view of the knob along line A-A in FIG. 1.
Figure 3:
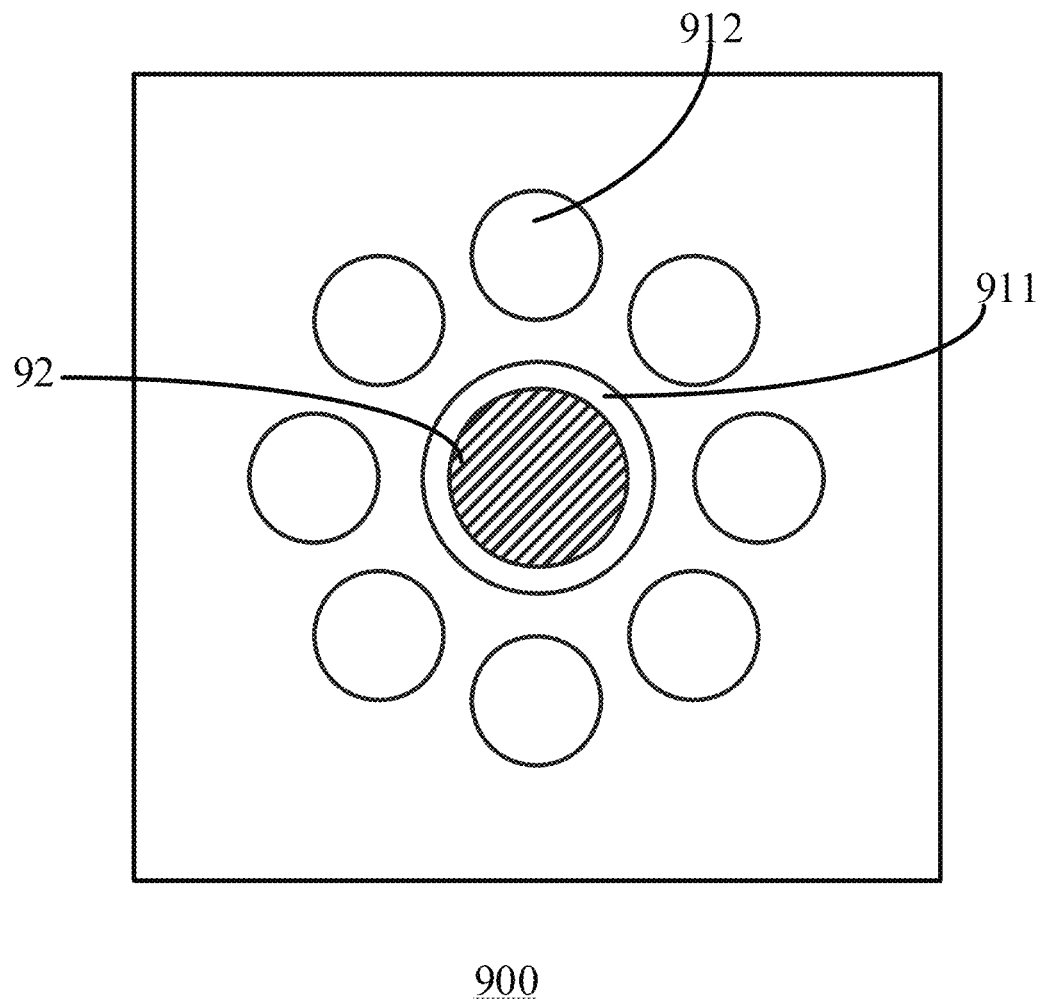
FIG. 3 is a schematic structural diagram of a control panel corresponding to a knob according to an embodiment of the present disclosure.

Referring to FIGS. 1-3, FIG. 1 is a schematic structural diagram of a knob according to an embodiment of the present disclosure, FIG. 2 is a schematic cross-sectional view of the knob shown in FIG. 1, and FIG. 3 is a schematic structural diagram of a control panel corresponding to the knob shown in FIG. 1.

A knob 100 in the embodiments includes a first assembly 11 and a second assembly 12. The second assembly 12 is sleeved at the first assembly 11. The second assembly 12 is capable of rotating with a rotation axis X to realize the function of rotation adjustment. Specifically, the entire knob 100 may rotate, i.e., the first assembly 11 may also rotate; or, only the second assembly 12 rotates.

The functions of rotation adjustment and button confirmation through the knob 100 are specifically realized by a sensing element. The first assembly 11 includes a first sensing element 111, and the second assembly 12 includes a second sensing element 121. When the second assembly 12 rotates with the rotation axis X, the first sensing element 111 is fixed relative to the rotation axis X. The fixed position of the first sensing element 111 may realize the button confirmation function of pressing or touching. The second sensing element 121 moves around the rotation axis X to realize the rotation adjustment function.

The knob 100 may realize the integration of the functions of rotation adjustment and button confirmation through the above methods.

The knob 100 may be applied in household appliances in conjunction with a control panel 900. Corresponding sensing elements are arranged in the control panel 900, and the knob 100 is attached to a sensing position of the control panel 900 to realize control by the sensing between the sensing elements. In this way, the control panel in the household appliance does not need to be slotted, and the control panel may be kept tidy.

The sensing method for realizing the sensing control may be multiple, such as infrared sensing, Hall sensing, magneto-resistive sensing, capacitive sensing, etc. In the embodiment, the capacitive sensing is adopted as an example. That is, the first assembly 11 and the second assembly 12 are both conductive elements as sensing electrodes to form a capacitor with a sensing electrode in the control panel 900, thereby realizing the capacitive sensing. By adopting the capacitive sensing, when the knob is not used, the user can also generate sensing control on a surface of the control panel 900 through finger operation.

Since the second assembly 12 and the first assembly 11 are both electrical conductors, in order to avoid interference between the two, an insulation element 13 may be arranged between the second assembly 12 and the first assembly 11.

To realize the button confirmation function, the first sensing element 111 is fixed relative to the rotation axis X. In the embodiments, the first sensing element 111 is specifically a conductive column with the rotation axis X as a central axis. In the embodiments, the first assembly 11 as a whole may be configured as the first sensing element 111 to pass through the second assembly 12. The user may change the capacitance generated by the first sensing element 111 by touching or pressing the first assembly 11 during use, thereby enabling sensing.

The second assembly 12 includes a conductive ring 122 with the rotation axis X as a central axis. The second sensing element 121 may be a conductive block 121 arranged at an inner wall of the conductive ring 122. When the second assembly 12 rotates, the conductive block 121 moves around the rotation axis X to realize rotation sensing. The second assembly 12 is annular and sleeved at the first assembly 11. That is, the entire knob is cylindrical.

The assembly of the second assembly 12, the first assembly 11, and the insulation element 13 is mainly realized by structural design to realize fixed arrangement.

Specifically, the conductive ring 122 includes an upper opening 1221 and a lower opening 1222 opposite to each other along a direction of the rotation axis. When the knob 100 is in use, the lower opening 1222 faces the control panel 900. The inner wall of the conductive ring 122 is arranged with a protrusion 123 protruding toward the rotation axis X. An upper surface of the protrusion 123 facing the upper opening 1221 forms a step surface 1231. The first assembly 11 is clamped at the step surface 1231 and the insulation element 13 is arranged between the first assembly 11 and the step surface 1231. Further, an upper surface of the conductive block 121 facing the upper opening 1221 and the upper surface 1231 of the protrusion 123 are disposed at the same plane, cooperatively forming the step surface 1231.

A lower surface of the protrusion 123 facing the lower opening 1222 forms an abutting surface 1232. A lower surface of the conductive block 121 facing the lower opening 1222 is closer to the lower opening 1222 than the lower surface 1232 of the protrusion 123. Further, the lower surface of the conductive block 121 may be flush with a lower surface of the conductive ring 122. That is, the conductive block 121, as the second sensing element, is disposed close to the control panel 900; the conductive column, as the first sensing element 111, passes through the conductive ring 122 and is disposed also close to the control panel 900, thereby facilitating sensing detection.

Due to the structural design of the protrusion 123 of the conductive ring 122 in the second assembly 12, in order to facilitate assembly, the insulation element 13 between the second assembly 12 and the first assembly 11 includes a first insulation ring 131 and a second insulation ring 132. The first insulation ring 131 is assembled in the conductive ring 122 through the upper opening 1221, and the second insulation ring 132 is assembled in the conductive ring 122 through the lower opening 1222.

The first insulation ring 131 includes an accommodation member 1311 and a perforated member 1312 connected to each other. The accommodation member 1311 is disposed at the step surface 1231 through the upper opening 1221. The second insulation ring 132 includes a cover member 1321 and an opening member 1322 connected to each other. The cover member 1321 abuts against the abutting surface 1232 through the lower opening 1222. The perforated member 1312 and the opening member 1322 communicate with each other.

The first assembly 11 is accommodated in the accommodation member 1311 and penetrates through the perforated member 1312 and the opening member 1322. After the first insulation ring 131 and the second insulation ring 132 are arranged, the first assembly 11 is arranged in the insulation element 13.

The cover member 1321 further includes a slot 1323, and the conductive block 121 is clamped in the slot 1323. The conductive block 121 may directly sense the control panel to avoid being covered by the cover member 1321.

When in use, the knob 100 is required to be attached to the control panel 900. Therefore, the first assembly 11 or the second assembly 12 is further arranged with an attachment element 14 which may be a magnetic attraction element or an attachment adhesive.

In the embodiments, the attachment element 14 is a magnetic attraction element as an example, which is arranged at the first assembly 11. The first assembly 11 on a middle position of the knob 100 is attached to the control panel 900. In the embodiments, the first assembly 11 may include a button top surface 112 and a button bottom surface 113 opposite to each other in the direction of the rotation axis X, and the second assembly 12 may include a knob top surface 124 and a knob bottom surface 125 opposite to each other in the direction of the rotation axis X. The first assembly 11 passes through the second assembly 12, and the button bottom surface 113 protrudes from the knob bottom surface 125. When the first assembly 11 is in contact with the control panel 900, there is a certain space between the second assembly 12 and the control panel 900. When the knob 100 is rotated, the friction between the knob 100 and the control panel 900 may be reduced.

FIG. 3 illustrates an arrangement of the sensing elements in the control panel 900, including a third sensing element 911 facing the first sensing element 111, and at least two fourth sensing elements 912 facing the second sensing element 121. The at least two fourth sensing elements 912 are distributed facing a circumferential path of the second sensing element 121. When the knob 100 is operated, the rotation adjustment function or the button confirmation function is determined by detecting a change of the sensing amount in the third sensing element 911 and the fourth sensing elements 912.

When the capacitive sensing is adopted, the third sensing element 911 and the fourth sensing elements 912 may be good conductors such as spring, ITO, coating, PCB copper skin, conductive sponge, etc. In order to interact with the magnetic attraction element 14 in the knob 100, a magnet 92 is arranged in the control panel 900.

In the embodiments, the knob 100 realizes the functions of knob adjustment and button confirmation through the first sensing element and the second sensing element, respectively.

In order to make the rotation of the knob and the use of button more convenient, the present disclosure further improves the knob in structure.

For the rotation function, when the user performs a rotation operation, the rotation stuttering is not obvious enough, such that the user operation lacks the hand feeling, and the problem of mis-operation is prone to occur. To solve the problems, a magnetic structure and an elastic structure are adopted in the present disclosure to realize the rotation stuttering.

Figure 4:
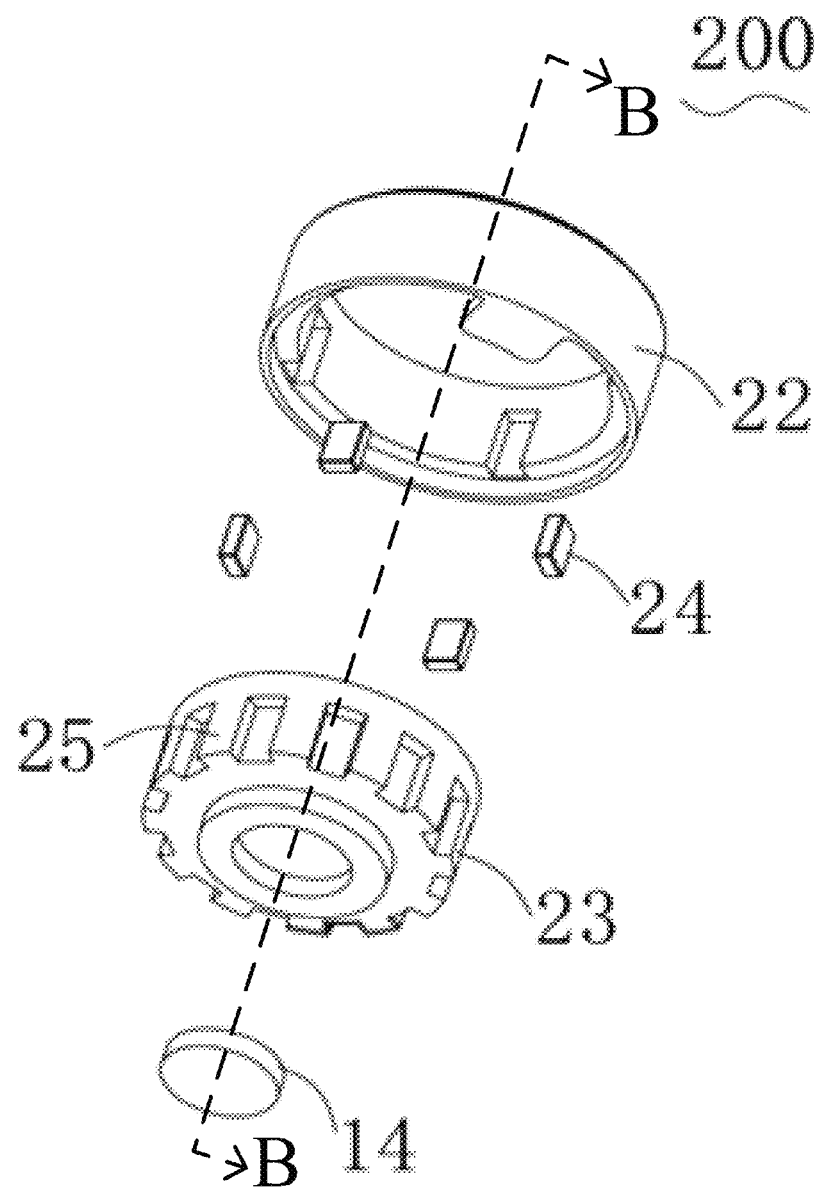
FIG. 4 is a schematic structural diagram of a knob according to another embodiment of the present disclosure.
Figure 7:
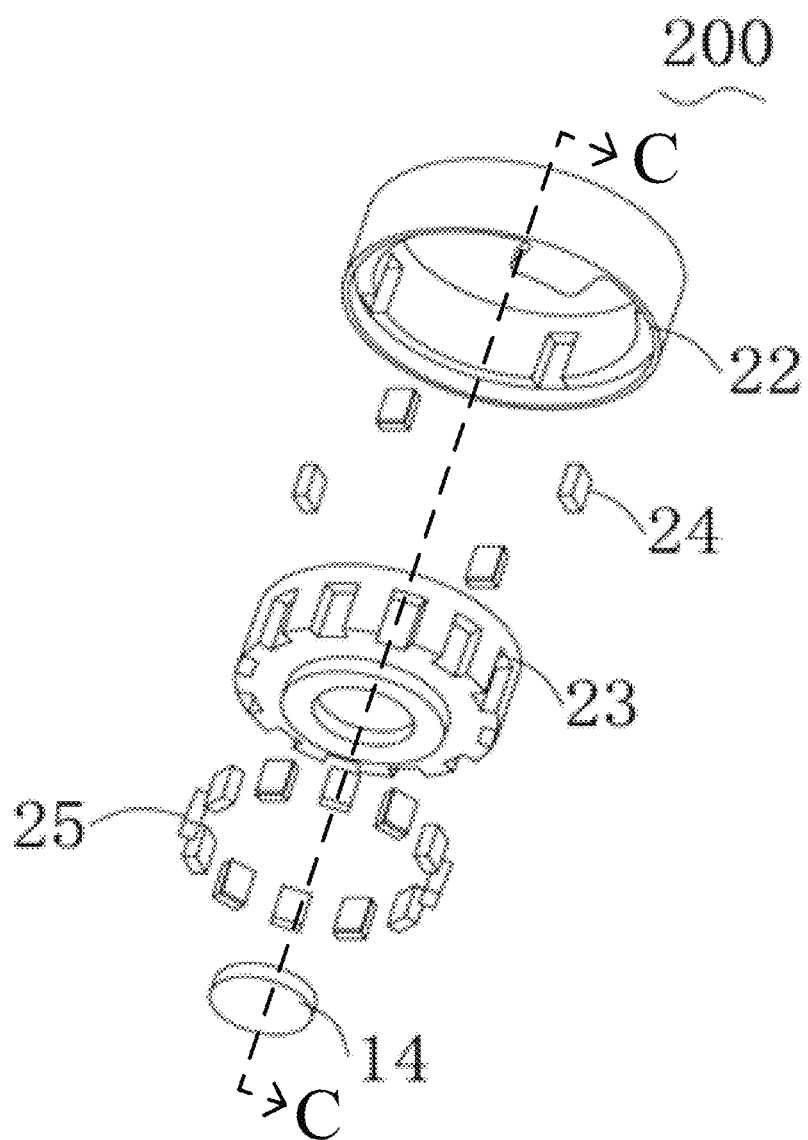
FIG. 7 is a schematic structural diagram of a knob according to yet another embodiment of the present disclosure.
Figure 9:
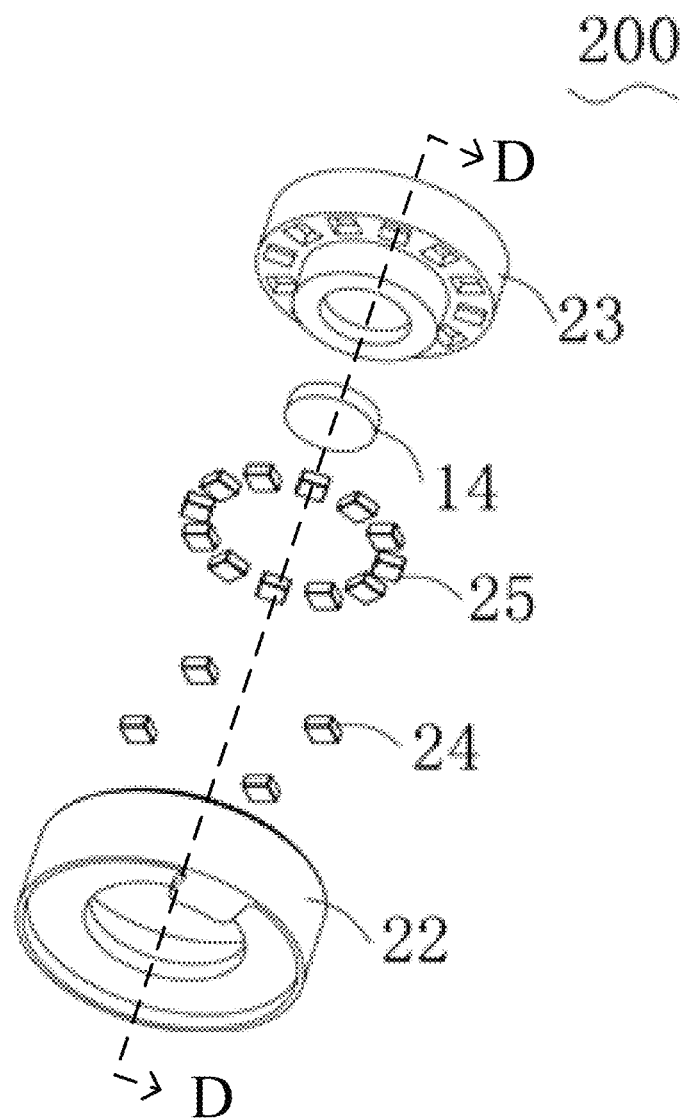
FIG. 9 is a schematic structural diagram of a knob according to yet another embodiment of the present disclosure.

With regard to the magnetic structure, the present disclosure proposes three set of embodiments in FIG. 4, FIG. 7 and FIG. 9. The three set of embodiments have similar general structures, and a same set of reference numerals are therefore used in the description below.

For the three set of embodiments, a knob 200 includes a first assembly, a second assembly 22, and a seat body 23. The seat body 23 includes an accommodation cavity. The first assembly is disposed in the accommodation cavity, and the second assembly 22 is rotatably sleeved at the seat body 23. The seat body 23 is disposed between the first assembly and the second assembly 22 and may be an insulator.

In the three set of embodiments, the second assembly 22 includes a first surface 221 facing the seat body 23, and the seat body 23 includes a second surface 231 facing the first surface 221. One of the first surface 221 and the second surface 231 is arranged with a first magnetic attraction element group including at least one first magnetic attraction element 24; the other of the first surface 221 and the second surface 231 is arranged with a second magnetic attraction element group including at least two second magnetic attraction elements 25 arranged at intervals. When the second assembly 22 rotates relative to the seat body 23, an interaction force between the first magnetic attraction element group and the second magnetic attraction element group changes.

When the rotating assembly 22 rotates relative to the seat body 23, during the rotation process, the attraction force between the first magnetic attraction element group and the corresponding second magnetic attraction element group also changes correspondingly. In this way, the user rotates the knob 200 with a corresponding change in the amount of rotation resistance. When the first magnetic attraction element 24 in the first magnetic attraction element group and the second magnetic attraction elements 25 in the second magnetic attraction element group are close to each other, the attraction between the first magnetic attraction element group and the second magnetic attraction element group drives a tendency for the two to fit each other, and the rotation resistance of the user turning the knob 200 is small. When the first magnetic attraction element 24 in the first magnetic attraction element group and the second magnetic attraction elements 25 in the second magnetic attraction element group are attached to each other, due to the attraction between the two, the user rotates the knob 200 desiring to separate the first magnetic attraction element group and the second magnetic attraction element group from each other with greater rotation resistance.

Further, to ensure that the rotation resistance of the user rotates the knob 200 changes regularly, the magnetic strength of the first magnetic attraction element group and the second magnetic attraction element group, the spacing and the number of the first magnetic attraction elements 24 in the first magnetic attraction element group, and the spacing and number of the second magnetic attraction elements 25 in the second magnetic attraction element group change regularly. Specifically, when the magnetic strength of the first magnetic attraction element group and the second magnetic attraction element group is greater, the rotation resistance is greater, the user's hand feel is more intensive, and the rotation stuttering is more obvious. When the spacing of the first magnetic attraction elements 24 in the first magnetic attraction element group and the spacing of the second magnetic attraction elements 25 in the second magnetic attraction element group are greater, the interval between two stutterings when the user rotates the knob 200 at a constant speed is longer. Therefore, the magnetic strength of the first magnetic attraction element group and the second magnetic attraction element group, the spacing and the number of the first magnetic attraction elements 24 in the first magnetic attraction element group, and the spacing and number of the second magnetic attraction elements 25 in the second magnetic attraction element group may be adjusted according to specific use needs, which is not limited herein. In addition, the button provided in the embodiments realizes a sense of stuttering when the user rotates the knob 200 through a gentle change of magnetic force, the whole rotation process is less frictional, and the user rotates the knob 200 more gently and smoothly.

Further, the knob 200 provided in the three set of embodiments may be configured with a plurality of gears corresponding to the positions where the first magnetic attraction element group and the second magnetic attraction element group are attracted to each other. The attractive force between the first magnetic component group and the second magnetic component group is configured to drive the knob 200 to rotate to a corresponding gear, so as to realize accurate adjustment of gears and avoid the situation where the user over-rotates the knob 200 or the knob 200 is not rotated in place, making the gear sensation clear.

In the three set of embodiments, the second magnetic attraction element group is arranged with the rotation axis X of the second assembly 22 as the central axis, and an included angle between adjacent second magnetic attraction elements 25 in the second magnetic attraction element group is 5°-180°. For example, the included angle between adjacent second magnetic attraction elements 25 in the second magnetic attraction element group is 10°, 40°, 80°, or 120°, etc.

For the differences between the three set of embodiments, further explanations are given below.

Figure 5:
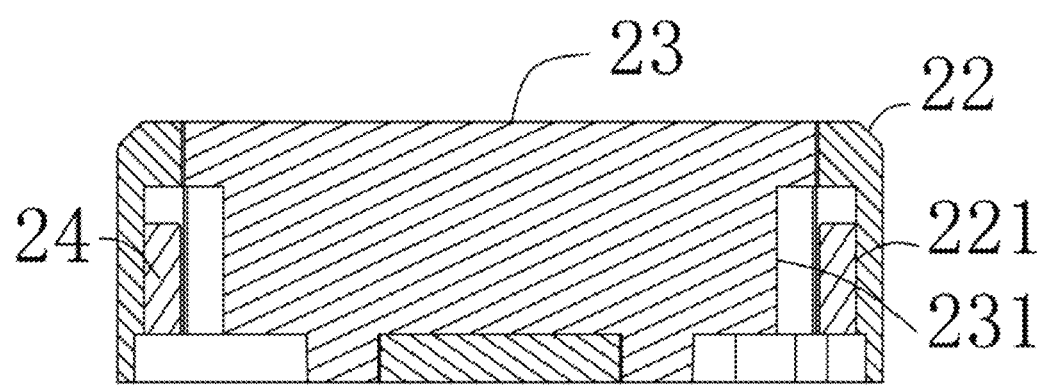
FIG. 5 is a schematic cross-sectional view of the knob along line B-B in FIG. 4.
Figure 6:
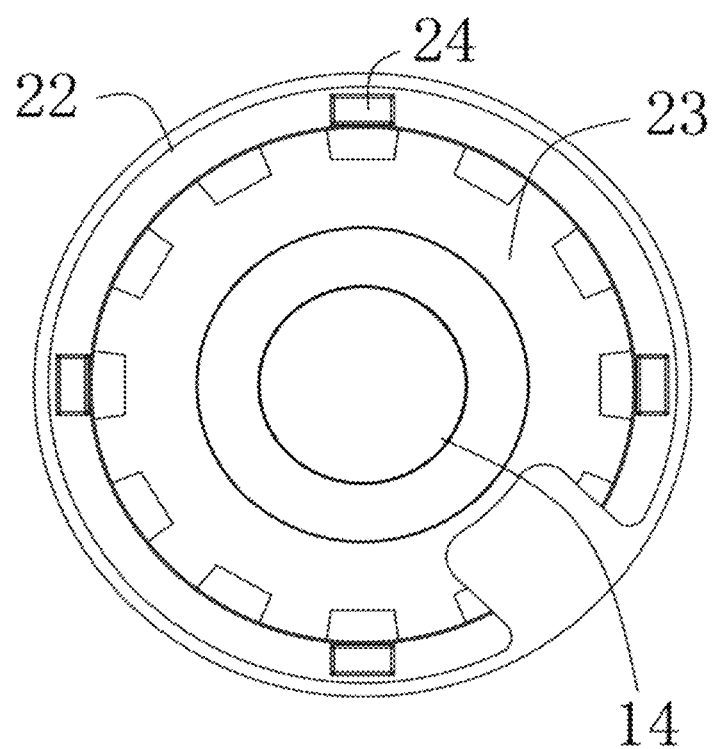
FIG. 6 is a bottom view of the knob shown in FIG. 4.

Referring to FIGS. 4-6, FIG. 4 is a schematic structural diagram of a knob according to another embodiment of the present disclosure, FIG. 5 is a schematic cross-sectional view of the knob shown in FIG. 4, and FIG. 6 is a bottom view of the knob shown in FIG. 4.

The second assembly 22 includes a knob inner surface surrounding the rotation axis, and the first surface 221 is the knob inner surface; correspondingly, the seat body 23 includes a seat body outer surface surrounding the rotation axis, and the second surface 231 is the seat body outer surface. Specifically, the first magnetic attraction element group is arranged at the first surface 221, that is, the knob inner surface; the second magnetic attraction element group is arranged at the second surface 231, that is, the seat body outer surface.

In addition, the first magnetic attraction elements 24 in the embodiments may be permanent magnets inserted on the second assembly 22 at intervals, and the second magnetic attraction elements 25 may be a plurality of magnetizable protrusions formed on the second surface 231 at intervals. The first magnetic attraction element 24 is vertically inserted on the second assembly 22.

Of course, in other application scenarios, the first magnetic attraction element group may be arranged at the second surface 231, that is, on the seat body outer surface, and correspondingly, the second magnetic attraction element group is arranged at the first surface 221. Specifically, the number of the arranged first magnetic attraction elements 24 may be four. Of course, in other Applications scenarios, the number of the first magnetic attraction elements 24 may be any number greater than one, as long as the first magnetic attraction elements 24 achieves mutual matching with the second magnetic attraction elements 25 on the seat body 1 to cause a stuttering sensation when the user rotates the second assembly 2.

Further, in the embodiments, the at least one first magnetic attraction element 24 is uniformly distributed with the rotation axis X of the second assembly 22 as the central axis, and the at least two second magnetic attraction elements 25 are uniformly distributed with the rotation axis X as the central axis. The rotation resistance when the user rotates the knob 200 changes regularly in a wavy line.

Of course, in other embodiments, the first magnetic attraction elements 24 and the second magnetic attraction elements 25 may be non-uniformly distributed with the rotation axis X as the central axis, which can also realize the purpose of improving the user's hand feeling and avoiding mis-operation.

Figure 8:
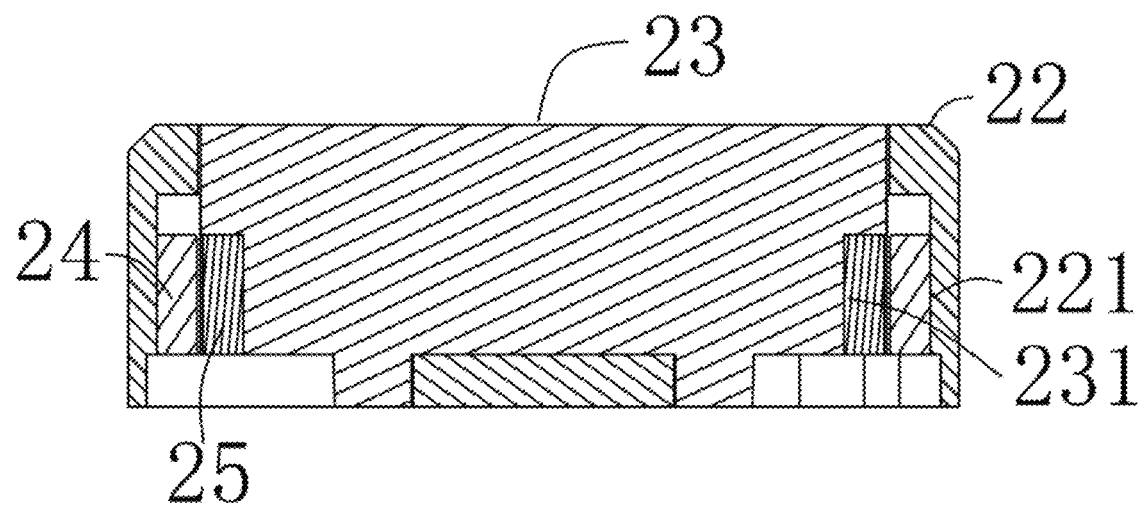
FIG. 8 is a schematic cross-sectional view of the knob along line C-C in FIG. 7.

Referring to FIGS. 7-8, FIG. 7 is a schematic structural diagram of a knob according to yet another embodiment of the present disclosure, and FIG. 8 is a schematic cross-sectional view of the knob shown in FIG. 7.

The difference between the embodiments illustrated in FIGS. 7-8 and the embodiments illustrated in FIGS. 4-6 is that the second magnetic attraction elements 25 in the embodiment illustrated in FIGS. 7-8 are each a permanent magnet inserted on the seat body 23 at intervals, and the second magnetic attraction elements 25 are vertically inserted on the seat body 23. In this way, when the user rotates the second assembly 22, the attractive or repulsive force between the first magnetic attraction element 24 and the second magnetic attraction element 25 also changes accordingly, and the specific principle will not be repeated. However, with the arrangement of the second magnetic attraction elements 25 in the embodiments, compared with the embodiments illustrated in FIGS. 4-6, the force between the second assembly 22 and the seat body 23 varies more widely, the user's stuttering sensation when rotating the knob 200 is more obvious, and further the gear sensation is clearer.

Figure 10:
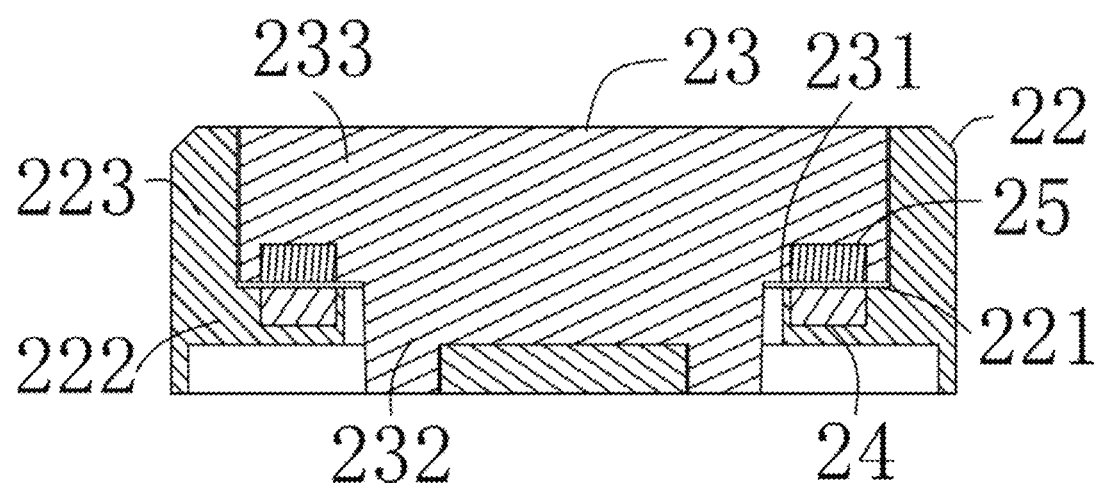
FIG. 10 is a schematic cross-sectional view of the knob along line D-D in FIG. 9.

Referring to FIGS. 9-10, FIG. 9 is a schematic structural diagram of a knob according to yet another embodiment of the present disclosure, and FIG. 10 is a schematic cross-sectional view of the knob shown in FIG. 9.

The difference of the embodiments is that the seat body 23 includes a plug member 232 and a sleeve member 233 that are connected to each other, and the second assembly 22 includes a step member 222 and an outer ring member 223 that are connected to each other. The plug member 232 is plugged in the step member 222, and the outer ring member 223 is sleeved at the sleeve member 233. A step surface of the step member 222 is the first surface 221, and a surface of the sleeve member 233 opposite to the step surface is the second surface 231. Specifically, the first magnetic attraction elements 24 of the first magnetic attraction element group are laid flat on the first surface 221 of the second assembly 22, and the second magnetic attraction elements 25 of the second magnetic attraction element group are laid flat on the second surface 231 of the seat body 23.

On the basis of the embodiments illustrated in FIGS. 1-3, the above three set of embodiments further enhance the user's sense of rotation stuttering during use, and avoid the problem of mis-operation.

Figure 11:
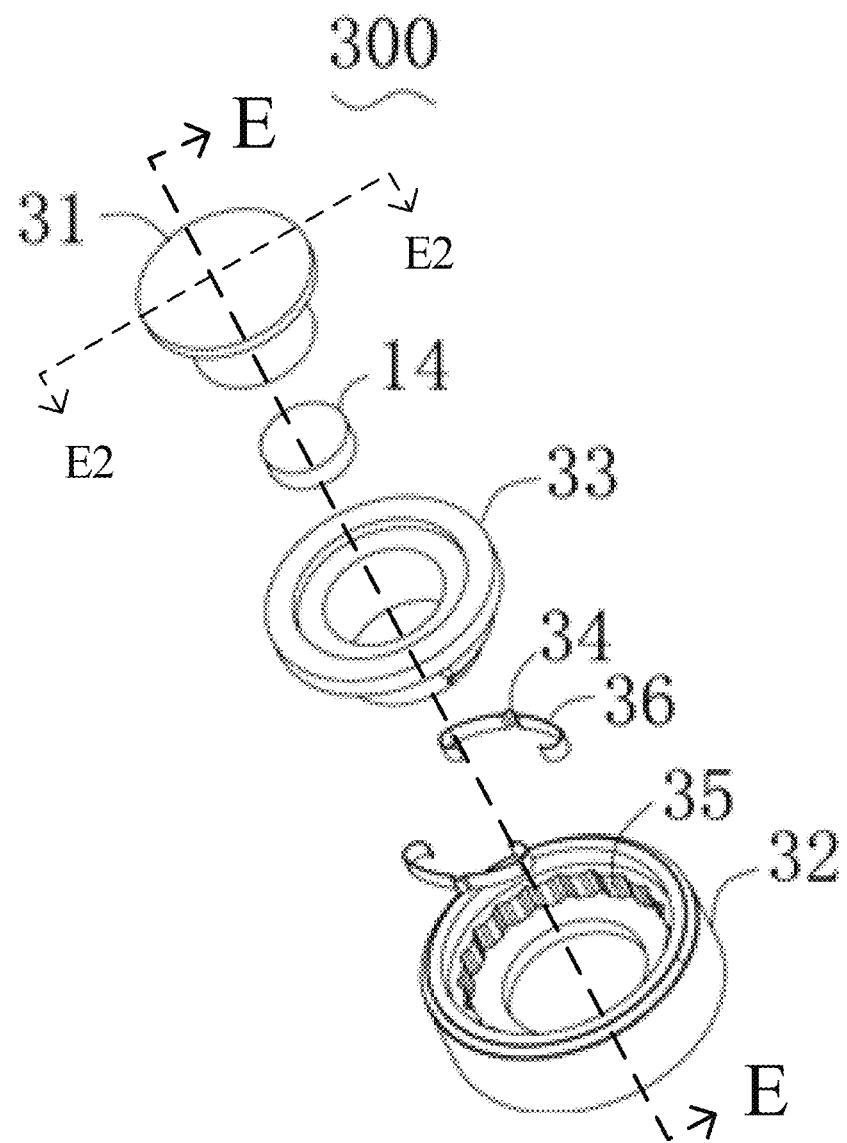
FIG. 11 is a schematic structural diagram of a knob according to yet another embodiment of the present disclosure.
Figure 14:
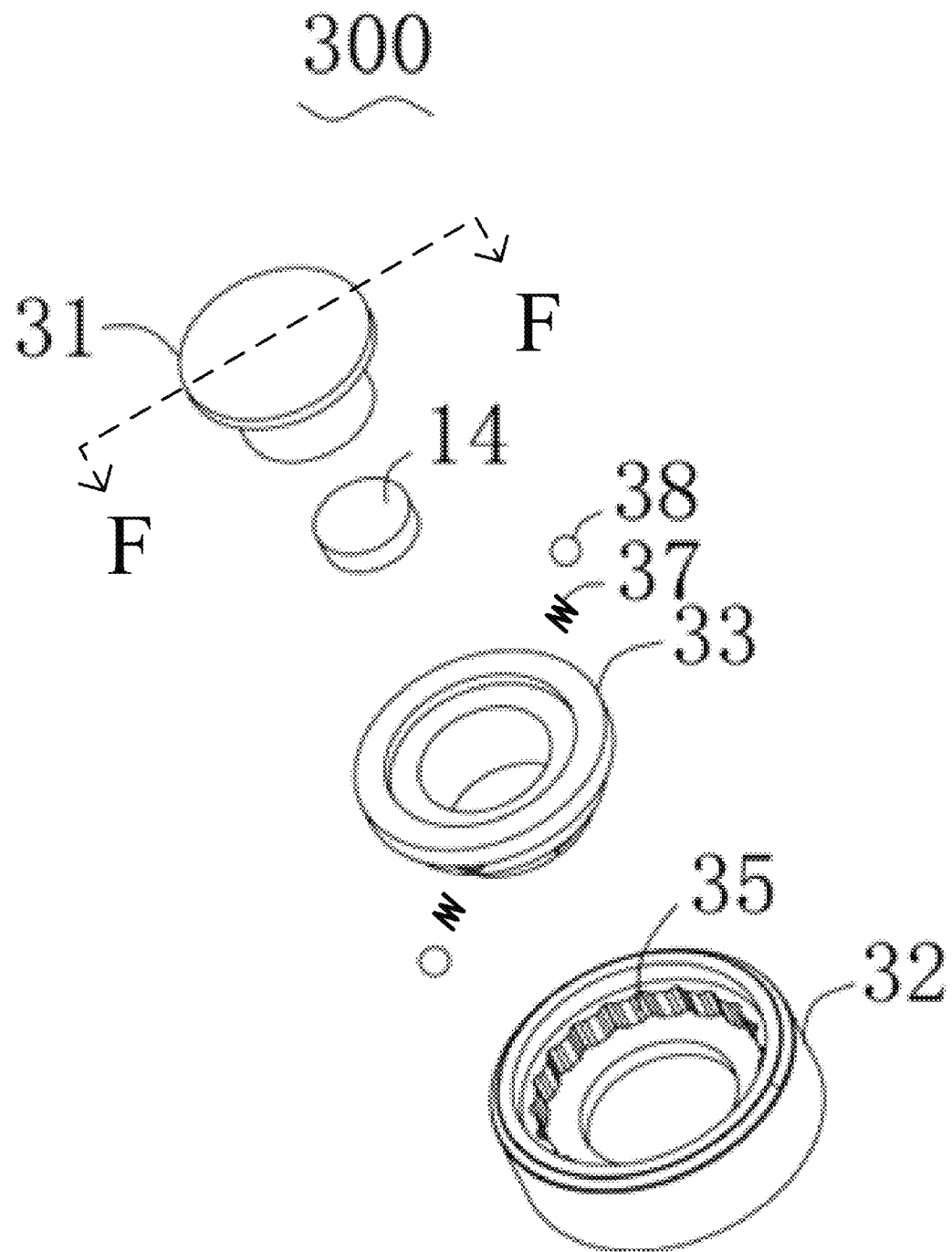
FIG. 14 is a schematic structural diagram of a knob according to yet another embodiment of the present disclosure.
Figure 16:
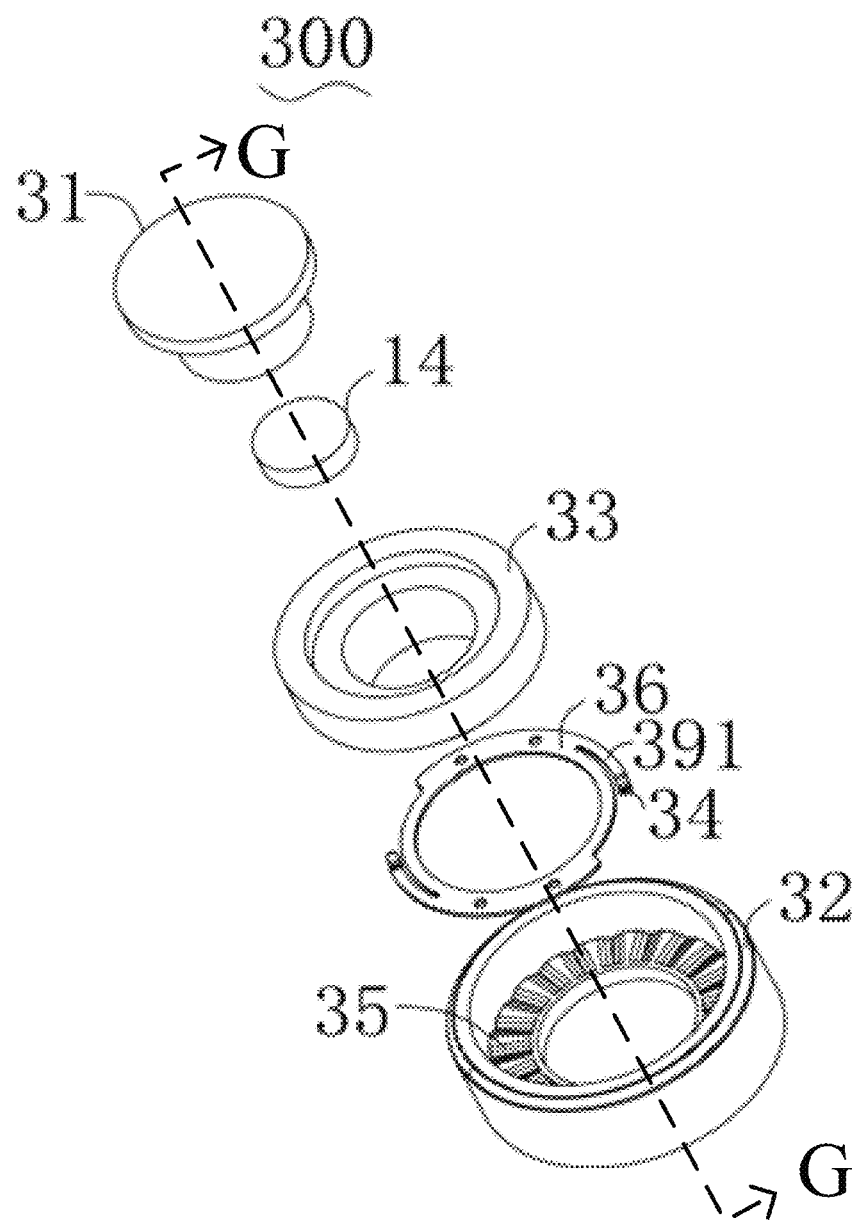
FIG. 16 is a schematic structural diagram of a knob according to yet another embodiment of the present disclosure.

With regard to the elastic structure, the present disclosure proposes three set of embodiments in FIG. 11, FIG. 14 and FIG. 16. The three set of embodiments have similar general structures, and a same set of reference numerals are therefore used in the description below.

For the three set of embodiments, a knob 300 also includes a first assembly 31, a second assembly 32, and a seat body 33.

The second assembly 32 includes a first surface 321 facing the seat body 33, and the seat body 33 includes a second surface 331 facing the first surface 321. One of the first surface 321 and the second surface 331 is arranged with at least one elastic protrusion 34, and the other of the first surface 321 and the second surface 331 is formed with a concave-convex structure 35. When the second assembly 32 rotates relative to the seat body 33, the elastic protrusion 34 may slide along the concave-convex structure 35.

Specifically, the concave-convex structure 35 includes a plurality of protrusions arranged at intervals, and a groove is formed between two adjacent protrusions at an interval. When the protrusion height of each protrusion in the concave-convex structure 35 is higher, the rotation resistance is greater, the user's hand feel is stronger, and the rotation stuttering is more obvious. When a space between adjacent protrusions is greater, an interval between two stutters is longer when the user rotates the knob 300 at a constant speed. On the contrary, when the protrusion height of each protrusion in the concave-convex structure 35 is lower, the rotation resistance is lower, and the user's hand feel is less intensive, and the rotation stuttering is less obvious. When the space between adjacent protrusions is less, the interval between two stutters is shorter when the user rotates the knob 300 at a constant speed. Therefore, the protrusion height of the protrusions in the concave-convex structure 35 and the size of the space between adjacent protrusions may be adjusted according to specific use needs, which is not further limited herein.

Further, to make the rotation resistance regularly change when the user rotates the knob 300, the protrusion height of the protrusions and the gap between adjacent protrusions may change regularly.

In the following embodiments, the concave-convex structure 35 is arranged with the rotation axis of the second assembly 32 as the central axis, and an included angle between adjacent protrusions in the concave-convex structure 35 is 1.5°-180°. For example, the included angle between adjacent protrusions in the concave-convex structure 35 may be 20°, 50°, 80°, or 100°, etc.

By the elastic protrusion sliding along the concave-convex structure 35, the elastic protrusion pivots the protrusions in the concave-convex structure 35 along a rotation direction. The rotation resistance when the user rotates the knob 300 changes each time the elastic protrusion is rotated from a projection to a groove in the concave-convex structure 35 or from a groove to a protrusion in the concave-convex structure 35.

Further, when the second assembly 32 is not rotating, the elastic protrusion may stay in a groove in the concave-convex structure 35, that is, the grooves may have a certain positional limiting effect on the rotation position of the second assembly 32. Therefore, the knob 300 may be configured with a plurality of gears corresponding to the grooves in the concave-convex structure 35, and the above-mentioned limiting effect of the grooves in the concave-convex structure 35 may be applied to realize accurate adjustment of gears and avoid the situation where the user over-rotates the knob 300 or the knob 300 is not rotated in place.

In addition, the number of elastic protrusions may be adjusted according to the rotation resistance required by the knob 300. In theory, the greater the number of the elastic protrusions, the greater a maximum value of the rotation resistance required to rotate the knob 300, the more obvious the sense of rotation stuttering, and the clearer the sense of gear.

For the differences between the three set of embodiments, further explanations are given below.

Figure 12:
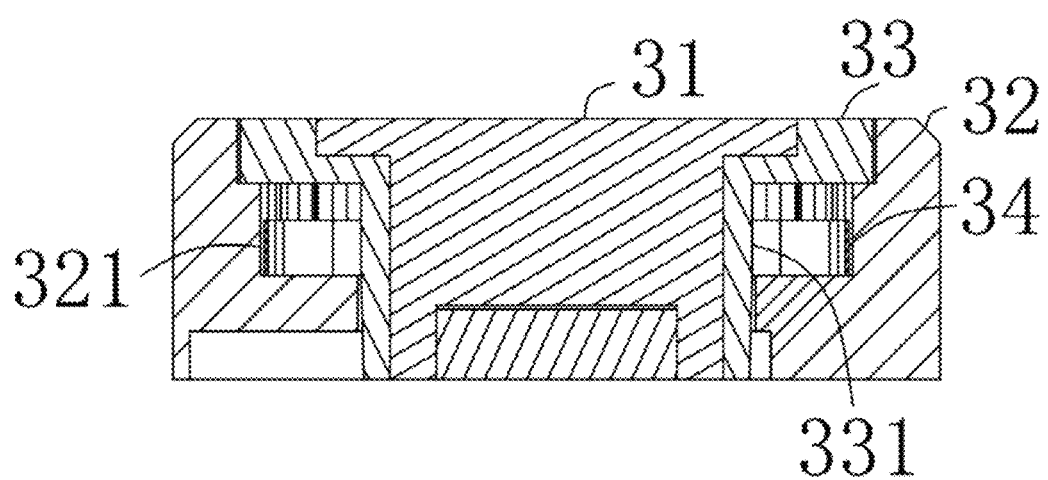
FIG. 12 is a schematic cross-sectional view of the knob along line E1-E1 in FIG. 11.
Figure 13:
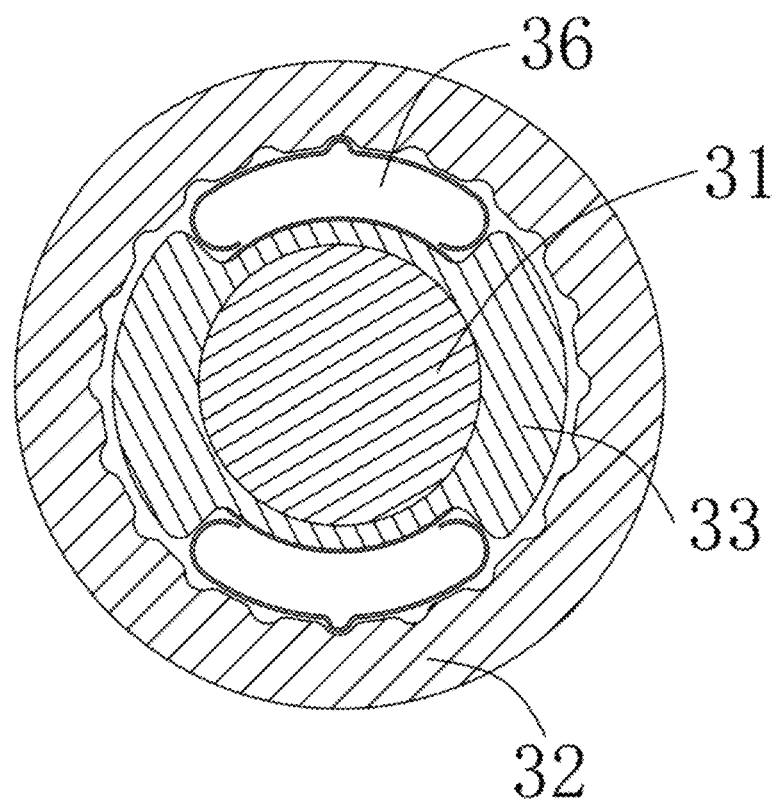
FIG. 13 is another schematic cross-sectional view of the knob along line E2-E2 in FIG. 11.

Referring to FIGS. 11-13, FIG. 11 is a schematic structural diagram of a knob according to yet another embodiment of the present disclosure, FIG. 12 is a schematic cross-sectional view of the knob shown in FIG. 11, and FIG. 13 is another schematic cross-sectional view of the knob shown in FIG. 11.

The second assembly 32 includes a knob inner surface surrounding the rotation axis, and the first surface 321 is the knob inner surface; correspondingly, the seat body 33 includes a seat body outer surface surrounding the rotation axis, and the second surface 331 is the seat body outer surface. Specifically, the knob inner surface, that is, the first surface 321, is formed with the concave-convex structure 35; and the seat body outer surface, that is, the second surface 331, is arranged with the at least one elastic protrusion 34. Of course, the knob inner surface, that is, the first surface 321, may also be arranged with the at least one elastic protrusion. Correspondingly, the seat body outer surface, that is, the second surface 331, is formed with the concave-convex structure 35.

Further, at least one reed 36 is arranged at the seat body outer surface, that is, the second surface 331, and one of the at least one elastic protrusion 34 is formed on each reed 36. Specifically, as shown in FIG. 12, the reed 36 extends in a bent strip shape, and the number thereof may be two. Correspondingly, the number of the elastic protrusions 34 is also two. Moreover, a surface on which the concave-convex structure 35 is disposed is a vertical surface parallel to the rotation axis. That is, the knob inner surface is the vertical surface. The elastic protrusion 34 of the reed 36 is arranged in a direction parallel to the rotation axis and protrudes from the reed 36 to slide along the concave-convex structure 35.

Of course, the reed 36 may be arranged in other shapes, and the number of the reed 36 and the number of the elastic protrusions 34 may also be any other number, as long as the effect of the elastic protrusion 34 sliding along the concave-convex structure 35 when the second assembly 32 is rotated relative to the seat body 33 is realized.

Figure 15:
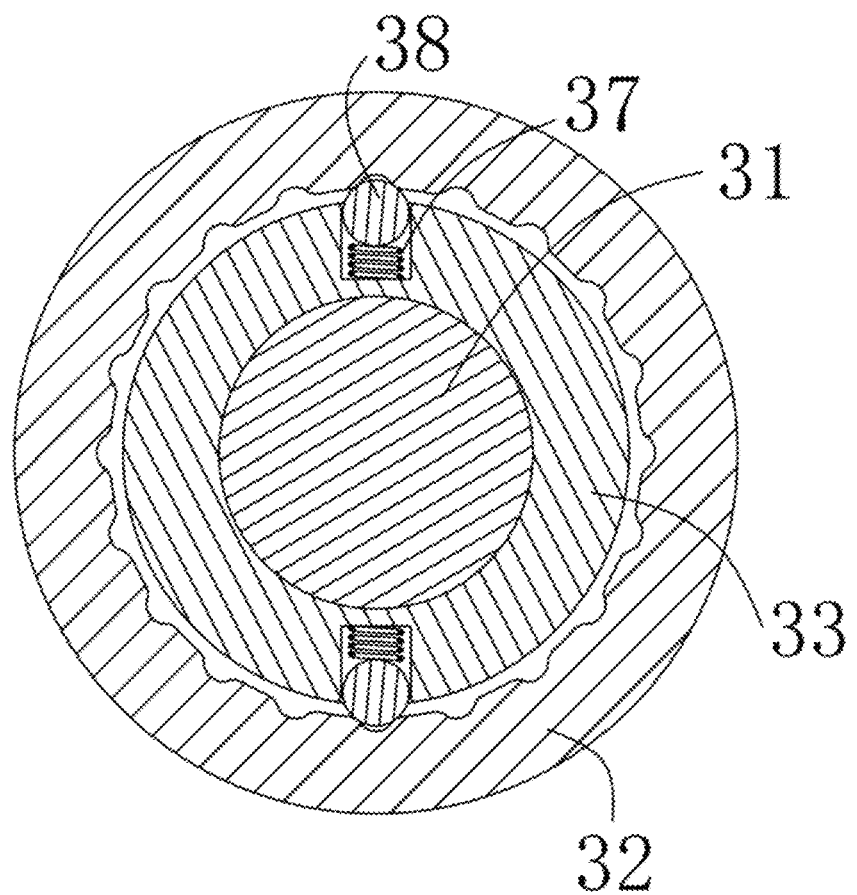
FIG. 15 is a schematic cross-sectional view of the knob along line F-F in FIG. 14.

Referring to FIGS. 14-15, FIG. 14 is a schematic structural diagram of a knob according to yet another embodiment of the present disclosure, and FIG. 15 is a schematic cross-sectional view of the knob shown in FIG. 14.

The difference between the embodiments illustrated in FIGS. 14-15 and the embodiments illustrated in FIGS. 11-13 is that at least one elastic element 37 is arranged at the seat body outer surface, that is, the second surface 331. Each elastic element 37 is connected to a sphere 38 that protrudes from the second surface 331. That is, the elastic protrusion 34 in the embodiments is the sphere 38. When the user rotates the knob 300, the sphere 38 moves closer to or away from the seat body 33 under the action of the elastic element 37, and at the same time slides along the concave-convex structure 35 under the action of the user's external force to change the rotation resistance.

Specifically, in the embodiments, the elastic element 37 may be a spring. Of course, the elastic element 37 may be other elastic structures, as long as the effect of changing the rotation resistance when the sphere 38 slides along the concave-convex structure 35 is achieved. In addition, the sphere 38 connected to the elastic element 37 may have other shapes and structures, such as a cube, a hexahedron, and the like.

Figure 17:
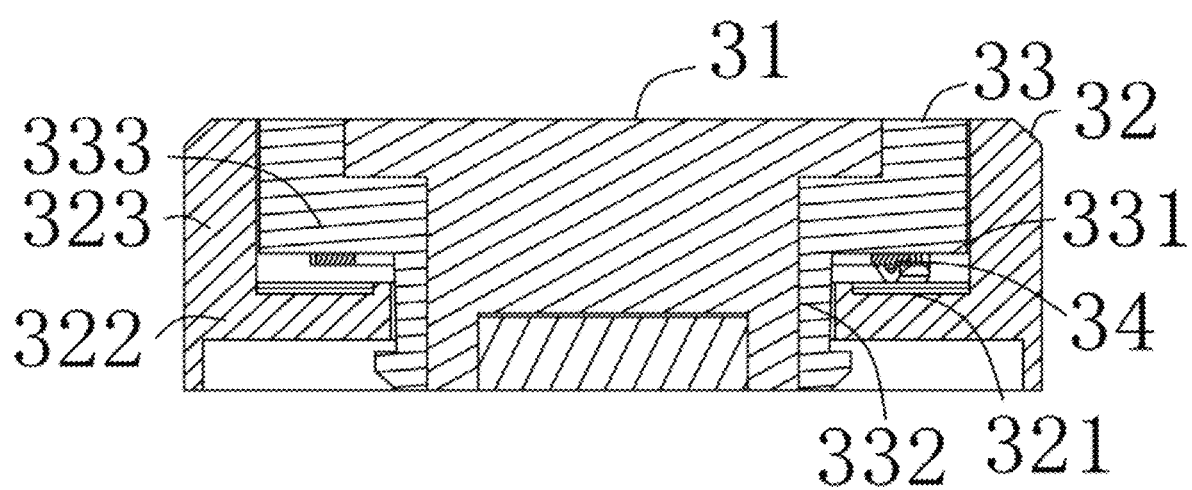
FIG. 17 is a schematic cross-sectional view of the knob along line G-G in FIG. 16.

Referring to FIGS. 16-17, FIG. 16 is a schematic structural diagram of a knob according to yet another embodiment of the present disclosure, and FIG. 17 is a schematic cross-sectional view of the knob shown in FIG. 16.

The difference between the embodiments illustrated in FIGS. 16-17 and the embodiments illustrated in FIGS. 14-15 is that the seat body 33 includes a plug member 332 and a sleeve member 333 that are connected to each other, the second assembly 32 includes a step member 322 and an outer ring member 323 that are connected to each other. The plug member 332 is plugged into the step member 322, and the outer ring member 323 is sleeved at the sleeve member 333. A step surface of the step member 322 is the first surface 321, and a surface of the sleeve member 333 opposite to the step surface is the second surface 331.

In the embodiments, the concave-convex structure 35 is arranged at the first surface 321, that is, the step surface, the reed 39 is arranged at the second surface 331, and an outer periphery of the reed 39 is arranged with at least one elastic arm 391. A free end of the elastic arm 391 is formed with the elastic protrusion 34. Specifically, the reed 39 has a flat closed ring structure and includes two elastic arms 391. Correspondingly, the number of the arranged elastic protrusions 34 is also two. Specifically, the first surface 321 on which the concave-convex structure 35 is formed is a horizontal surface perpendicular to the rotation axis. Of course, in other application scenarios, the first surface 321 may also be set as an inclined surface.

Of course, the reed 39 may be arranged in other shapes, and the number of the elastic arms 391 and the elastic protrusions 34 may also be any other number, as long as the effect of the elastic protrusion 34 sliding along the concave-convex structure 35 when the second assembly 32 is rotated relative to the seat body 33 is realized.

On the basis of the embodiments illustrated in FIGS. 1-3, the above three set of embodiments further enhance the user's sense of rotation stuttering during use, and avoid the problem of mis-operation.

With regard to the button function, the user only needs to touch and click the first assembly when using, which lacks the sense of force and feel, which may easily lead to mis-operation. In order to solve this problem, the present disclosure proposes four set of embodiments in FIG. 18, FIG. 20, FIG. 21, and FIG. 23. A same set of reference numerals are used in the description below.

A knob 400 includes a first assembly 41, a second assembly, and a seat body 43. The seat body 43 includes a seat body top surface and a seat body bottom surface opposite to each other in the direction of the rotation axis X. An elastic element 44 connected to the first assembly 41 is arranged in the accommodation cavity. The first assembly 41 is movably arranged in the accommodation cavity and may move relative to the seat body 43 along the direction of the rotation axis X.

When the user operates the first assembly 41, the first assembly 41 moves toward a bottom surface of the seat body 43, and the elastic element 44 is elastically deformed. Therefore, the user needs to overcome the elastic force of the elastic element 44 to press the first assembly 41 to realize the adjustment of the corresponding function. The first assembly 41 has a stroke change, such that the user has a good sense of force and hand experience, effectively avoiding the problem of mis-operation. Moreover, after the user has finished operating the knob 400, the first assembly 41 may be restored to an original shape under the action of the elastic force of the elastic element 44.

The four set of embodiments are further described below.

Figure 18:
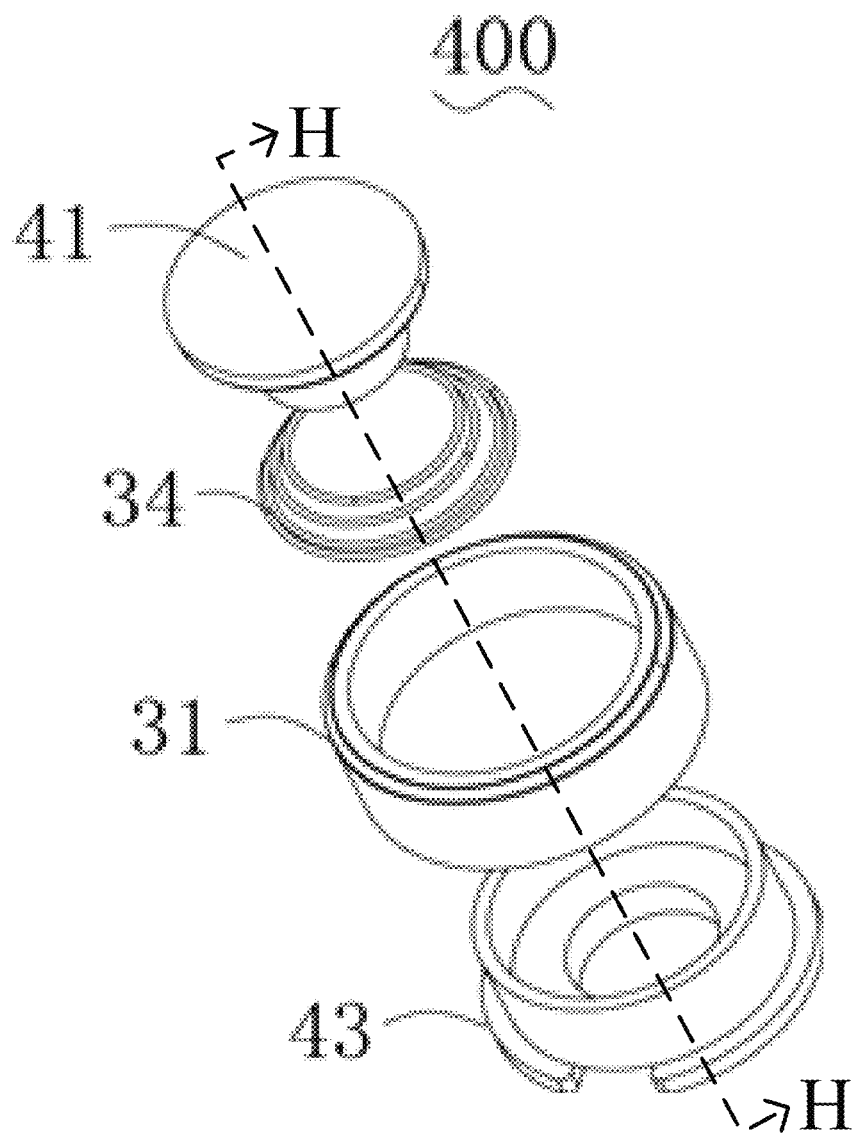
FIG. 18 is a schematic structural diagram of a knob according to yet another embodiment of the present disclosure.
Figure 19:
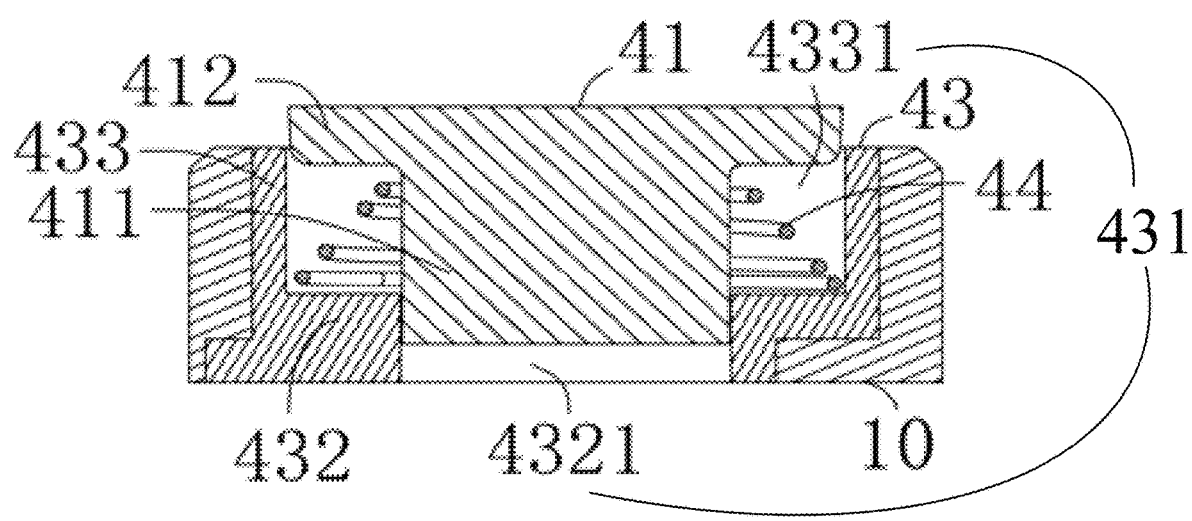
FIG. 19 is a schematic cross-sectional view of the knob along line H-H in FIG. 18.

Referring to FIGS. 18-19, FIG. 18 is a schematic structural diagram of a knob according to yet another embodiment of the present disclosure, and FIG. 19 is a schematic cross-sectional view of the knob shown in FIG. 18.

The seat body 43 includes a base member 432 and a sleeve member 433 that are connected to each other. The base member 432 is formed with a first slot 4321, and the sleeve member 433 is formed with a second slot 4331. The first slot 4321 and the second slot 4331 constitute the accommodation cavity 431. Correspondingly, the first assembly 41 includes a connection member 411 and a button member 412 that are connected to each other. The connection member 411 is embedded in the base member 432, and the button member 412 is embedded in the sleeve member 433.

In the embodiments, the elastic element 44 is connected between the button member 412 and the base member 432 and is disposed in the second slot 4331. Specifically, the elastic element 44 may be a spring, and the spring is connected between the button member 412 and the base member 432 and is sleeved at the connection member 411. Of course, the elastic element 44 may be other elastic structures, such as an elastic cantilever, an elastic sheet, etc., as long as the elastic element 44 can be elastically deformed when the user presses the knob 400.

It should be noted that since different types of elastic elements 44 have different elastic forces, the maximum deformation degree of the elastic elements 44 and the pressing force of the user pressing the knob 400 are also different, and the user's force and hand feel experience are also different. Moreover, as the distance that the first assembly 41 moves to the bottom surface of the seat body 43 increases, that is, the pressing stroke increases, the pressing force of the user pressing the knob 400 changes in a different manner. Therefore, the type of the elastic element 44 in the knob 400 may be determined according to specific use needs, and the maximum pressing stroke and the size change of the pressing force may also be adjusted according to specific use needs.

For example, a spring-type elastic element can realize a relatively large pressing stroke, while an elastic sheet-type elastic element or a silicone-type elastic element can only realize a relatively small pressing stroke. In the embodiments, the pressing stroke may range from 0.15 mm to 20 mm, for example, the pressing stroke is 0.15 mm, 10 mm, 15 mm, or 20 mm. Of course, in other embodiments, the pressing stroke may range from 0.2 mm to 10 mm for better usage performance.

Figure 20:
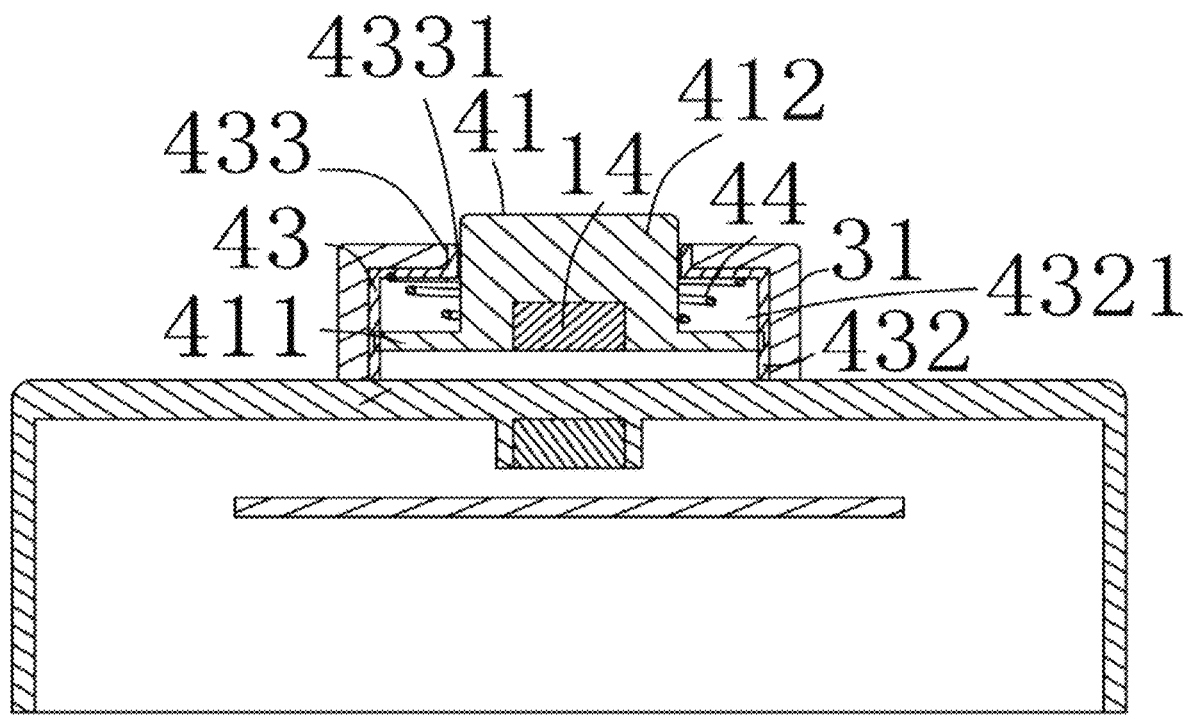
FIG. 20 is a schematic structural diagram of a knob according to yet another embodiment of the present disclosure.

Referring to FIG. 20, FIG. 20 is a schematic structural diagram of a knob according to yet another embodiment of the present disclosure.

The difference between the embodiments illustrated in FIG. 20 and the embodiments illustrated in FIGS. 18-19 is that the seat body 43 includes a base member 432 and a sleeve member 433 that are connected to each other. The base member 432 is formed of a first slot 4321, and the sleeve member 433 is formed with a second slot 4331. The first slot 4321 and the second slot 4331 constitute the accommodation cavity 431. Correspondingly, the first assembly 41 includes a connection member 411 and a button member 412 that are connected to each other. The connection member 411 is embedded in the base member 432, and the button member 412 is embedded in the sleeve member 433. The elastic element 44 is connected between the connection member 411 and the sleeve member 433 and is disposed in the first slot 4321. Specifically, referring to FIG. 20, the elastic element 44 may be a spring, and the spring is connected between the connection member 411 and the sleeve member 433 and sleeved at the button member 412. In the embodiments illustrated in FIGS. 18-19, the spring is deformed by compression, and in the embodiments illustrated in FIG. 20, the spring is deformed by extension.

Figure 21:
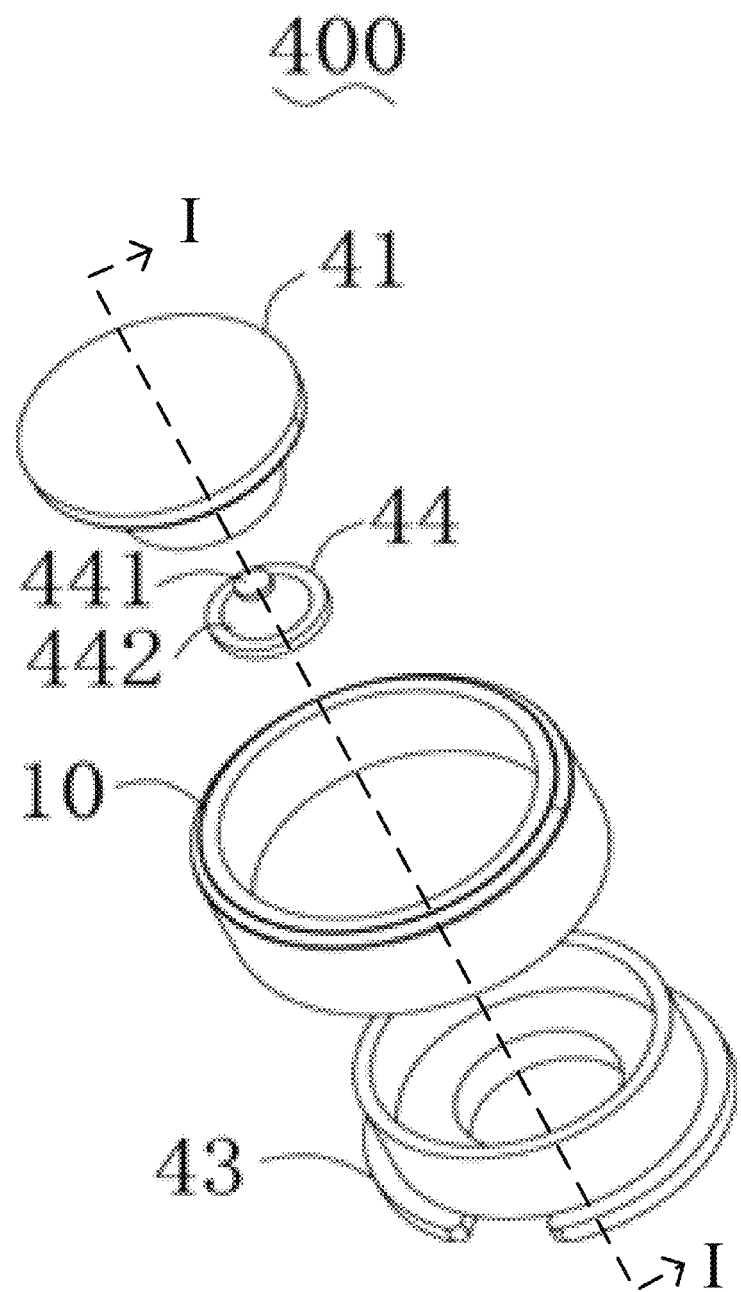
FIG. 21 is a schematic structural diagram of a knob according to yet another embodiment of the present disclosure.
Figure 22:
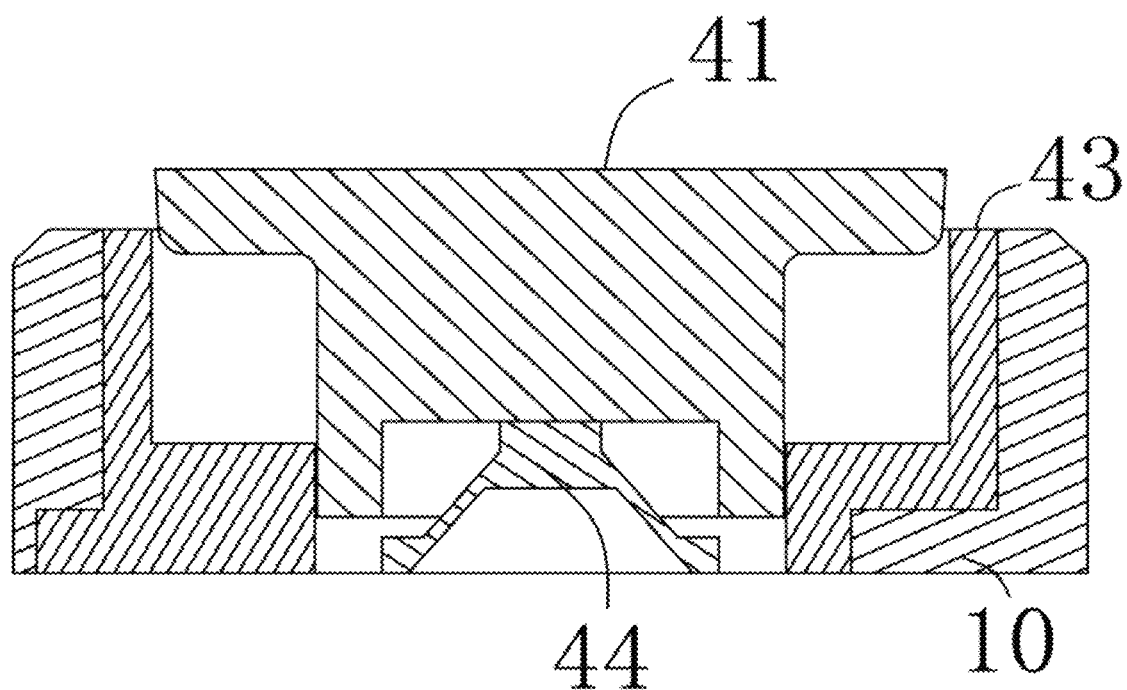
FIG. 22 is a schematic cross-sectional view of the knob along line I-I in FIG. 21.

Referring to FIGS. 21-22, FIG. 21 is a schematic structural diagram of a knob according to yet another embodiment of the present disclosure, and FIG. 22 is a schematic cross-sectional view of the knob shown in FIG. 21.

In the embodiments, the accommodation cavity 431 has a through-hole structure. An end of the elastic element 44 is connected to the first assembly 41, and the other end is in the same plane as the bottom surface of the seat body.

Further, the elastic element 44 includes a fixation member 441 and an outer ring member 442 connected to the fixation member 441 and arranged in a hollow shape. The fixation member 441 is connected to the first assembly 41. In this way, when the first assembly 41 moves toward the seat body bottom surface in a first direction, the outer ring member 442 moves toward the seat body bottom surface in the first direction. That is, when the user presses the first assembly 41, he or she needs to overcome the elastic force of the elastic element 44 to make the outer ring member 442 move toward the bottom surface of the seat body along the first direction. Conversely, when the user does not apply a pressing force on the knob 400, as the first assembly 41 moves away from the bottom surface of the seat body, the elastic element 44 returns to an original shape under the action of its own elastic force, and the fixation member 441 and the first assembly 41 connected to the fixation member 441 move away from the seat body bottom surface to restore the first assembly 41 to an original position.

Specifically, in the embodiments, the elastic element 44 may be, but not limited to, an elastic silicone or a rubber.

Figure 23:
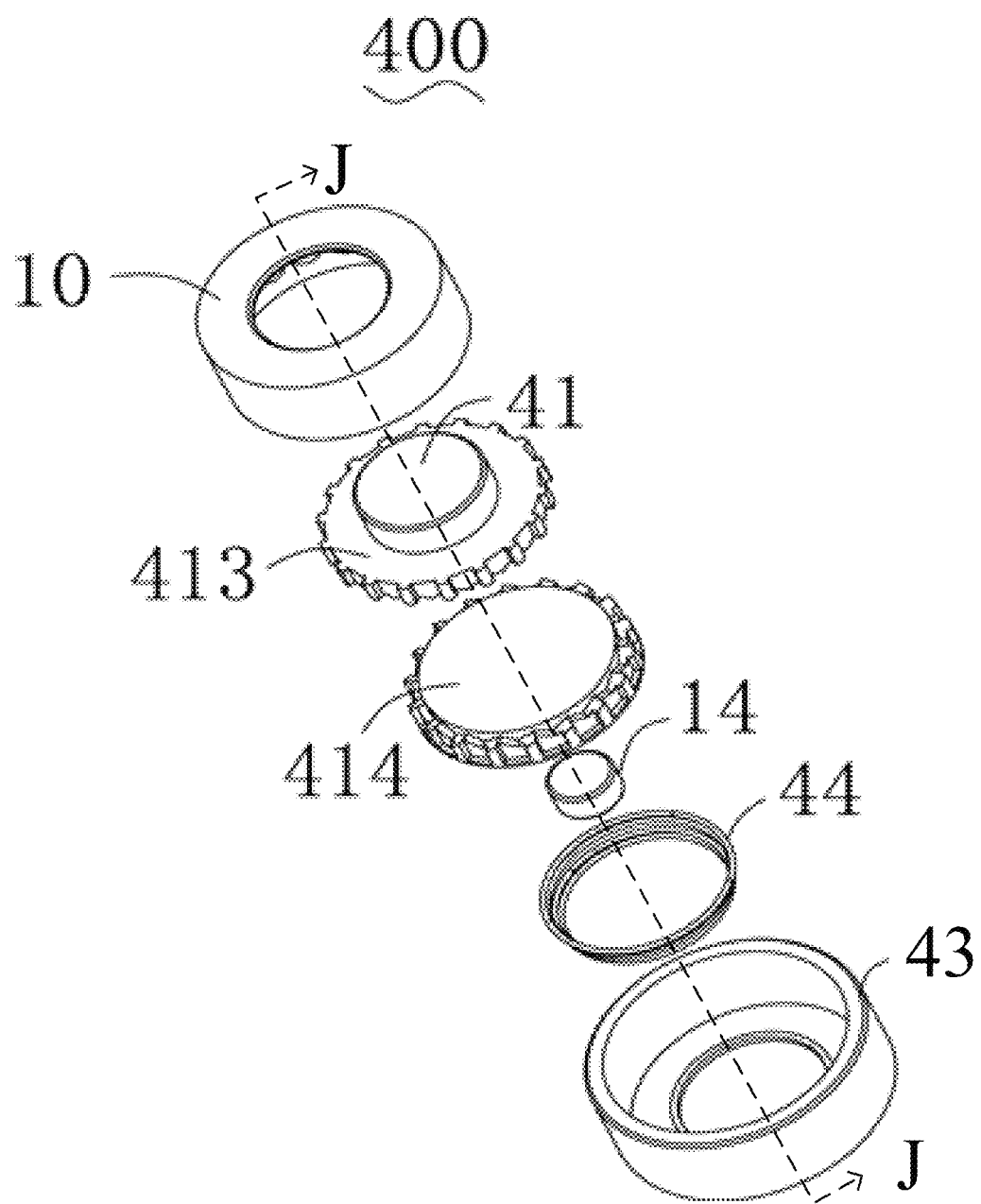
FIG. 23 is a schematic structural diagram of a knob according to yet another embodiment of the present disclosure.
Figure 24:
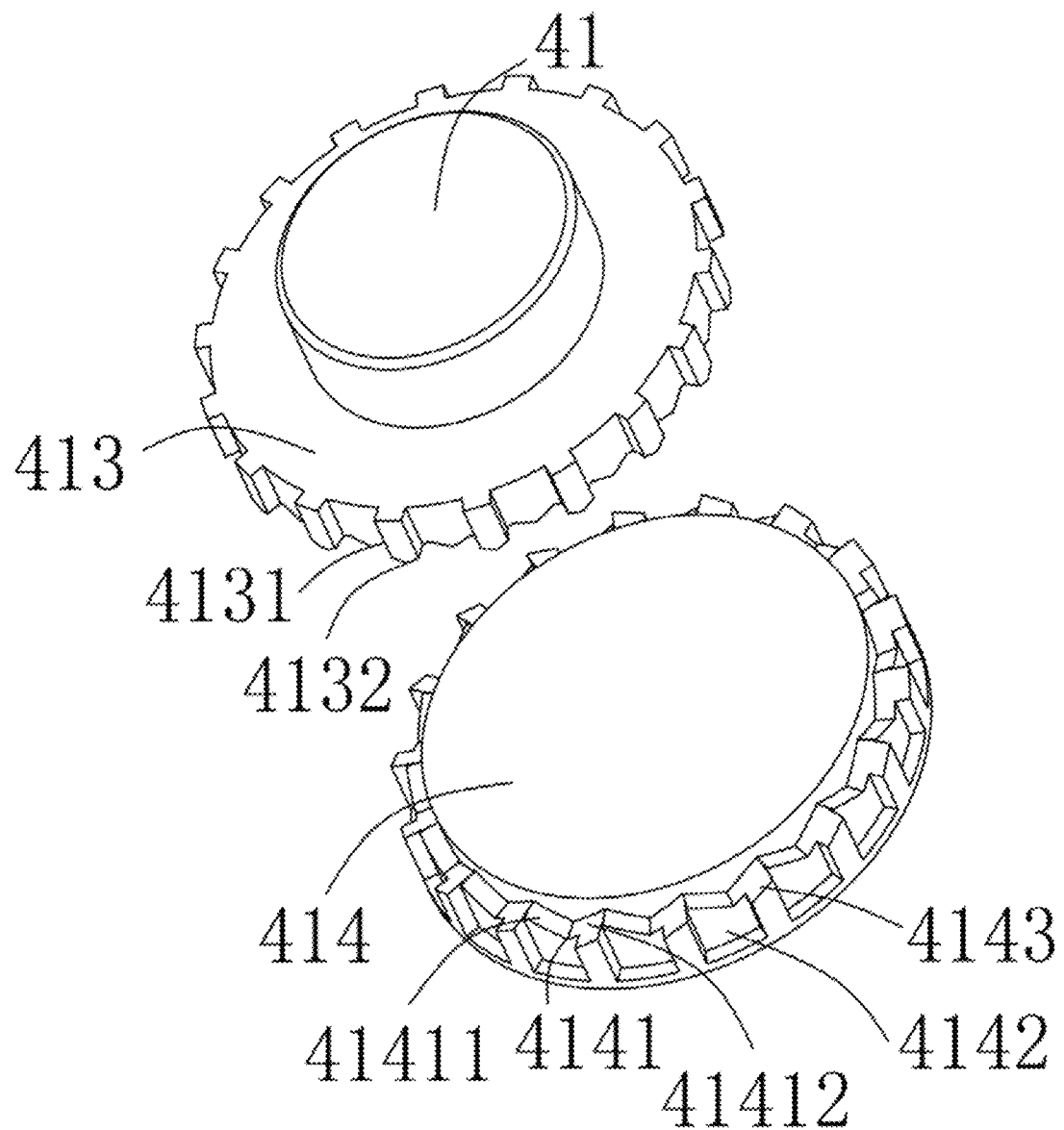
FIG. 24 is a schematic structural diagram of a self-locking member and a locking member of the knob shown in FIG. 23.
Figure 25:
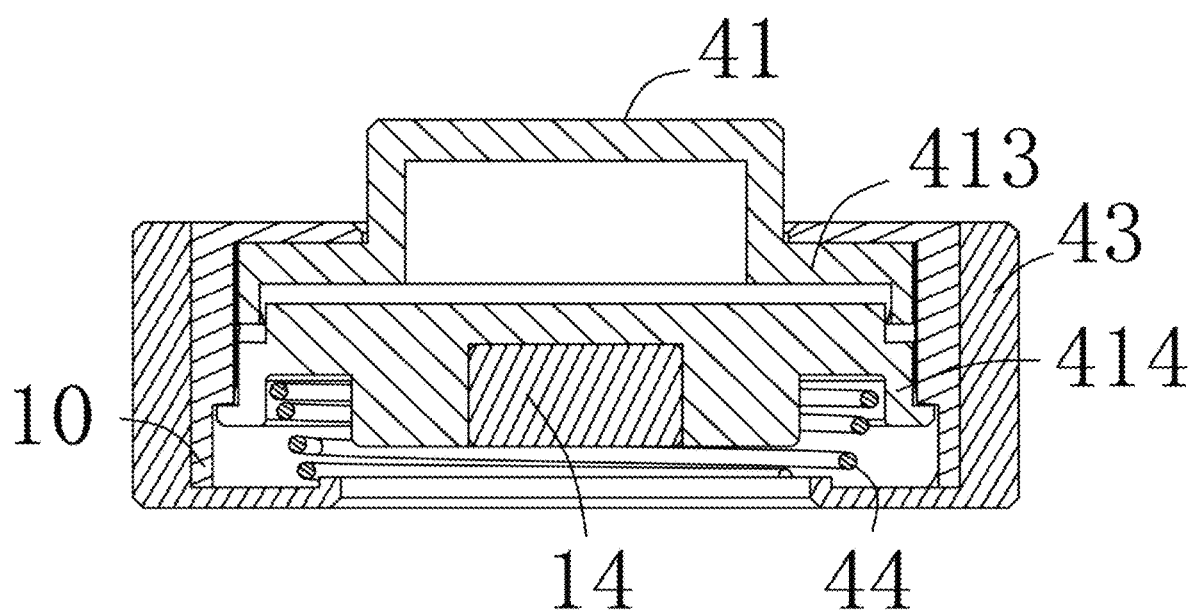
FIG. 25 is a schematic cross-sectional view of the knob along line J-J in FIG. 23.

Referring to FIGS. 23-25, FIG. 23 is a schematic structural diagram of a knob according to yet another embodiment of the present disclosure, FIG. 24 is a schematic structural diagram of a self-locking member and a locking member of the knob shown in FIG. 23, and FIG. 25 is a schematic cross-sectional view of the knob shown in FIG. 23.

In the embodiments, the first assembly 41 includes a self-locking member 413 and a locking member 414. The locking member 414 is arranged closer to the seat body bottom surface than the self-locking member 413, and the elastic element 44 is connected to the locking member 414. An end surface of the self-locking member 413 connected to the locking member 414 is arranged with a first V-shaped protrusion 4131 and a second V-shaped protrusion 4132. An end surface of the locking member 414 connected to the self-locking member 413 is provided with a first V-shaped slot 4141 and a second V-shaped slot 4142 and is arranged with a second mating surface 4143. The first V-shaped slot 4141 includes a first slope 41411 and a second slope 41412 that are V-shaped. The second mating surface 4143 is connected to the second slope 41412 and is in the same plane as the second slope 41412. The second mating surface 4143 is connected to a notch of the second slot 4142. The first V-shaped protrusion 4131 is embedded in the first V-shaped slot 4141, and the second V-shaped protrusion 4132 abuts against the second mating surface 4143.

When in use, and when the self-locking member 413 is under a first pressing force, the second V-shaped protrusion 4132 acts on the second mating surface 4143, the locking member 414 rotates under the action of the elastic element 44 at the same time, and the second V-shaped protrusion 4132 is inserted into the second slot 4142. When the self-locking member 413 is under a second pressing force, the first V-shaped protrusion 4131 acts on the first slope 41411, the locking member 414 rotates under the action of the elastic element 44 at the same time, and the second V-shaped protrusion 4132 abuts against the second mating surface 4143. In this way, when the user presses for the first time, the first assembly 41 moves to a position toward the seat body bottom surface to realize the self-locking function. In this case, when the user removes the first pressing force, the first assembly 41 still stays at the aforementioned position without moving, which is convenient for the user to operate. When the user presses again after the operation is completed, the self-locking is released, and the first assembly 41 moves away from the seat body bottom surface under the elastic action of the elastic element 44 to restore to the original state.

On the basis of the embodiments illustrated in FIGS. 1-3, the above four set of embodiments further enhance the user's sense of keystrokes during use, and avoid the problem of mis-operation.

The above eleven set of knob embodiments may be combined and applied under the condition that the structural features are not contradictory to each other, so as to realize the optimal effect from various aspects. The knob may be applied in household appliances in conjunction with the control panel. The present disclosure further proposes a household appliance.

Figure 26:
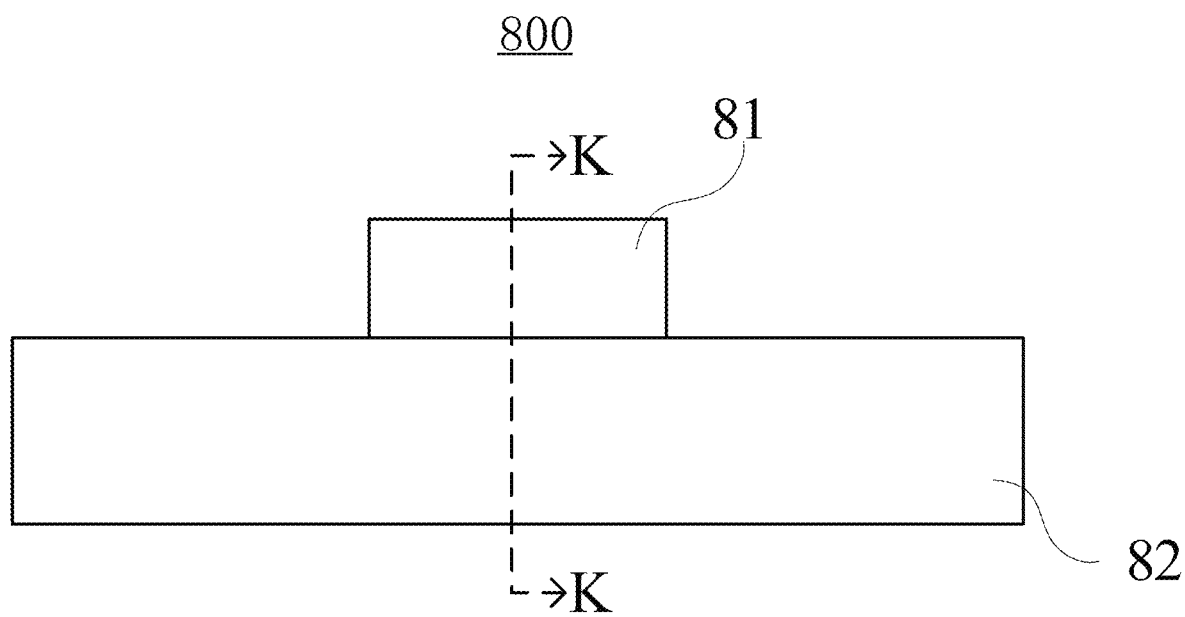
FIG. 26 is a schematic structural diagram of a household appliance according to an embodiment of the present disclosure.
Figure 27:
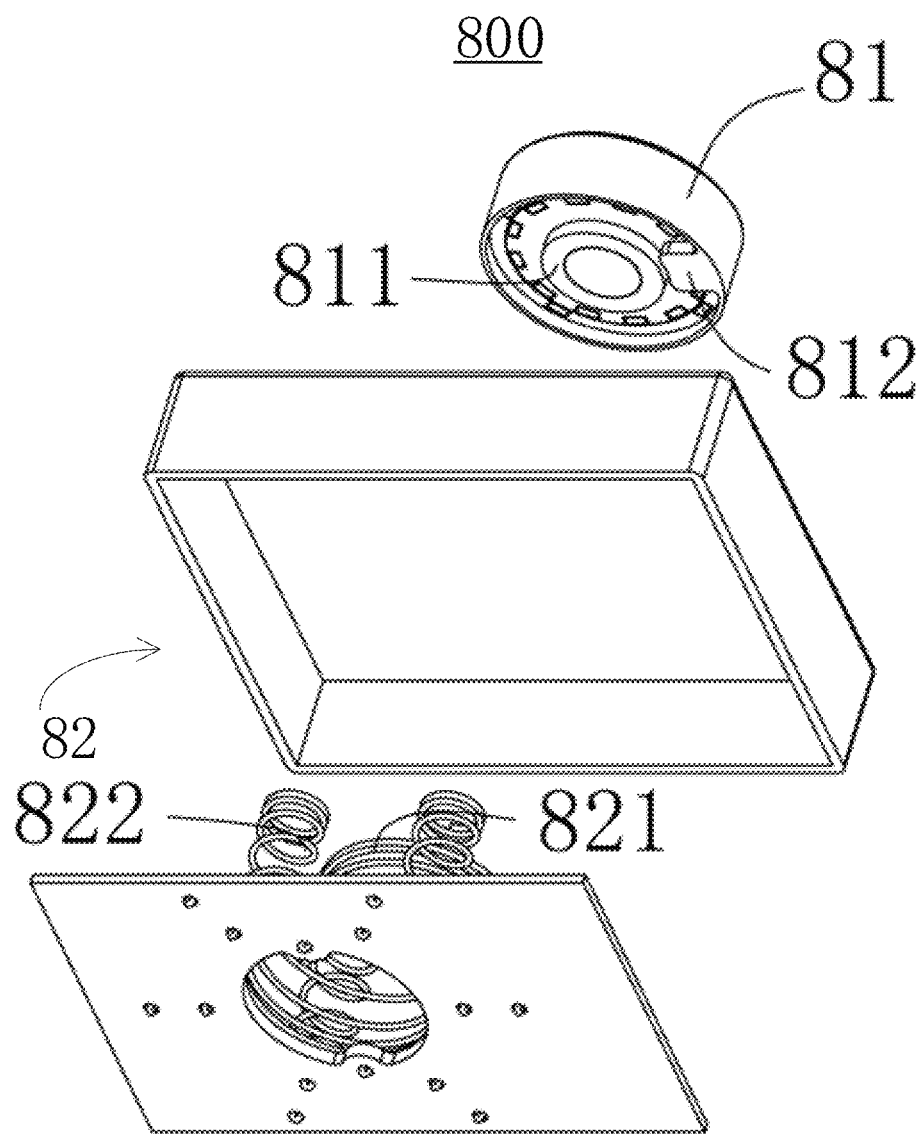
FIG. 27 is another schematic structural diagram of the household appliance shown in FIG. 26.
Figure 28:
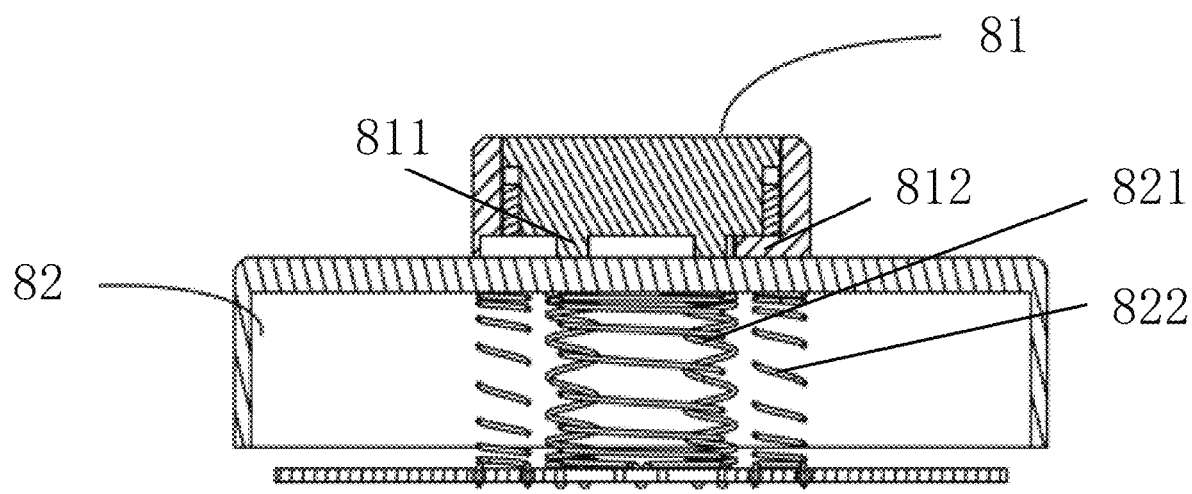
FIG. 28 is a schematic cross-sectional view of the household appliance along line K-K in FIG. 26.
Figure 29:
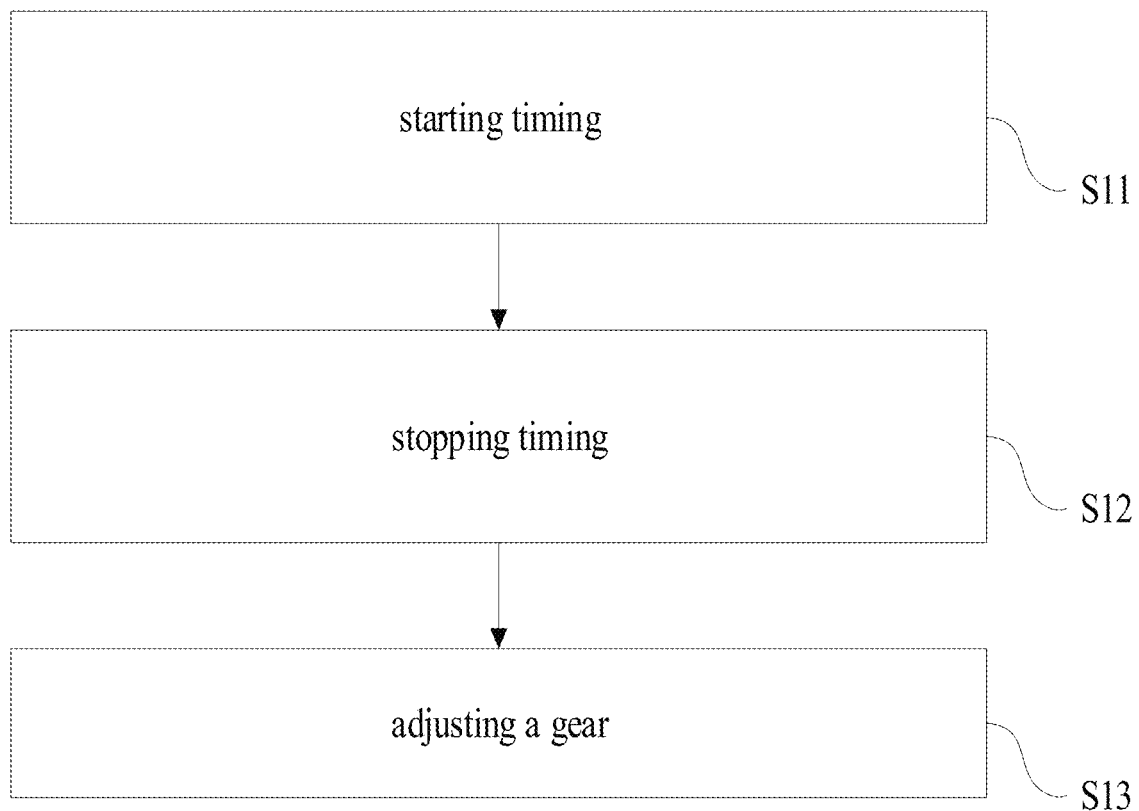
FIG. 29 is a flowchart of a method for controlling a magnetic knob according to an embodiment of the present disclosure.

Referring to FIGS. 26-28 FIG. 26 is a schematic structural diagram of a household appliance according to an embodiment of the present disclosure, FIG. 27 is another schematic structural diagram of the household appliance shown in FIG. 26, and FIG. 28 is a schematic cross-sectional view of the household appliance shown in FIG. 26. A household appliance 800 in the embodiments includes a knob 81 and a control panel 82. The knob 81 may be the above knobs 100-400, and the control panel 82 may be the above control panel 900.

The knob 81 includes a first sensing element 811 and a second sensing element 812. The knob 81 is attached to the control panel 82 and configured to sense each other with a third sensing element 821 and a fourth sensing element 822 in the control panel 82 to realize sensing control. The third sensing element 821 and the fourth sensing element 822 may be specifically inductive springs. In other embodiments, conductive plastics or the like may be applied.

The first sensing element 811 and the third sensing element 821 form a capacitor, and the capacitance change of the third sensing element 821 is detected when the user operates, so as to determine whether the confirmation function of pressing or touching occurs. The second sensing element 812 and the fourth sensing element 822 form a capacitor, and at least two fourth sensing elements 822 are distributed around. Therefore, detecting the capacitance of the fourth sensing elements 822 can determine the rotation of the knob 81.

The household appliance 800 may be a controllable electric appliance such as a water heater, a gas stove, a microwave oven, a washing machine, an oven, a refrigerator, an air conditioner, a water dispenser, etc. The knob 81 is attached to the control panel 82, and the control of the household appliance is realized through the control panel 82, for performing the control functions of rotation adjustment and button confirmation.

Further referring to FIGS. 1-2, the magnetic knob 100 includes a second assembly 12 and an attachment element 14. A second sensing element 121 is arranged at a side of the second assembly 12. When the second assembly 12 rotates around the central axis, the second sensing element 121 rotates together with the second assembly 12.

Further referring to FIG. 3, the control panel 900 includes a plurality of fourth sensing elements 912 and a magnet 92. The magnet 92 and the attachment element 14 of the magnetic knob 100 attract each other to realize the fixation of the magnetic knob 100.

When the second sensing element 121 rotates with the second assembly 12, the plurality of fourth sensing elements 912 and the second sensing element 121 sense and generate sensing signals.

Taking the number of the fourth sensing elements 912 being eight as an example, the eight fourth sensing elements 912 may be divided corresponding to 1-8 gears. When the fourth sensing element 912 of Gear 1 senses the second sensing element 121, the sensing signal corresponding to Gear 1 is generated, a controller may realize the adjustment of different gears according to the sensing signal sent by the fourth sensing element 912 of different gears.

Since the number of gears required by the device may exceed 1 or even 2 times the number of the fourth sensing elements 912, the magnetic knob 100 is generally subjected to a difference processing on key values sequentially obtained and to a corresponding adding or subtraction calculation according to the rotation direction. The key value represents a serial number of a corresponding fourth sensing element 912. For example, the key value of a first fourth sensing element 912 is 1, the key value of a second fourth sensing element 912 is 2 . . . , and so on. Specifically, when there are a total of 8 fourth sensing elements 912 corresponding to 16 gears, when the key values obtained sequentially are 1, 2, and 3, it is determined that the gear is increased by 4.

When the knob is rotated fast, due to problems such as filtering and chip processing speed, a fourth sensing element 912 may lose its output value, which causes the difference of addition and subtraction during rotation to not necessarily be the difference between two adjacent fourth sensing elements 912. That is, there may be value jumps, and the output time of the same key value may be long or short (due to the influence of signal filtering, sometimes a new key value of a sensing element is output too few times and is deleted and not output. At this time, the key value of a previous sensing element will always be output), such that it is impossible to identify the speed of rotation to increase or decrease the gear quickly or slowly. From the user experience, when the user rotates the knob quickly and wants to increase or decrease the gear quickly, but actually still does the gear increase or decrease according to a slow logic, or the speed of the gear speed changing varies during the process.

At block S11: in response to obtaining a first sensing signal, starting timing; wherein the first sensing signal is generated by a first fourth sensing element in response to a magnetic knob being adjusted to a first gear.

At block 11: in response to obtaining a first sensing signal, starting timing; wherein the first sensing signal is generated by a first fourth sensing element in response to a magnetic knob being adjusted to a first gear.

The first fourth sensing element is configured to sense in response to the magnetic knob being adjusted to the first gear, which means that the first fourth sensing element interacts with the second sensing element of the magnetic knob to generate a sensing signal. Understandably, in some embodiments, the sensing value of the first sensing signal is required to be determined, and the timing starts when the sensing value of the first sensing signal is greater than a preset trigger threshold.

In some embodiments, a counter may be applied to count for realizing timing. Specifically, when the first sensing signal is initially obtained, the counting is started; when the first sensing signal is continuously obtained, or when no sensing signal is obtained, the counting is accumulated. When a second sensing signal generated by a second fourth sensing element in response to the knob being adjusted to a second gear is obtained, the counting is stopped and the count value is taken as a gear adjustment duration, and the count is cleared and restarted.

At block S12: in response to obtaining a second sensing signal, stopping timing to determine a gear adjustment duration; wherein the second sensing signal is generated by a second fourth sensing element in response to the magnetic knob being adjusted to a second gear.

In some embodiments, assuming that the trigger threshold of the sensing signal is A. When the sensing value of the first sensing signal of the first fourth sensing element is greater than A, the counting starts (for example, once per second). As the knob is rotated, the sensing value of the first sensing signal is gradually reduced. When the sensing value of the first sensing signal is less than A, it is considered that no sensing signal has been obtained, and the counting continues. When the knob is rotated to the second fourth sensing element, the sensing value of the second sensing signal gradually increases. When the sensing value of the second sensing signal is greater than A, counting is stopped, and the gear adjustment duration is determined according to the accumulated count value. The count value is cleared to zero and restart the counting.

At block S13: adjusting a gear according to the gear adjustment duration and a gear difference between the first gear and the second gear.

Figure 30:
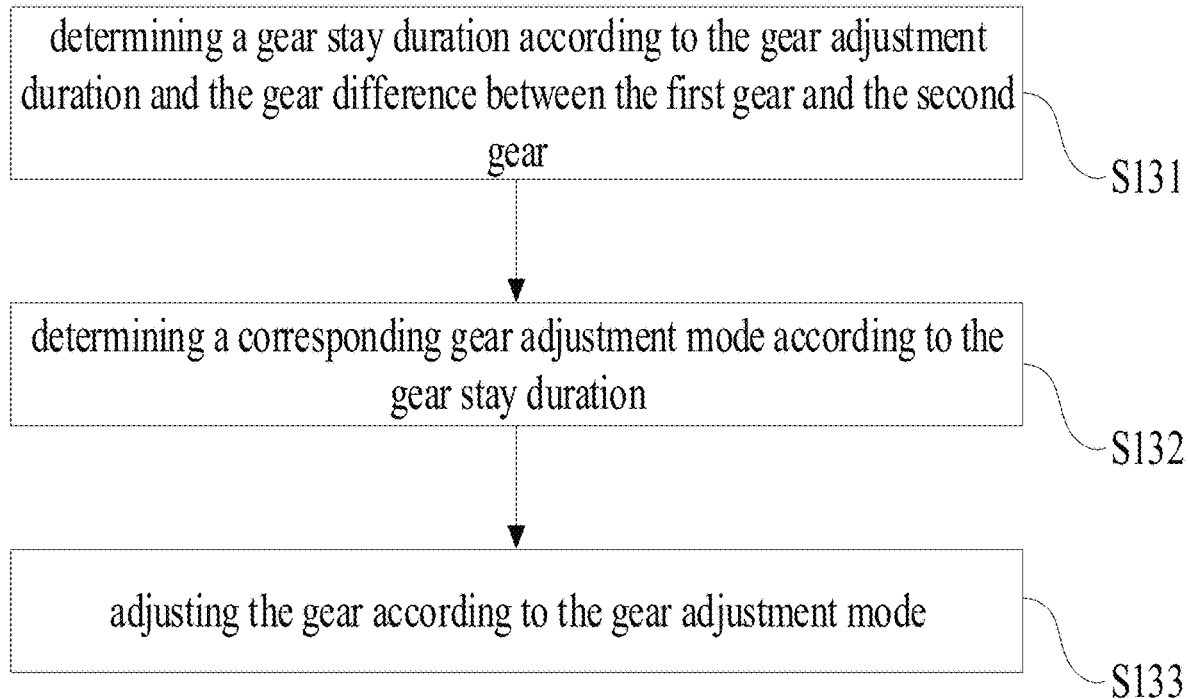
FIG. 30 is a flowchart of an operation 33.

In some embodiments, as illustrated in FIG. 30, FIG. 30 is a flowchart of the operation 13. The operation 13 may specifically include operations at blocks illustrated herein.

At block S131: determining a gear stay duration according to the gear adjustment duration and the gear difference between the first gear and the second gear.

In some embodiments, the gear adjustment duration may be divided by the gear difference between the first gear and the second gear to obtain the gear stay duration.

Assuming that the gear stay duration is ΔT, the gear adjustment duration is key_cnt, and the gear difference (key value difference) is key_differ_value:

$$\Delta T = key\_cnt/key\_differ\_value.$$

At block S132: determining a corresponding gear adjustment mode according to the gear stay duration.

The gear adjustment mode includes a fast adjustment mode and a slow adjustment mode. The fast mode indicates that the knob is rotated quickly, and the slow mode indicates that the knob is rotated slowly.

In some embodiments, the fast adjustment mode may be determined when the gear stay duration is greater than a preset time threshold; or the slow adjustment mode may be determined when the gear stay duration is less than the preset time threshold.

The preset time threshold may be set according to an empirical value.

At block S133: adjusting the gear according to the gear adjustment mode.

The gear adjustment mode includes at least two modes with different adjustment speeds.

For example, when the gear adjustment modes include a first adjustment mode, a second adjustment mode, and a third adjustment mode, the adjustment speeds of the first adjustment mode, the second adjustment mode, and the third adjustment mode are sequentially increased. When the gear adjustment mode is the first adjustment mode, the gear adjustment is performed according to a first gear adjustment range; or when the gear adjustment mode is the second adjustment mode, the gear adjustment is performed according to a second gear adjustment range; or when the gear adjustment mode is the third adjustment mode, the gear adjustment is performed according to a third gear adjustment range. The first gear adjustment range, the second gear adjustment range, and the third gear adjustment range are sequentially decreased.

When the gear adjustment mode is the fast adjustment mode, the gear adjustment is performed according to the first gear adjustment range; or when the gear adjustment mode is the slow adjustment mode, the gear adjustment is performed according to the second gear adjustment range.

In some embodiments, the first gear adjustment range is greater than the second gear adjustment range. Specifically, different gears may be set for the fast adjustment mode and the slow adjustment mode. For example, the fast adjustment mode corresponds to 5 gears, and the slow adjustment mode corresponds to 1 gear.

When the current gear is B, it is first determined whether to increase or decrease the gear according to the change of the key value (the key value increasing means increasing the gear, and the key value decreasing means decreasing the gear). When the gear is to be increased and the gear adjustment mode is the fast adjustment mode, the B gear is directly added by 5 gears. When the gear is to be increased and the gear adjustment mode is the slow adjustment mode, the B gear is directly added by 1 gear. In a similar manner, when the gear is to be decreased and the gear adjustment mode is the fast adjustment mode, the B gear is directly subtracted by 5 gears; when the gear is to be decreased and the gear adjustment mode is the slow adjustment mode, the B gear is directly subtracted by 1 gear.

In other embodiments, the gear adjustment range may be determined according to the change of the key value and the gear adjustment mode. For example, when the key value changes from 1 to 3 and the gear adjustment mode is determined to be the fast adjustment mode, the adjustment range is increased twice, that is, the gear is adjusted from the current Gear 1 to Gear 5. When the key value changes from 1 to 3, and the gear adjustment mode is determined to be the slow adjustment mode, the adjustment range remains unchanged, that is, the gear is adjusted from the current Gear 1 to Gear 3.

In other embodiments, the first gear adjustment range is to increase the gear to a maximum gear or decrease the gear to a minimum gear, and the second gear adjustment range is to increase or decrease the gear by 1 gear. For example, the gears include 1-16 gears in total. When the current gear is Gear 8, and when the gear adjustment mode is determined to be the fast adjustment mode when the gear is to be increased, the gear is directly adjusted to Gear 16; when the gear adjustment mode is determined to be the fast adjustment mode when the gear is to be decreased, the gear is directly adjusted to the Gear 1. Further, when the current gear is Gear 8, and when the gear adjustment mode is determined to be the slow adjustment mode when the gear is to be increased, the gear is directly adjusted to Gear 9; when the gear adjustment mode is determined to be the slow adjustment mode when the gear is to be decreased, the gear is directly adjusted to Gear 7.

The method for controlling the magnetic knob provided by the embodiments includes: in response to obtaining a first sensing signal, starting timing; wherein the first sensing signal is generated by a first fourth sensing element in response to a magnetic knob being adjusted to a first gear; in response to obtaining a second sensing signal, stopping timing to determine a gear adjustment duration; wherein the second sensing signal is generated by a second fourth sensing element in response to the magnetic knob being adjusted to a second gear; and adjusting a gear according to the gear adjustment duration and a gear difference between the first gear and the second gear. Through the above method, the duration of a certain sensing signal is calculated to determine the gear adjustment duration, so as to determine the rotation speed of the knob and realize corresponding adjustment, thereby avoiding the problem of too fast rotation of the knob that some fourth sending elements cannot generate sensing signals, further realizing precise control of gear adjustment of the knob.

Figure 31:
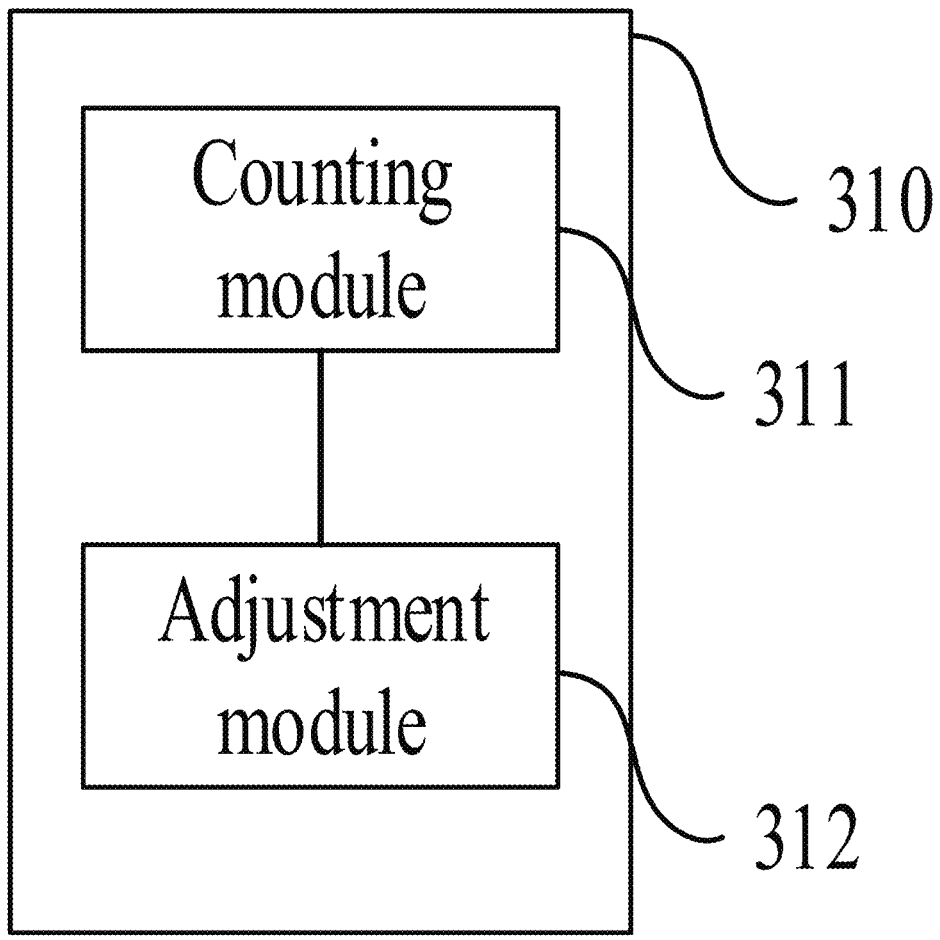
FIG. 31 is a schematic structural diagram of a cooking device according to an embodiment of the present disclosure.

Referring to FIG. 31, FIG. 31 is a schematic structural diagram of a cooking device according to an embodiment of the present disclosure. A cooking device 310 includes a counting module 311 and an adjustment module 312.

The counting module 311 is configured to start timing in response to obtaining a first sensing signal; wherein the first sensing signal is generated by a first fourth sensing element in response to a magnetic knob being adjusted to a first gear. The counting module 311 is further configured to stop timing in response to obtaining a second sensing signal to determine a gear adjustment duration; wherein the second sensing signal is generated by a second fourth sensing element in response to the magnetic knob being adjusted to a second gear.

The adjustment module 312 is configured to adjust a gear according to the gear adjustment duration and a gear difference between the first gear and the second gear.

Figure 32:
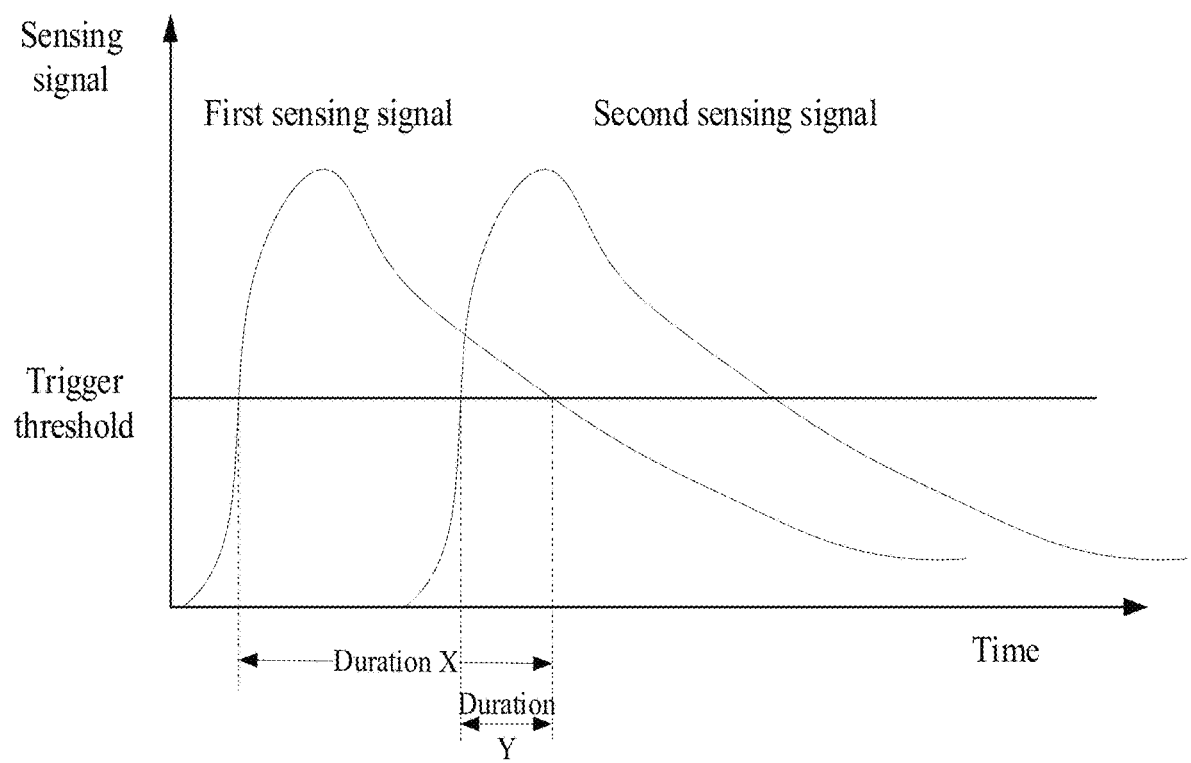
FIG. 32 is schematic view of a first sensing signal and a second sensing signal according to an embodiment of the present disclosure.

Further referring to FIG. 32, FIG. 32 is schematic view of a first sensing signal and a second sensing signal according to an embodiment of the present disclosure. Understandably, during the duration X (triggering time of the first sensing signal), the sensing value of the first sensing signal generated by the first fourth sensing element 912 is greater than the trigger threshold, and the first sensing signal is triggered. As the knob rotates, the sensing value of the first sensing signal gradually increases and then gradually decreases. When the knob 100 is rotated to between the first fourth sensing element 912 and the second fourth sensing element 912, the second sensing signal gradually increases, which may cause the problem of false triggering because the sensing value of the second sensing signal is greater than the trigger threshold.

With the rotation of the knob 100, when the sensing value of the second sensing signal is greater than the trigger threshold, the second sensing signal is triggered. After the second sensing signal is triggered, when the operation of the magnetic knob 100 is stopped, the second sensing signal will continue to trigger the corresponding function. However, when the magnetic knob 100 is operated again, due to the second sensing element 121 of the knob 100 is close to the first fourth sensing element 912 and the second fourth sensing element 912 at the same time, the sensing value of the first sensing signal is also likely to be greater than the trigger threshold, causing the first sensing signal to be triggered, thus causing a gear retracement.

Solutions to the above problems are introduced below through some embodiments.

Figure 33:
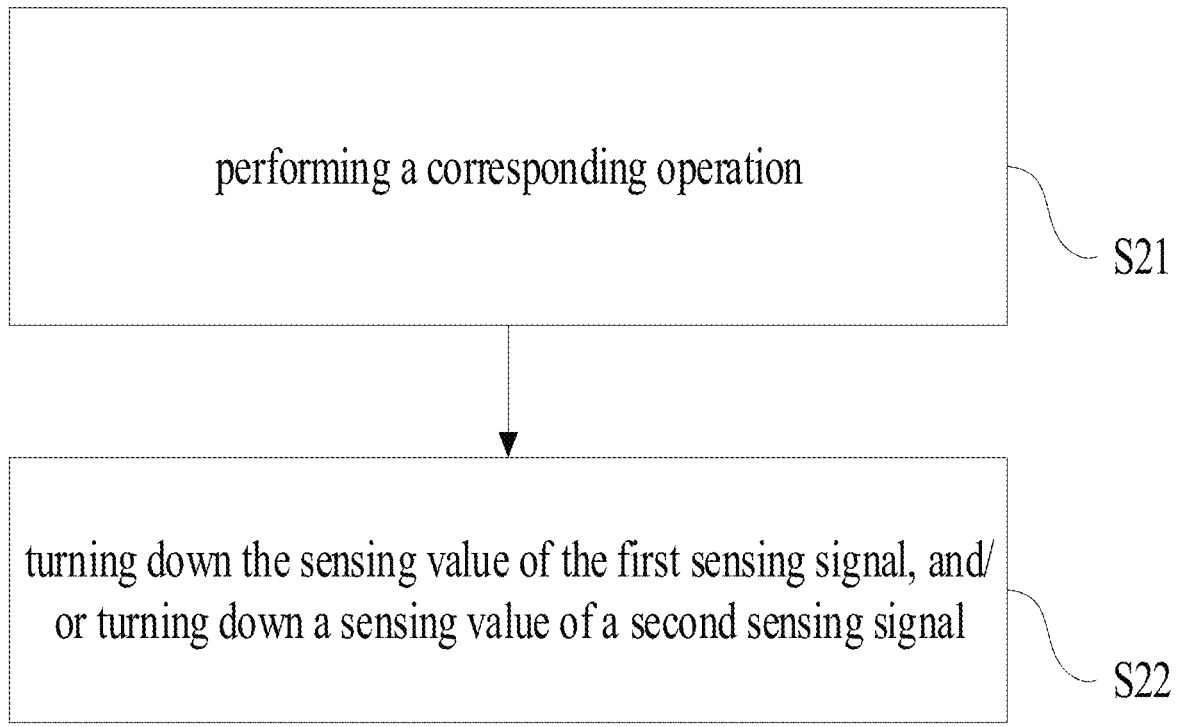
FIG. 33 is a flowchart of a method for controlling a magnetic knob according to another embodiment of the present disclosure.

Referring to FIG. 33, FIG. 33 is a flowchart of a method for controlling a magnetic knob according to another embodiment of the present disclosure. The method may include operations at blocks illustrated herein.

At block S21: in response to a sensing value of a first sensing signal being greater than a set trigger threshold, performing a corresponding operation according to the first sensing signal; wherein the first sensing signal is generated by a first fourth sensing element in response to a magnetic knob being adjusted.

In some embodiments, the plurality of fourth sensing elements may be corresponding to different adjustment gears. When the first sensing signal is triggered, the gear adjustment is performed to a gear corresponding to the first fourth sensing element.

At block S22: turning down the sensing value of the first sensing signal, and/or turning down a sensing value of a second sensing signal of a second fourth sensing element adjacent to the first fourth sensing element.

The sensing value of the first sensing signal may be turned down. Understandably, since the first sensing signal has been triggered, the device has already responded to the first sensing signal. Therefore, when the first sensing signal maintains a large sensing value, it is likely to cause the problem that other sensing signals (such as the sensing signal of another rotation gear or the sensing signal of the confirmation button) cannot be triggered.

In a case, after the first sensing signal corresponding to the first fourth sensing element is triggered, the sensing value of the first sensing signal is turned down. With the rotation of the knob, the sensing signal corresponding to the second fourth sensing element is triggered. When the user stops touching the magnetic knob, the second sensing signal continues to be triggered. When the user touches the magnetic knob again, since the sensing value of the first sensing signal is turned down to be difficult to reach the trigger threshold, the second sensing signal is still triggered, avoiding the problem of gear retracement.

In another case, after the first sensing signal corresponding to the first fourth sensing element is triggered, the sensing value of the first sensing signal is turned down. When the user operates the confirmation button, the problem that the first sensing signal is too large (greater than the trigger threshold) and the confirmation button cannot be triggered is avoided.

The sensing value of the second sensing signal of the second fourth sensing element adjacent to the first fourth sensing element may be turned down. It is understandable that after the second sensing signal is turned down (for example, below the trigger threshold), the triggering of the second sensing signal may be delayed, which in turns increases the duration of the first sensing signal, thereby ensuring that the second sensing signal is triggered when the sensing value of the first sensing signal is reduced below the trigger threshold, so as to avoid the problem of false triggering of the second sensing signal.

For example, when rotating knob, the user wants to adjust to Gear 2 but actually turns the knob to between Gear 2 and Gear 3 due to imprecise operation. In this case, the third fourth sensing element corresponding to Gear 3 also generates a sensing signal. Since the sensing signal corresponding to Gear 2 has been triggered, the sensing value of the sensing signal corresponding to Gear 3 may be turned down to avoid false triggering of Gear 3. When the knob continues to rotate to Gear 3 and the sensing signal corresponding to Gear 3 continues to increase to exceed the trigger threshold, the function corresponding to Gear 3 is triggered.

In addition, in some embodiments, when the knob is powered on, the sensing values of all sensing signals may be cleared to zero.

The control method of the knob provided in the embodiment includes: in response to a sensing value of a first sensing signal being greater than a set trigger threshold, performing a corresponding operation according to the first sensing signal; wherein the first sensing signal is generated by a first fourth sensing element in response to a magnetic knob being adjusted; and turning down the sensing value of the first sensing signal, and/or turning down a sensing value of a second sensing signal of a second fourth sensing element adjacent to the first fourth sensing element. Through the above method, by turning down the sensing value of the first sensing signal, it is possible to avoid the problem of the first sensing signal triggering again after the second sense signal is triggered, causing the gear retracement. By turning down the sensing value of the second sensing signal, it is possible to avoid the problem of false triggering of the second sensing signal after the first sensing signal is triggered, which is conducive to achieving precise control of the knob.

Figure 34:
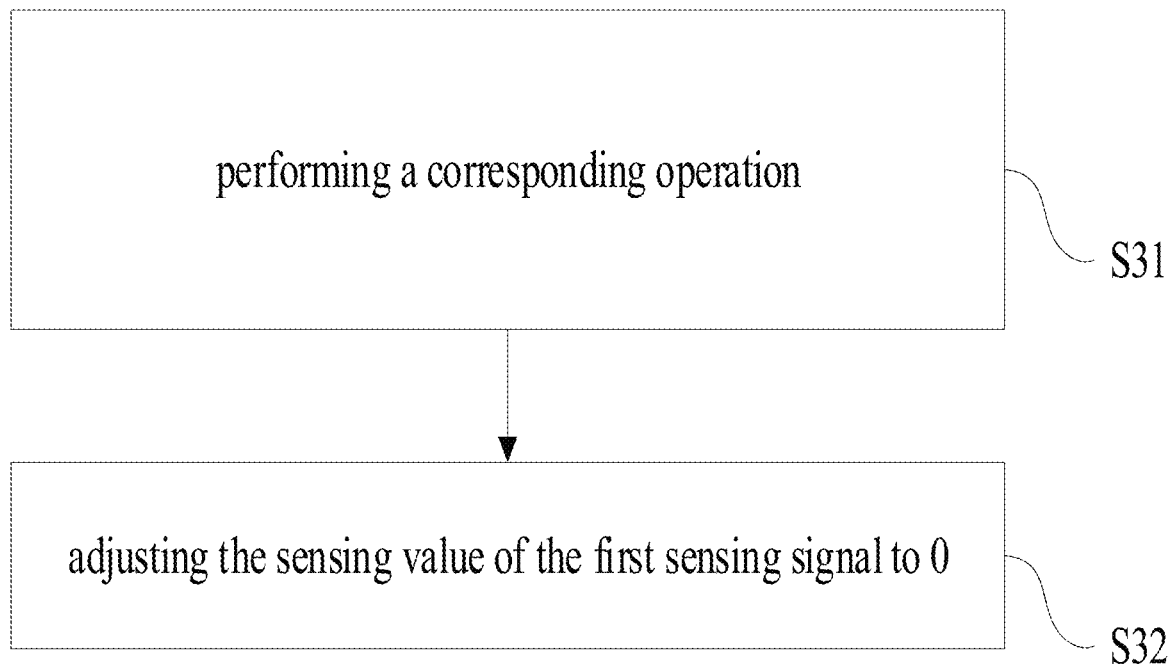
FIG. 34 is a flowchart of a method for controlling a magnetic knob according to yet another embodiment of the present disclosure.

Referring to FIG. 34, FIG. 34 is a flowchart of a method for controlling a magnetic knob according to yet another embodiment of the present disclosure. The method may include operations at blocks illustrated herein.

At block S31: in response to a sensing value of a first sensing signal being greater than a set trigger threshold, performing a corresponding operation according to the first sensing signal; wherein the first sensing signal is generated by a first fourth sensing element in response to a magnetic knob being adjusted.

At block S32: adjusting the sensing value of the first sensing signal to 0 after a set duration when the first sensing signal is triggered.

Figure 35:
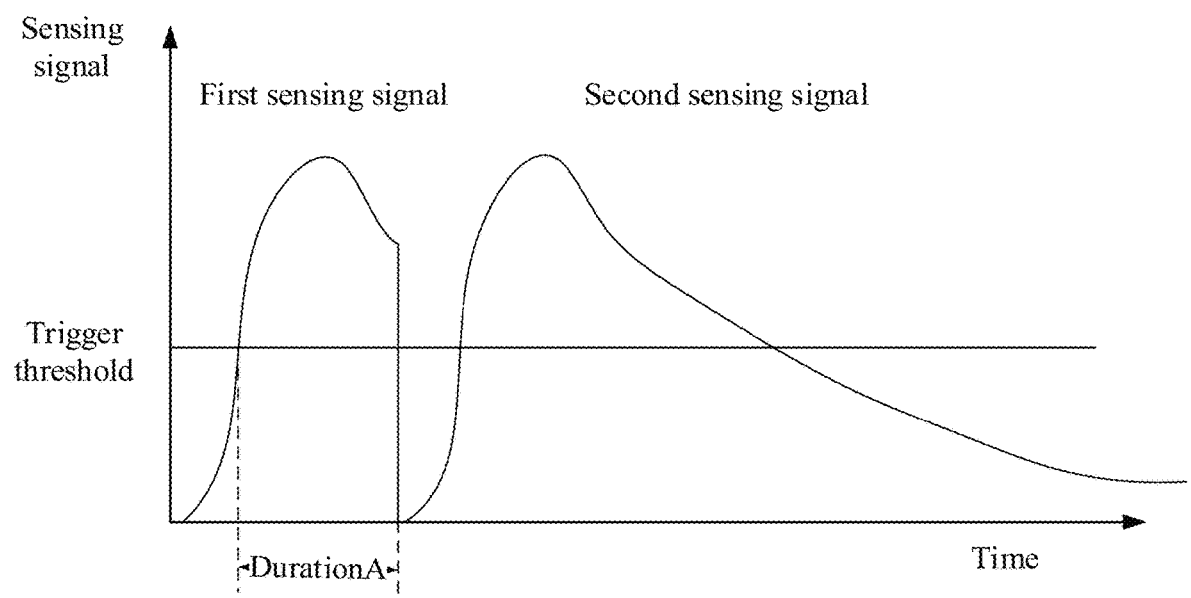
FIG. 35 is schematic view of a first sensing signal and a second sensing signal according to another embodiment of the present disclosure.
Figure 36:
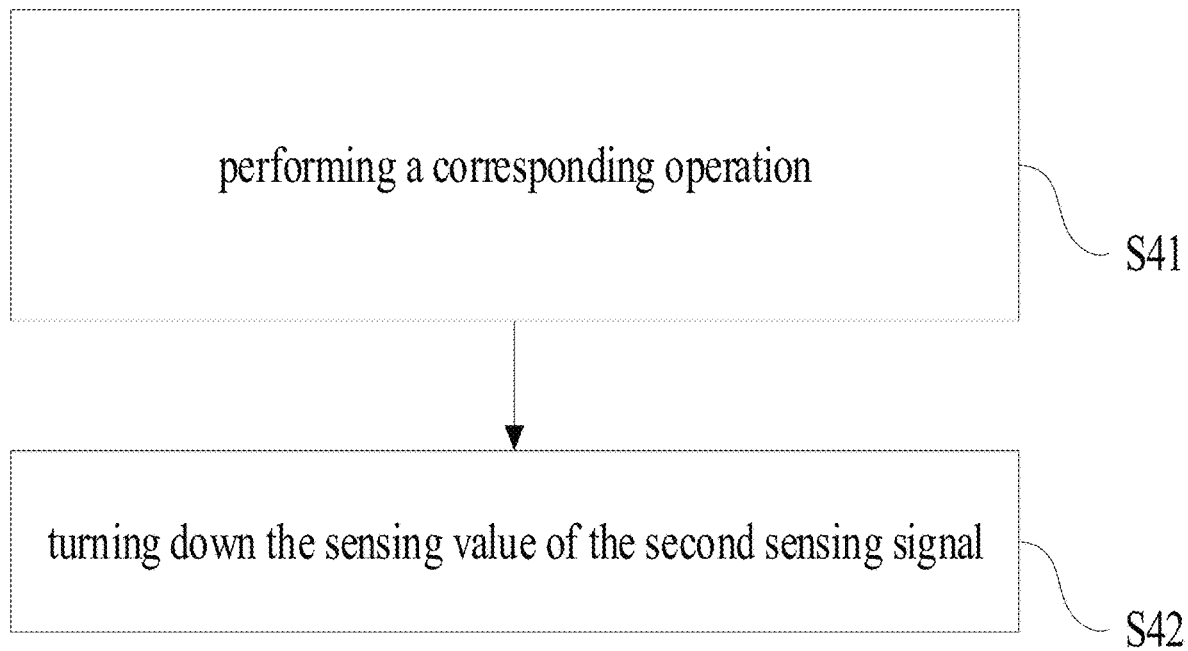
FIG. 36 is a flowchart of a method for controlling a magnetic knob according to yet another embodiment of the present disclosure.

Referring to FIG. 35, FIG. 35 is schematic view of a first sensing signal and a second sensing signal according to another embodiment of the present disclosure.

The set duration (duration A) may be set arbitrarily according to actual needs. In some embodiments, the set duration may be set to 10-1000 ms, for example, 400 ms. The time period may be set according to actual needs. When the user operates frequently, and the adjustment of the magnetic knob need to be more sensitive, the set duration may be set to 10 ms. When the user does not operate frequently, the adjustment of the magnetic knob needs to be more stable, the set duration may be set to 1000 ms.

It can be seen from FIG. 35 that the sensing value of the first sensing signal is adjusted to 0 after the set duration when the first sensing signal is triggered. That is, the first sensing signal is updated to 0 in advance. When the signal value of the second sensing signal increases and exceeds the trigger threshold, the second sensing signal will be directly triggered, while the sensing value of the first sensing signal will not be triggered when it is adjusted to 0.

Further, after the set duration when the first sensing signal is triggered, the sensing value of the first sensing signal is adjusted to zero. In this case, when the confirmation button is operated, the sensing value of the first sensing signal will not be too large, and the problem that the first sensing signal is triggered while the confirmation button cannot be triggered may be avoided.

In addition, since the sensing value of the first sensing signal is updated to 0, the sensing value of the subsequent first sensing signal will continue to decrease. In order to avoid the sensing value from being negative, when the sensing value of the first sensing signal is negative, the sensing value of the first sensing signal is adjusted to 0.

At block S41: in response to a sensing value of a first sensing signal being greater than a set trigger threshold, performing a corresponding operation according to the first sensing signal; wherein the first sensing signal is generated by a first fourth sensing element in response to the magnetic knob being adjusted.

At block S42: in response to a sensing value of a second sensing signal being greater than a set threshold, turning down the sensing value of the second sensing signal.

At block 42: in response to a sensing value of a second sensing signal being greater than a set threshold, turning down the sensing value of the second sensing signal.

In some embodiments, the sensing value of the second sensing signal may be adjusted to zero.

However, in some cases, when the sensing value of the second sensing signal is adjusted to 0, and when the second sensing element of the magnetic knob rotates to the second fourth sensing element, the sensing value of the second fourth sensing element increases but cannot reach the trigger threshold, and the second sensing signal therefore cannot be triggered. Therefore, in other embodiments, the sensing value of the second sensing signal may be turned down according to a set rule.

Figure 37:
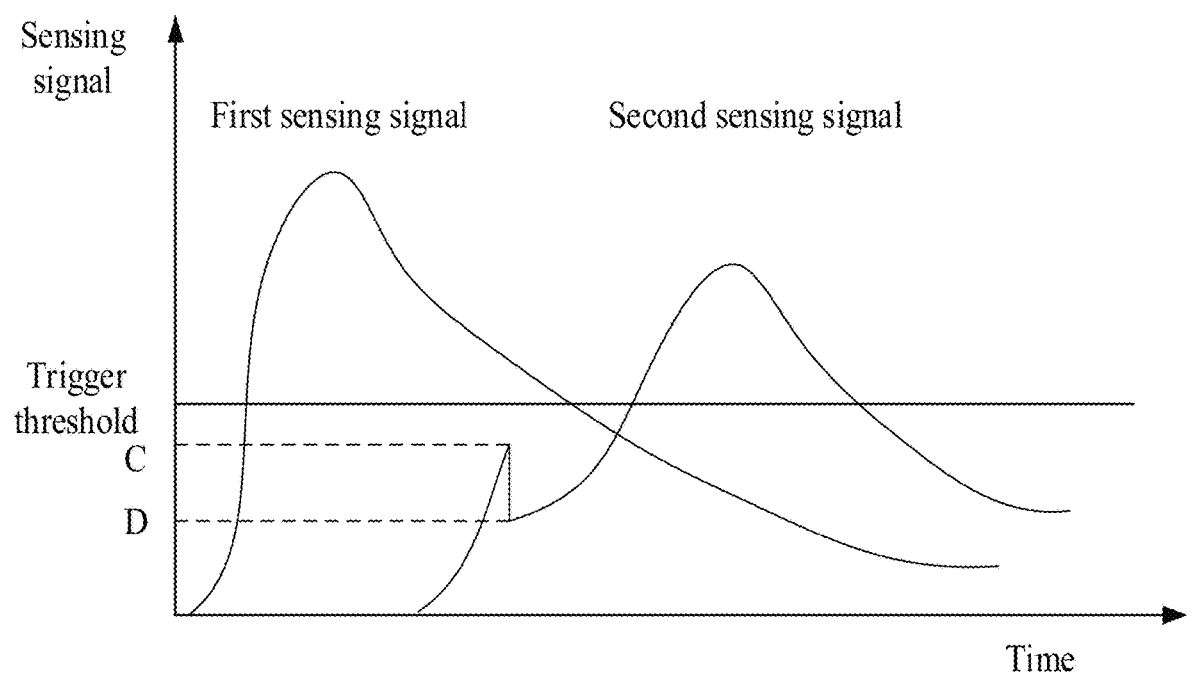
FIG. 37 is schematic view of a first sensing signal and a second sensing signal according to yet another embodiment of the present disclosure.

As shown in FIG. 37, FIG. 37 is schematic view of a first sensing signal and a second sensing signal according to yet another embodiment of the present disclosure.

In some embodiments, when the sensing value of the second sensing signal is greater than a first ratio of the trigger threshold, the sensing value of the second sensing signal is turned down to a second ratio of the trigger threshold. The first ratio and the second ratio are each less than 1, and the first ratio is greater than the second ratio.

For example, when the sensing value of the second sensing signal is greater than 70% of the trigger threshold, the sensing value of the second sensing signal is turned down to 50% of the trigger threshold.

It can be seen from FIG. 37 that when the sensing value of the second sensing signal reaches C (the first ratio of the trigger threshold), the sensing value of the second sensing signal is turned down to D (the second ratio of the trigger threshold), such that the increase of the second sensing signal may be slowed down, avoiding the problem that when the first sensing signal is triggered, the sensing value of the second sensing signal is greater than the trigger threshold at the same time, the problem causing the second sensing signal to be falsely triggered.

Figure 38:
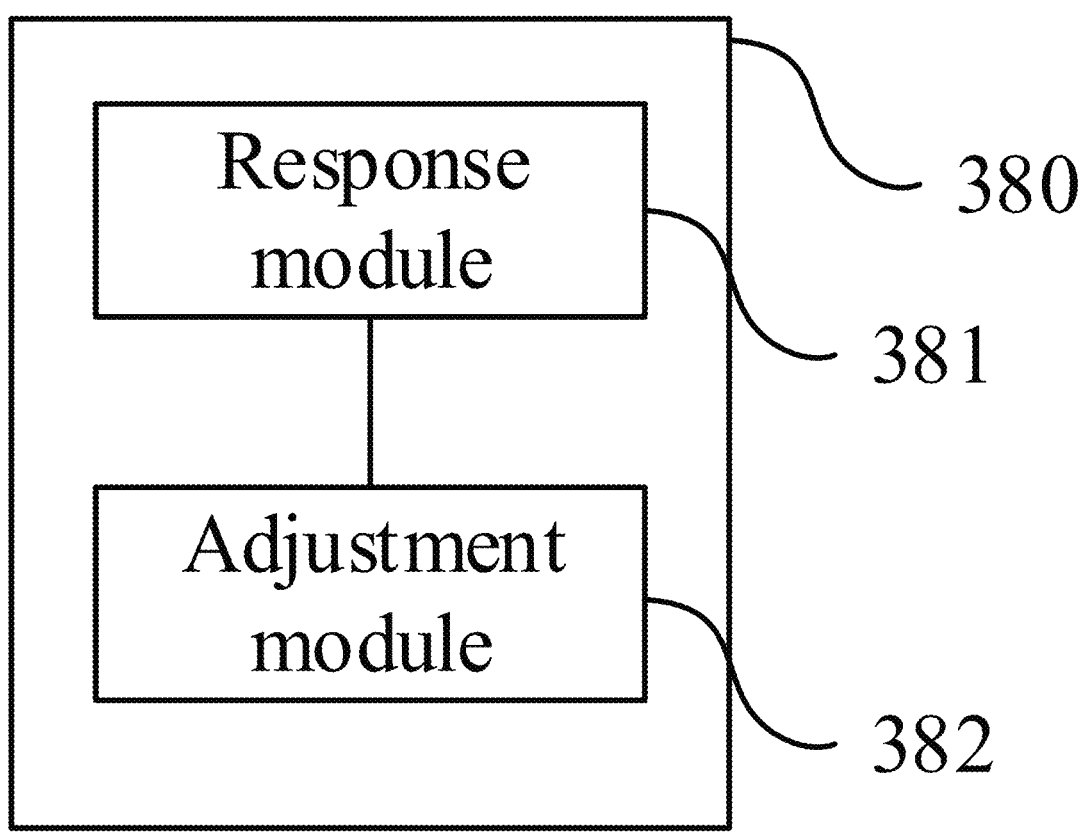
FIG. 38 is a schematic structural diagram of a cooking device according to another embodiment of the present disclosure.

Referring to FIG. 38, FIG. 38 is a schematic structural diagram of a cooking device according to another embodiment of the present disclosure. A cooking device 380 includes a response module 381 and an adjustment module 382.

The response module 381 is configured to, in response to a sensing value of a first sensing signal being greater than a set trigger threshold, perform a corresponding operation according to the first sensing signal; wherein the first sensing signal is generated by a first fourth sensing element in response to a magnetic knob being adjusted. The adjustment module 382 is configured to, after the first sensing signal is triggered, turn down the sensing value of the first sensing signal, and/or turn down a sensing value of a second sensing signal of a second fourth sensing element adjacent to the first fourth sensing element.

Further referring to FIGS. 1 to 2, the knob 100 includes a first assembly 11, an attachment element 14, a first insulation ring 131, a conductive ring 122, and a second insulation ring 132. The first assembly 11 and the attachment element 14 are arranged in the conductive ring 122, and the first assembly 11 and the attachment element 14 are connected.

In some embodiments, the first assembly 11 may include a button top surface 112 and a first sensing element 111. The button top surface 112 is configured for user touch, and the first sensing element 111 is configured for connecting a device panel. In some embodiments, the first sensing element 111 has a hollow structure, and the attachment element 14 is disposed in the hollow structure of the first sensing element 111. In other embodiments, the first assembly 11 may be a press-type control button, which uses a pressing mechanism such as a spring to realize elastic pressing.

Further, the first insulation ring 131 is disposed between the first assembly 11 and the conductive ring 122, for isolating the first assembly 11 and the conductive ring 122. Specifically, the first insulation ring 131 is disposed between the button top surface 112 and the conductive ring 122. The second insulation ring 132 is disposed between the first assembly 11 and the conductive ring 122, for isolating the first assembly 11 and the conductive ring 122. Specifically, the second insulation ring 132 is disposed between the first sensing element 111 and the conductive ring 122. In actual operation, there is no electrical connection between the conductive ring 122 and the first assembly 11.

Further, the conductive ring 122 is arranged with a second sensing element 121 extending inward (or outward). When the conductive ring 122 rotates, a preset function, such as adjustment of gear, may be realized. The attachment element 14 attracts each other with a magnet 92 under a device panel to realize the fixation of the magnetic knob 100.

Referring to FIG. 3 again, the control panel 900 includes a third sensing element 911, a plurality of fourth sensing elements 912 and a magnet 92. The magnet 92 and the attachment element 14 of the magnetic knob 100 attract each other to realize the fixation of the magnetic knob 100.

The third sensing element 911 is configured for sensing the manipulation of the first assembly 11 and generating a third sensing signal. The plurality of fourth sensing elements 912 are configured for sensing the rotation operation of the conductive ring 122, and one of the plurality of fourth sensing elements 912 is configured for sensing the conductive ring 122 to generate a fourth sense signal.

In the embodiments, the first assembly 11 may implement functions such as confirmation, power-on, power-off, pause, etc. and different corresponding functions through operations such as long press and double-click. The conductive ring 122 may realize multiple functions or adjustment of multiple gears through rotation.

As illustrated in FIG. 3, taking the number of the fourth sensing elements 912 being eight as an example, the eight fourth sensing elements 912 may be divided corresponding to 1-8 gears. When a sensing element 912 corresponding to Gear 1 senses the second sensing element 121, the sensing signal corresponding to Gear 1 is generated, a controller may realize the adjustment of different gears according to the sensing signal sent by the fourth sensing element 912 of different gears.

Since the first assembly 11, the conductive ring 122, and an insulating material between the two constitute a capacitor, when the hand only touches the fourth sensing element 912 selected through the conductive ring 122, the first assembly 11 will also have a certain amount of sensing, which may cause the first assembly 11 to trigger the confirmation function due to parasitic capacitance sensing when only the fourth sensing element 912 selected through the conductive ring 122 is touched. The present disclosure provides some implementations to solve the problem.

Figure 39:
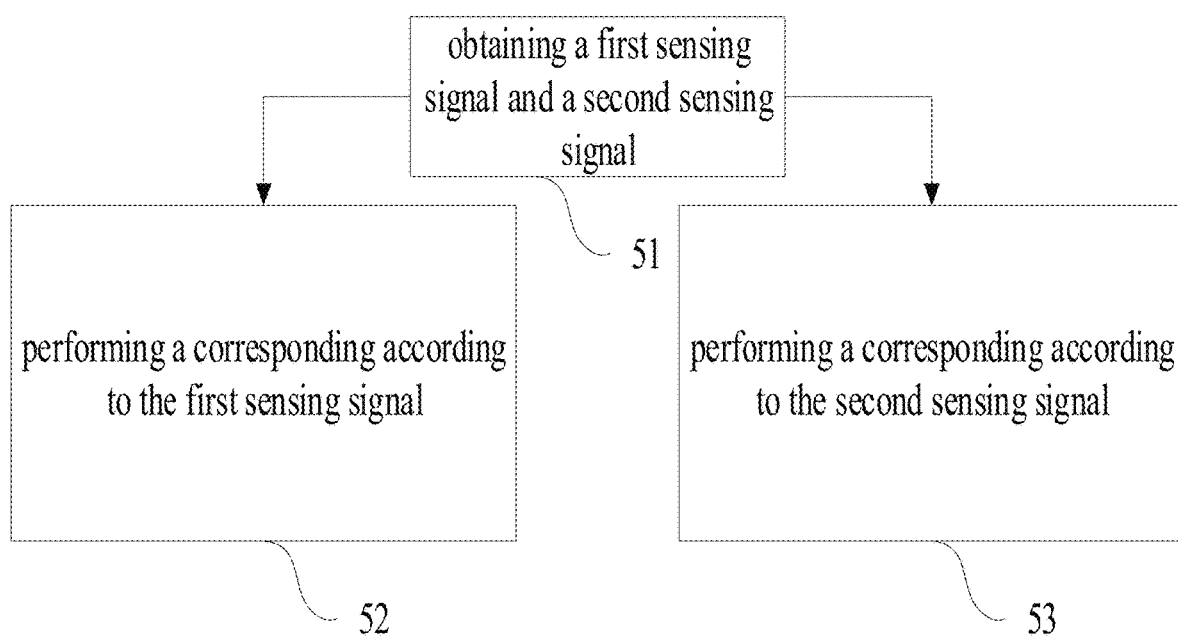
FIG. 39 is a flowchart of a method for controlling a magnetic knob according to yet another embodiment of the present disclosure.

Referring to FIG. 39, FIG. 39 is a flowchart of a method for controlling a magnetic knob according to yet another embodiment of the present disclosure. The method may include operations at blocks illustrated herein.

At block 51: obtaining a third sensing signal and a fourth sensing signal; wherein the third sensing signal is generated by a third sensing element sensing a manipulation of a first assembly, and the fourth sensing signal is generated by any one of a plurality of fourth sensing elements sensing a manipulation of a conductive ring.

It is understandable that there is a certain capacitance between the first assembly and the third sensing element. When the finger (or other parts of the human body) touches the first assembly, the capacitance between the first assembly and the third sensing element changes, thus generating a third sensing signal. In some embodiments, the magnitude of the sensing value of the third sensing signal may be proportional to the amount of change in the capacitance between the first assembly and the third sensing element.

Further, different functions may be realized according to the difference of the sensing value of the third sensing signal and the duration of the sensing signal, such as heavy press, light press, long press, double tap, etc.

Referring to FIGS. 2 and 3, the second sensing element corresponds to different fourth sensing elements along with the knob of the conductive ring, and the different fourth sensing elements correspond to different functions or adjustment gears. When a target sensing element generates a sensing signal, the function corresponding to the target sensing element is triggered and realized. Understandably, when the second sensing element corresponds to the target sensing element, other sensing elements adjacent to the target sensing element will also have small sensing values. In some embodiments, the sensing signal with the largest sensing value among the plurality of fourth sensing elements can trigger the corresponding function. In other embodiments, a trigger threshold may be set. When the sensing value of the sensing signal is greater than the trigger threshold, the corresponding function is triggered.

At block 52: in response to a sensing value of the third sensing signal being greater than a sensing value of the fourth sensing signal, performing a corresponding operation according to the third sensing signal.

At block 53: in response to the sensing value of the fourth sensing signal being greater than the sensing value of the third sensing signal, performing a corresponding operation according to the fourth sensing signal.

Understandably, when the sensing value of the third sensing signal is greater than the fourth sensing signal, it can be considered that the third sensing signal is generated by the user touching the first assembly, and the fourth sensing signal is generated by the first assembly and the conductive ring. Therefore, only the third sensing signal is triggered, and the corresponding operation is performed.

Similarly, when the sensing value of the fourth sensing signal is greater than the third sensing signal, it can be considered that the fourth sensing signal is generated by the user operating the conductive ring, and the third sensing signal is generated between the first assembly and the conductive ring. Therefore, only the fourth sensing signal is triggered, and the corresponding operation is performed.

Different from the existing technologies, by comparing the sensing signal with the trigger threshold, when the sensing signal is greater than the trigger threshold, the corresponding function is triggered, which may cause the first assembly and the conductive ring to trigger at the same time, causing mis-operation. In the embodiments, the sensing signals corresponding to the first assembly and the conductive ring are compared, and only the sensing signal with the larger sensing value is triggered, thereby avoiding the possibility of two keys being triggered at the same time, which is beneficial to realize precise control of the magnetic knob.

Figure 40:
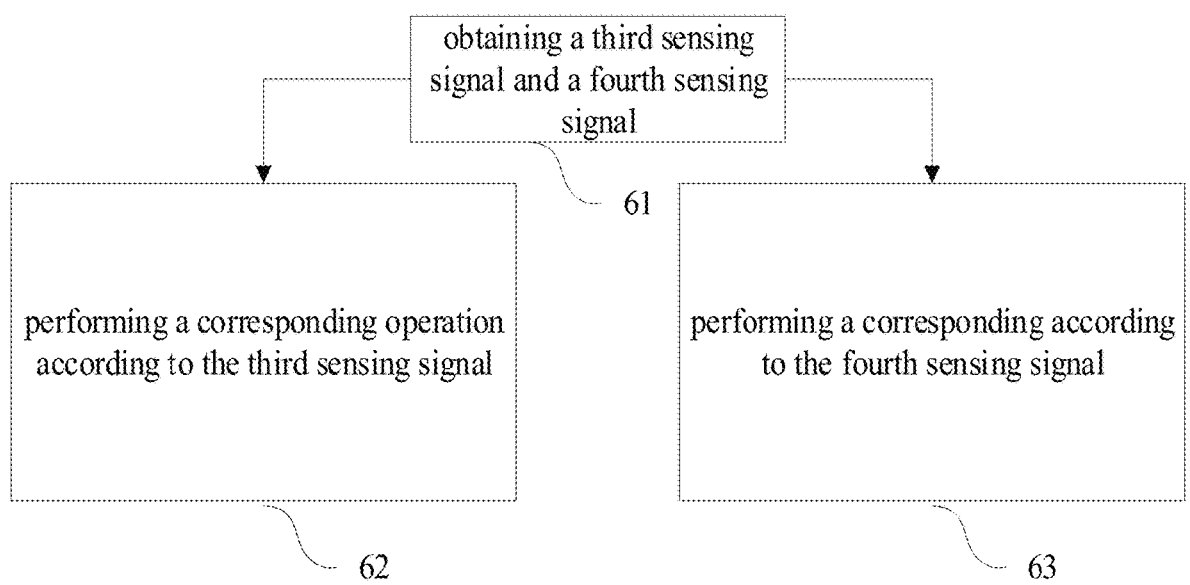
FIG. 40 is a flowchart of a method for controlling a magnetic knob according to yet another embodiment of the present disclosure.

Referring to FIG. 40, FIG. 40 is a flowchart of a method for controlling a magnetic knob according to yet another embodiment of the present disclosure. The method may include operations at blocks illustrated herein.

At block 61: obtaining a third sensing signal and a fourth sensing signal; wherein the third sensing signal is generated by a third sensing element sensing a manipulation of a first assembly, and the fourth sensing signal is generated by any one of a plurality of fourth sensing elements sensing a manipulation of a conductive ring.

At block 62: in response to a sensing value of the third sensing signal being greater than a sensing value of the fourth sensing signal and being greater than a first set threshold, performing a corresponding operation according to the third sensing signal.

At block 63: in response to the sensing value of the fourth sensing signal being greater than the sensing value of the third sensing signal and being greater than a second set threshold, performing a corresponding operation according to the fourth sensing signal.

In some embodiments, the first set threshold and the second set threshold may be preset. For example, when only the first assembly is touched, a current sensing signal corresponding to the first assembly is obtained, and the first set threshold is determined according to the sensing signal.

For example, a minimum sensing value is 0, when only the first assembly is touched, the sensing value of the current sensing signal corresponding to the first assembly is A, and the first set threshold S1 may be determined. The first set threshold S1 is a value less than A and close to A, for example, S1=A*80%.

Of course, in other embodiments, the first set threshold may be a range, for example, A*80%–A*120%. When the sensing value of the third sensing signal is within the range of A*80%–A*120%, the corresponding operation is performed according to the third sensing signal.

The setting manner of the second set threshold is similar to the setting manner of the first set threshold and will not be repeated herein.

Figure 41:
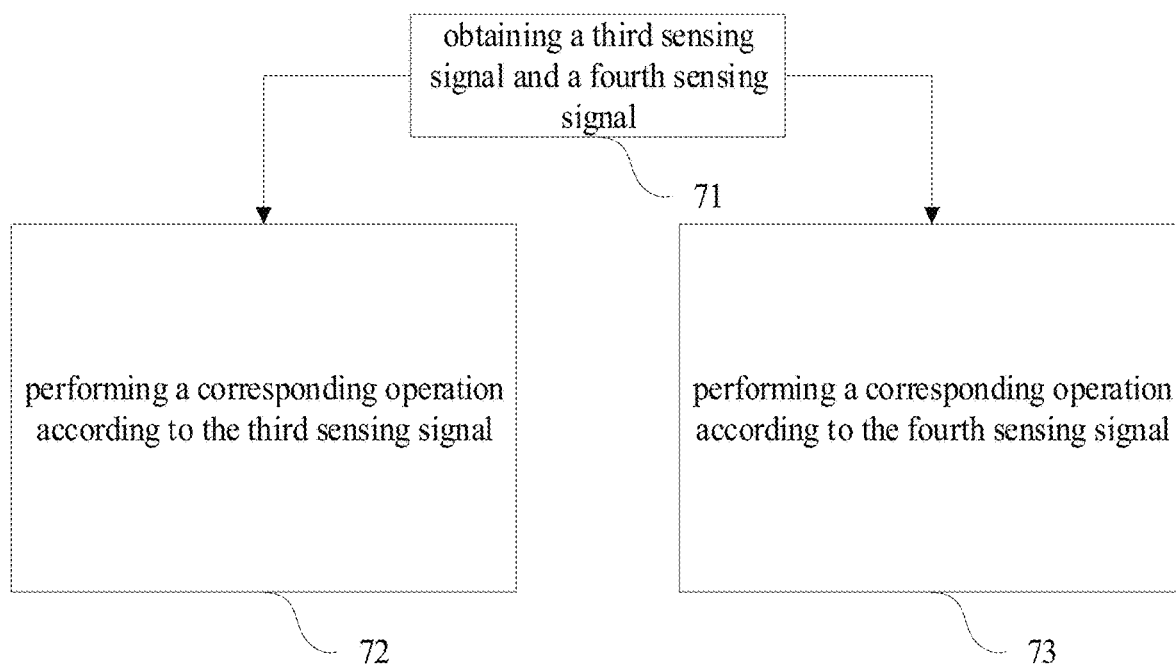
FIG. 41 is a flowchart of a method for controlling a magnetic knob according to yet another embodiment of the present disclosure.

Referring to FIG. 41, FIG. 41 is a flowchart of a method for controlling a magnetic knob according to yet another embodiment of the present disclosure. The method may include operations at blocks illustrated herein.

At block 71: obtaining a third sensing signal and a fourth sensing signal; wherein the third sensing signal is generated by a third sensing element sensing a manipulation of a first assembly, and the fourth sensing signal is generated by any one of a plurality of fourth sensing elements sensing a manipulation of a conductive ring.

At block 72: in response to a sensing value of the third sensing signal being greater than a sensing value of the fourth sensing signal and being greater than a first set threshold, and the sensing value of the fourth sensing signal being less than a third set threshold, performing a corresponding operation according to the third sensing signal.

At block 73: in response to the sensing value of the fourth sensing signal being greater than the sensing value of the third sensing signal and being greater than a second set threshold, and the sensing value of the third sensing signal being less than a fourth set threshold, performing a corresponding operation according to the fourth sensing signal.

In some embodiments, the first set threshold, the second set threshold, the third set threshold, and the fourth set threshold may be preset. For example, when only the first assembly is touched, a current sensing signal corresponding to the first assembly is obtained, and the first set threshold is determined according to the sensing signal. A sensing signal corresponding to the current conductive ring is obtained, and the third set threshold is determined based on the sensing signal.

For example, a minimum sensing value is 0, when only the first assembly is touched, the sensing value of the current sensing signal corresponding to the first assembly is A, and the sensing value of the current sensing signal corresponding to the conductive ring is B, then it may be determined that the first set threshold is S1 and the third set threshold is S3. The first set threshold S1 is a value less than A and close to A, for example, S1=A*80%. The third set threshold S3 is a value greater than B and close to B, for example, S3=B*120%.

Of course, in other embodiments, the first set threshold may be a range, such as A*80%–A*120%, and the second set threshold may also be a range, such as B*80%–B*120%. When the sensing value of the third sensing signal is within the range of A*80%–A*120%, and the sensing value of the fourth sensing signal is within the range of B*80%–B*120%, the corresponding operation is performed according to the third sensing signal.

The setting manners of the second set threshold and the fourth set threshold are similar to the setting manners of the first set threshold and the third set threshold and will not be repeated herein.

Figure 42:
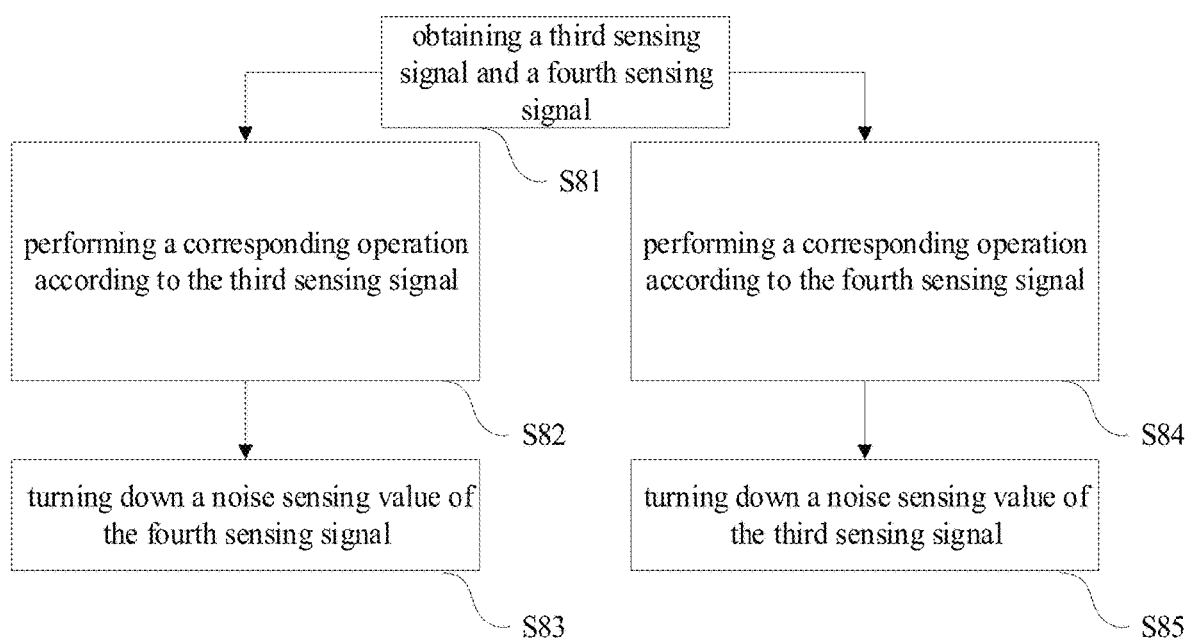
FIG. 42 is a flowchart of a method for controlling a magnetic knob according to yet another embodiment of the present disclosure.

Referring to FIG. 42, FIG. 42 is a flowchart of a method for controlling a magnetic knob according to yet another embodiment of the present disclosure. The method may include operations at blocks illustrated herein.

At block S81: obtaining a third sensing signal and a fourth sensing signal; wherein the third sensing signal is generated by a third sensing element sensing a manipulation of a first assembly, and the fourth sensing signal is generated by any one of a plurality of fourth sensing elements sensing a manipulation of a conductive ring.

After the operation S81, operation S82 or operation S84 is executed.

At block S82: in response to a sensing value of the third sensing signal being greater than a sensing value of the fourth sensing signal, performing a corresponding operation according to the third sensing signal.

At block S83: turning down a noise sensing value of the fourth sensing signal.

Understandably, when it is confirmed that the third sensing signal is triggered in operation 82, it may be considered that the sensing value of the fourth sensing signal is noise. In the existing technologies, the sensing value of the fourth sensing signal will be determined as noise sensing value. When it is the conductive ring that is required to be triggered, the sensing value of the real-time fourth sensing signal will be subtracted by the noise sensing value. Therefore, when the noise sensing value is too large, the sensing value of the fourth sensing signal after being subtracted by the noise sensing value is less and difficult to trigger.

Therefore, in the embodiments, turning down the noise sensing value of the fourth sensing signal may enable the conductive ring to be triggered normally when the conductive ring is actually used.

In some embodiments, the noise sensing value of the fourth sensing signal is turned down by ¼ to ½.

At block S84: in response to the sensing value of the fourth sensing signal being greater than the sensing value of the third sensing signal, performing a corresponding operation according to the fourth sensing signal.

At block S85: turning down a noise sensing value of the third sensing signal.

Understandably, when it is confirmed that the fourth sensing signal is triggered in operation 84, it may be considered that the sensing value of the third sensing signal is noise. In the existing technologies, the sensing value of the third sensing signal at this time will be determined as noise sensing value. When it is the first assembly that is required to be triggered, the sensing value of the real-time third sensing signal will be subtracted by the noise sensing value. Therefore, when the noise sensing value is too large, the sensing value of the third sensing signal after being subtracted by the noise sensing value is less and difficult to trigger.

Therefore, in this embodiment, turning down the noise sensing value of the third sensing signal may enable the first assembly to be triggered normally when the first assembly is actually used.

In some embodiments, the noise sensing value of the third sensing signal is turned down by ¼ to ½.

Figure 43:
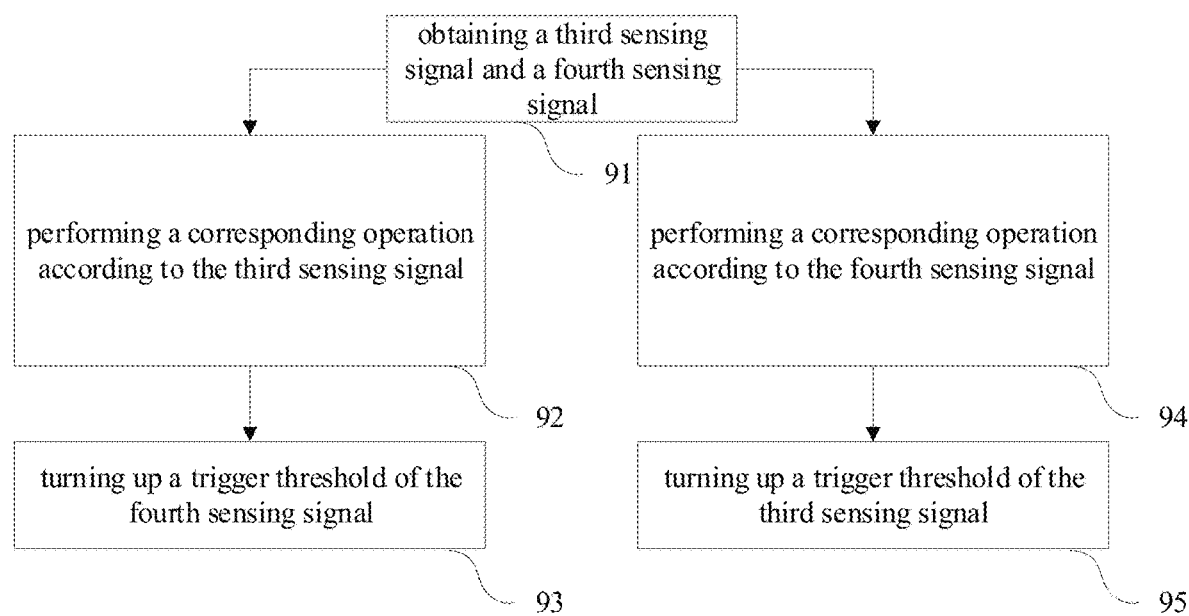
FIG. 43 is a flowchart of a method for controlling a magnetic knob according to yet another embodiment of the present disclosure.

Referring to FIG. 43, FIG. 43 is a flowchart of a method for controlling a magnetic knob according to yet another embodiment of the present disclosure. The method may include operations at blocks illustrated herein.

At block 91: obtaining a third sensing signal and a fourth sensing signal; wherein the third sensing signal is generated by a third sensing element sensing a manipulation of a first assembly, and the fourth sensing signal is generated by any one of a plurality of fourth sensing elements sensing a manipulation of a conductive ring.

After the operation 91, operation 92 or operation 94 is executed.

At block 92: in response to a sensing value of the third sensing signal being greater than a sensing value of the fourth sensing signal, performing a corresponding operation according to the third sensing signal.

At block 93: turning up a trigger threshold of the fourth sensing signal.

Understandably, when it is confirmed that the third sensing signal is triggered in operation 92, the fourth sensing signal may still be triggered. Therefore, the trigger threshold of the fourth sensing signal may be turned up to increase the difficulty of triggering the fourth sensing signal. Specifically, the trigger threshold of the fourth sensing signal may be turned up according to the amount of change in the noise sensing value of the fourth sensing signal. For example, the noise sensing value of the fourth sensing signal is C, and the trigger threshold of the fourth sensing signal may be turned up by C*20%–C*30%.

At block 94: in response to the sensing value of the fourth sensing signal being greater than the sensing value of the third sensing signal, performing a corresponding operation according to the fourth sensing signal.

At block 95: turning up a trigger threshold of the third sensing signal.

Understandably, when it is confirmed that the fourth sensing signal is triggered in operation 94, the third sensing signal may still be triggered. Therefore, the trigger threshold of the third sensing signal may be turned up to increase the difficulty of triggering the third sensing signal. Specifically, the trigger threshold of the third sensing signal may be turned up according to the amount of change in the noise sensing value of the third sensing signal. For example, the noise sensing value of the third sensing signal is D, and the trigger threshold of the third sensing signal may be turned up by D*20%–D*30%.

Figure 44:
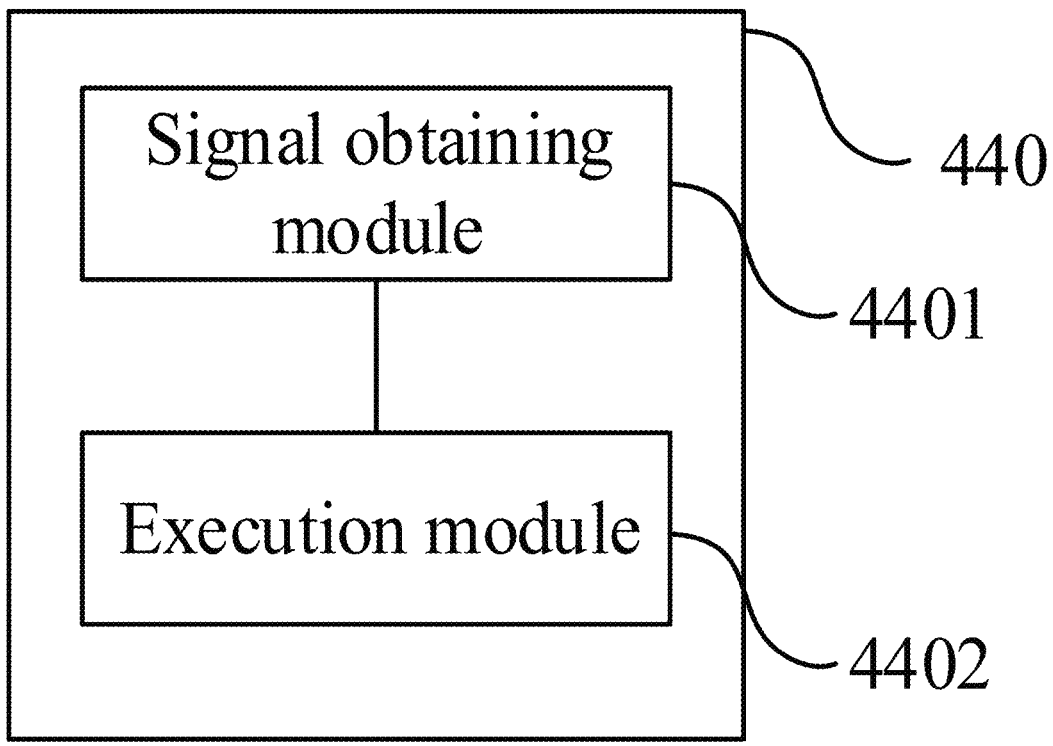
FIG. 44 is a schematic structural diagram of a cooking device according to yet another embodiment of the present disclosure.

Referring to FIG. 44, FIG. 44 is a schematic structural diagram of a cooking device according to yet another embodiment of the present disclosure. A cooking device 440 includes a signal obtaining module 4401 and an execution module 4402.

The signal obtaining module 4401 is configured to obtain a third sensing signal and a fourth sensing signal; wherein the third sensing signal is generated by a third sensing element sensing a manipulation of a first assembly, and the fourth sensing signal is generated by any one of a plurality of fourth sensing elements sensing a manipulation of a conductive ring.

The execution module 4402 is configured to, in response to a sensing value of the third sensing signal being greater than a sensing value of the fourth sensing signal, perform a corresponding operation according to the third sensing signal; or, in response to the sensing value of the fourth sensing signal being greater than the sensing value of the third sensing signal, perform a corresponding operation according to the fourth sensing signal.

Figure 45:
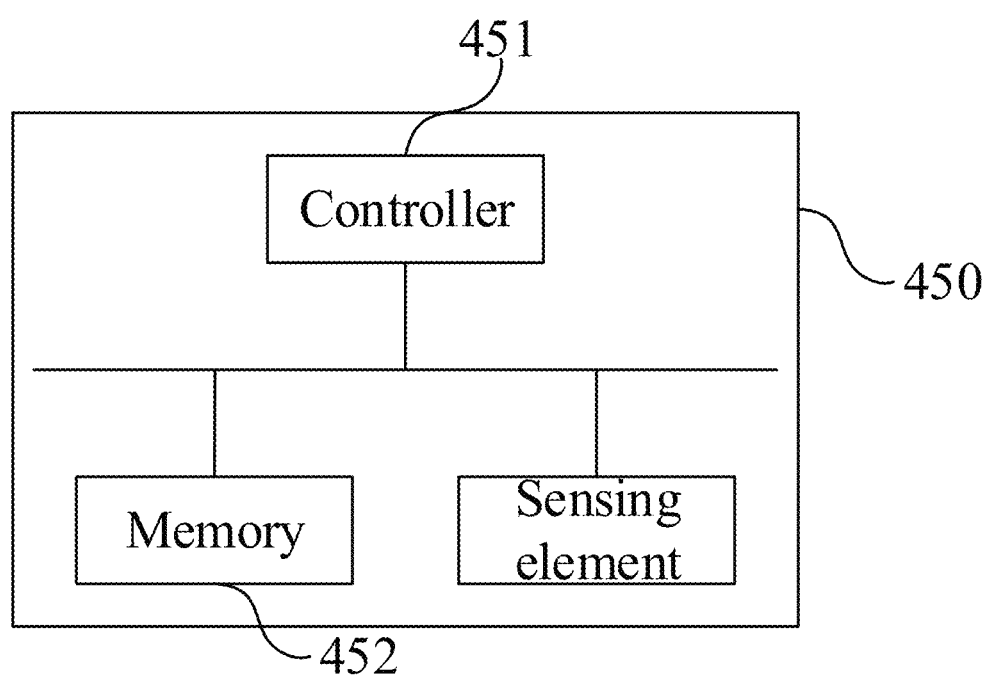
FIG. 45 is a schematic structural diagram of a cooking device according to yet another embodiment of the present disclosure.

Referring to FIG. 45, FIG. 45 is a schematic structural diagram of a cooking device according to yet another embodiment of the present disclosure. A cooking device 450 includes a control panel which, when attractively connected to an external magnetic knob, allows the cooking device 450 to be controlled by the magnetic knob.

The cooking device 450 includes a controller 451 and a memory 452. The controller 451 is connected to a third sensing element and a plurality of fourth sensing elements among sensing elements, and the memory 452 stores program data. The controller 451 is configured to execute the program data to realize the control method of the magnetic knob described above.

The cooking device 450 may be an electric rice cooker, an induction cooker, a food breaker, a microwave oven, a washing machine, etc., which will not be listed herein.

Figure 46:
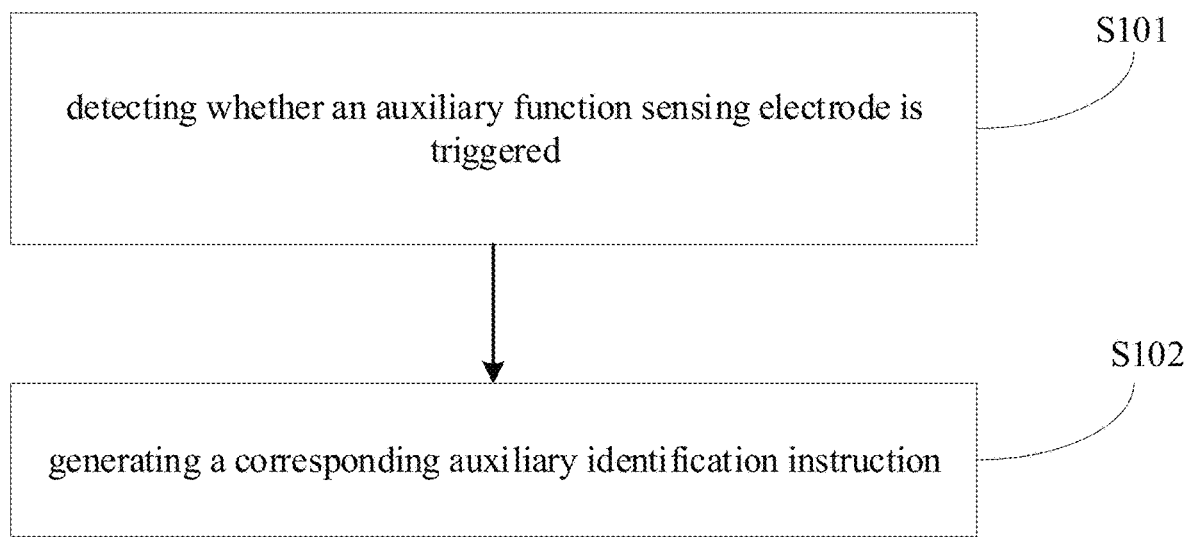
FIG. 46 is a flowchart of an identification method for detecting manipulation of a magnetic control knob according to an embodiment of the present disclosure.

Referring to FIG. 46, FIG. 46 is a flowchart of an identification method for detecting manipulation of a magnetic control knob according to an embodiment of the present disclosure. The execution subject of the identification method for detecting the manipulation of the magnetic control knob in the present disclosure is a magnetic touch panel.

Figure 47:
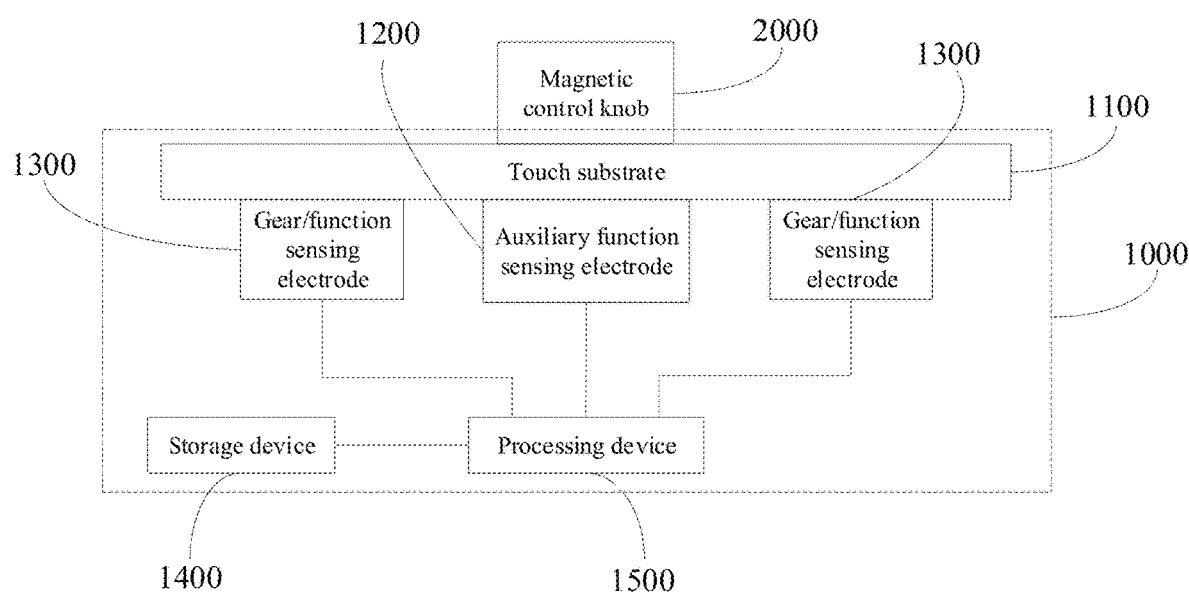
FIG. 47 is a schematic view of a structure when a magnetic touch panel and a magnetic control knob according to an embodiment of the present disclosure.

Referring to FIG. 47, a magnetic touch panel 1000 includes a touch substrate 1100, an auxiliary function sensing electrode 1200, a plurality of gear/function sensing electrodes 1300, a storage device 1400, and a processing device 1500. The auxiliary function sensing electrode 1200 and the gear/function sensing electrodes 1300 are arranged at a same side of the touch substrate 1100, and a side of the touch substrate 1100 not arranged with the auxiliary function sensing electrode 1200 and the gear/function sensing electrodes 1300 is configured for placing a magnetic control knob 2000. The magnetic touch panel 1000 is also the control panel in the above embodiments, the auxiliary function sensing electrode 1200 is also the third sensing element in the above embodiments, and the gear/function sensing electrode 1300 is also the fourth sensing element 912 in the above embodiments.

The magnetic control knob 100 is attached to the touch substrate 1100 by magnetic attraction. Such an arrangement can realize related control by the magnetic control knob 2000 without slotting on the touch substrate 1100, which is aesthetically pleasing, practical and waterproof. When accumulated oil stains are required to be cleaned, the magnetic control knob 100 may be directly removed from the touch substrate 1100, which can maintain the beauty to the greatest extent and bring a better user experience to the user.

Figure 48:
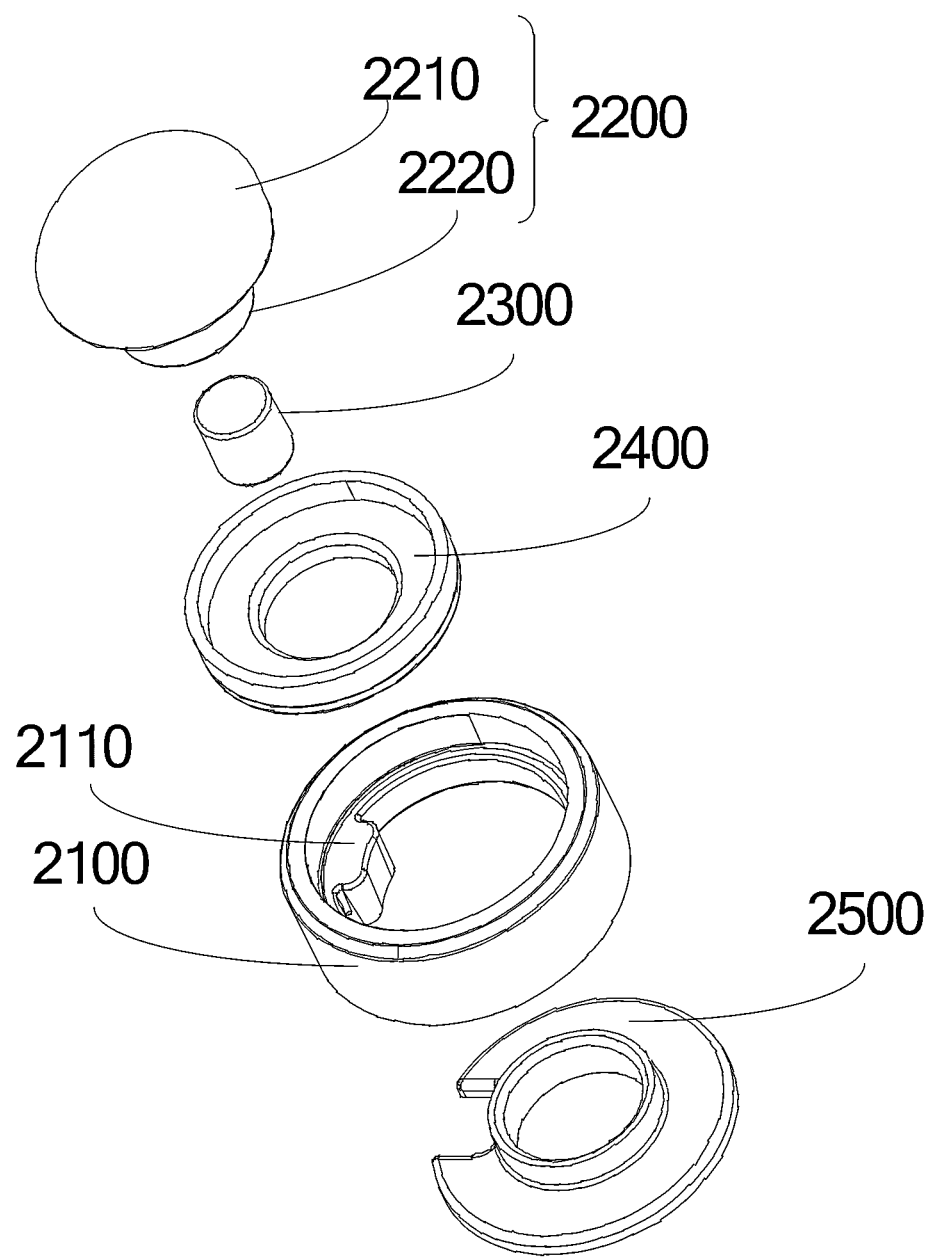
FIG. 48 is an exploded schematic structural diagram of a magnetic control knob in FIG. 2.

Referring to FIG. 48, the magnetic control knob 2000 includes an auxiliary key 2100 and a gear/function selection sensing block 2210. The materials of the auxiliary key 2100 and the gear/function selection sensing block 2210 are conductive materials (such as metal material). The auxiliary key 2100 faces the auxiliary function sensing electrode 1200, and the gear/function selection sensing block 2210 faces the gear/function sensing electrodes 1300. The auxiliary key 2100 is also the first assembly in the above embodiments, and the gear/function selection sensing block 2210 is the second sensing element in the above embodiments.

Specifically, the auxiliary function sensing electrode 1200 and the gear/function sensing electrodes 1300 in the magnetic touch panel 1000 are respectively configured to sense manipulations on the auxiliary key 2100 and the gear/function selection sensing block 2210 in the magnetic control knob 2000, to generate corresponding sensing values. In addition, the multiple gear/function sensing electrodes 1300 correspond to different gears or different execution functions. When the user manipulates the magnetic control knob 2000 to change the position of the gear/function selection sensing block 2210, the capacitance between the gear/function selection sensing block 2210 and the multiple gear/function sensing electrodes 1300 changes. One of the multiple gear/function sensing electrodes 1300 is selected to realize the selection of function or gear. That is, the magnetic control knob 2000100 in the present disclosure is a capacitive sensing magnetic control knob.

The storage device 1400 stores a program. The processing device 1500 is connected to the storage device 1400, the auxiliary function sensing electrode 1200, and the plurality of gear/function sensing electrodes 1300 to retrieve the program stored in the storage device 1400 for executing an identification method for detecting manipulation of the magnetic control knob.

Further to referring to FIG. 46, the identification method includes operations at blocks illustrated herein.

At block S101: detecting whether an auxiliary function sensing electrode is triggered; wherein the auxiliary function sensing electrode is disposed under a touch substrate and configured to sense a manipulation on an auxiliary key in the magnetic control knob to generate a corresponding sensing value.

At block S102: in response to determining that the auxiliary function sensing electrode is triggered, generating a corresponding auxiliary identification instruction.

Specifically, when the user touches the auxiliary key, the capacitance value between the auxiliary key and the auxiliary function sensing electrode changes. At this time, the auxiliary function sensing electrode generates a corresponding sensing value. The auxiliary function sensing electrode is then triggered, such that the magnetic touch panel generates the corresponding auxiliary identification instruction, enabling the magnetic control knob to have an auxiliary identification function.

In an application scenario, after the user selects the gear/function sensing electrode by manipulating the magnetic control knob, the user will also confirm by operating the auxiliary key. Only after the user confirms, the magnetic touch panel executes the selection of corresponding gear/function. That is, the auxiliary key is the confirmation button in this case, and the user confirms by manipulating the auxiliary key. Specifically, when the user manipulates the auxiliary key, the auxiliary function sensing electrode is triggered, and a corresponding confirmation identification instruction is generated.

In another application scenario, the user can also perform operations such as cancel and pause by manipulating the auxiliary key. For example, when the device is running, the user can pause the work of the device by manipulating the auxiliary key; or after the user performs a selection of gear or function, the user may cancel the previous gear or function selection by manipulating the auxiliary key.

For ease of description, the following takes the user to manipulate the auxiliary key 0 for confirmation as an example for description.

In some embodiments, the gear/function selection sensing block protrudes from an inner wall of the gear/function selection sensing block. The gear/function selection sensing block is made of conductive material (such as metal material). The magnetic control knob further includes a first magnetic attraction element, a first insulation ring, and a second insulation ring. The first magnetic attraction element is also the magnetic attraction element in the above embodiments.

The auxiliary key includes a button top surface and a first sensing element protruding on the button top surface. The button top surface is configured to contact the user's hand. The first sensing element passes through the first insulation ring, the conductive ring, and the second insulation ring subsequently to be in contact with the touch substrate. Specifically, an end surface of the first sensing element away from the button top surface is in contact with the touch substrate. The first sensing element has a hollow structure and includes a groove (not shown), and the first magnetic attraction element is received in the groove. The first magnetic attraction element and a magnet in the magnetic touch panel are attracted to each other such that the magnetic control knob is attached to the touch substrate. The first insulation ring and the second insulation ring are configured to isolating the conductive ring and auxiliary key. The first magnetic part in the magnetic control knob may be a magnet or a metal member that can be attracted by a magnet.

In the magnetic control knob of FIG. 48, the user changes the state of the gear/function selection sensing block by rotating the conductive ring, thereby selecting from the multiple gears/function sensing electrodes.

For the control knob in FIG. 3, when the user wants to select gear/function and manipulate the conductive ring, the user may touch the auxiliary key at the same time. In this case, the auxiliary function sensing electrode and the gear/function sensing electrodes all produce corresponding sensing values. Based on the principle of priority processing of gear/function sensing electrodes, if the corresponding auxiliary identification instruction is generated directly based on the auxiliary function sensing electrodes being triggered, mis-operation may occur.

Figure 49:
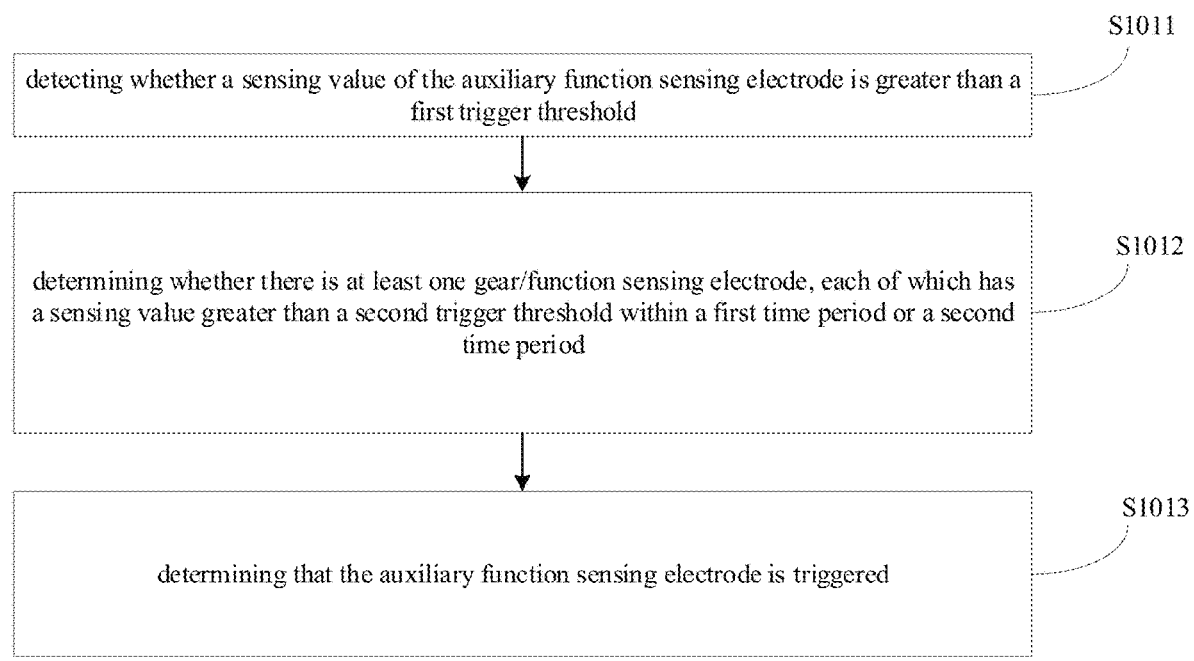
FIG. 49 is a flowchart of an operation S110 in FIG. 46.

Therefore, in order to avoid the defects, as shown in FIG. 49, the operation S101 may specifically include sub-operation at blocks illustrated herein.

At block S1011: detecting whether a sensing value of the auxiliary function sensing electrode is greater than a first trigger threshold.

At block S1012: in response to determining that the sensing value of the auxiliary function sensing electrode is greater than the first trigger threshold, determining whether there is at least one gear/function sensing electrode, each of which has a sensing value greater than a second trigger threshold within a first time period or a second time period; wherein the first time period is a time period before the sensing value of the auxiliary function sensing electrode is greater than the first trigger threshold, the second time period is a time period after the sensing value of the auxiliary function sensing electrode is greater than the first trigger threshold.

At block S1013: in response to determining that there is no gear/function sensing electrode, each of which has a sensing value greater than the second trigger threshold within both the first time period and the second time period, determining that the auxiliary function sensing electrode is triggered.

When the sensing value of the auxiliary function sensing electrode exceeds the first trigger threshold, it is indicated that the user has touched the auxiliary key. However, it is necessary to exclude the situation that the user accidentally touched the auxiliary key while manipulating the conductive ring. Therefore, it may be determined whether there is at least one gear/function sensing electrode, each of which has a sensing value greater than a second trigger threshold within a first time period or a second time period. The first time period is a time period before the sensing value of the auxiliary function sensing electrode is greater than the first trigger threshold, and the second time period is a time period after the sensing value of the auxiliary function sensing electrode is greater than the first trigger threshold.

Specifically, after the user manipulates the magnetic control knob to select the gear/function and before the user touches the auxiliary key to confirm, the sensing values of the multiple gear/function sensing electrodes may be forcibly updated. In this case, the sensing values of all gears/function sensing electrodes are less than the second trigger threshold. Therefore. if there is a gear/function sensing electrode 1300, of which the sensing value exceeds the second trigger threshold, in the first time period before the sensing value of the auxiliary function sensing electrodes exceeds the first trigger threshold, it is indicated that the user may select the gear/function sensing electrode by manipulating the magnetic control knob 2000 during this time period. Based on the principle of priority processing of the gear/function sensing electrode 1300, it is determined that the user's operation of touching the auxiliary key is a mis-operation in this case.

When the user wants to select the gear/function and the auxiliary key is touched unintentionally, because the user just wants to select the gear/function, the user will immediately leave the auxiliary key after touching the auxiliary key. The user touches the auxiliary key for a short time, and the sensing value of the auxiliary function sensing electrode may also exceed the first trigger threshold. Therefore, in order to eliminate this situation, it is determined whether there is a gear/function sensing electrode, of which the sensing value exceeds the second trigger threshold, in the second time period after the sensing value of the auxiliary function sensing electrode is greater than the first trigger threshold. When there is a gear/function sensing electrode whose sensing value exceeds the second trigger threshold, it is indicated that the user may select the gear/function sensing electrode. In a similar manner, based on the principle of priority processing of the gear/function sensing electrode, it is determined that the user's operation of touching the auxiliary key is a mis-operation in this case.

In an application scenario, as long as there is no gear/function sensing electrode whose sensing value exceeds the second trigger threshold in the first time period before the sensing value of the auxiliary function sensing electrode exceeds the first trigger threshold, it is determined that the auxiliary function sensing electrode is triggered. In another application scenario, as long as there is no gear/function sensing electrode whose sensing value exceeds the second trigger threshold in the second time period after the sensing value of the auxiliary function sensing electrode exceeds the first trigger threshold, it is determined that the auxiliary function sensing electrode is triggered. In another application scenario, only when there is no gear/function sensing electrode whose sensing value exceeds the second trigger threshold in the first time period before the sensing value of the auxiliary function sensing electrode exceeds the first trigger threshold or in the second time period after the sensing value of the auxiliary function sensing electrode exceeds the first trigger threshold, it is determined that the auxiliary function sensing electrode is triggered.

In the embodiments, the first trigger threshold may be equal to the second trigger threshold. In other embodiments, the first trigger threshold may be unequal to the second trigger threshold, which is not limited herein.

In the embodiments, the first time period may be 15-25 ms, such as 15 ms, 20 ms, or 25 ms, and the second time period may be 25-35 ms, such as 25 ms, 30 ms, or 35 ms.

In the embodiments, the time point when the auxiliary identification instruction is generated is after the time point when the corresponding gear/function selection instruction is generated, and the time point when the auxiliary identification instruction is generated in an interval of 40 to 60 ms from the time point when the corresponding gear/function selection instruction is generated. For example, the time interval may be 40 ms, 50 ms, or 60 ms.

That is, there is a preset time interval between the time point when the auxiliary identification instruction is generated and the time point when the corresponding gear/function selection instruction is generated. Specifically, the preset time interval is configured to exclude that the auxiliary function sensing electrode being triggered is caused by the user accidentally touching the auxiliary key when manipulating the conductive ring, thereby reducing the occurrence of mis-operation.

In other embodiments, the time interval between the time point when the auxiliary identification instruction is generated and the time point when the corresponding gear/function selection instruction is generated may be other values, which is not limited herein.

In an application scenario, the operation S1012 may include: determining whether there is at least one gear/function sensing electrode, each of which has a sensing value greater than the second trigger threshold within the first time period before the sensing value of the auxiliary function sensing electrode is greater than the first trigger threshold; in response to determining that no gear/function sensing electrode exists of which the sensing value is greater than the second trigger threshold within the first time period, determining whether there is at least one gear/function sensing electrode, each of which has a sensing value greater than the second trigger threshold within the second time period after the sensing value of the auxiliary function sensing electrode is greater than the first trigger threshold, to determine whether there is at least one gear/function sensing electrode, each of which has a sensing value greater than the second trigger threshold within the first time period or the second time period.

In this application scenario, only when there is no gear/function sensing electrode whose sensing value does not exceed the second trigger threshold in the first time period, it is determined whether there is at least one gear/function sensing electrode whose sensing value exceeds the second trigger threshold in the second time period, which may reduce workload and improve efficiency.

In another application scenario, the operation S1012 may include: determining whether there is at least one gear/function sensing electrode, each of which has a sensing value greater than the second trigger threshold within second first time period after the sensing value of the auxiliary function sensing electrode is greater than the first trigger threshold; in response to determining that no gear/function sensing electrode exists of which the sensing value is greater than the second trigger threshold within the first time period, determining whether there is at least one gear/function sensing electrode, each of which has a sensing value greater than the second trigger threshold within the first time period before the sensing value of the auxiliary function sensing electrode is greater than the first trigger threshold, to determine whether there is at least one gear/function sensing electrode, each of which has a sensing value greater than the second trigger threshold within the first time period or the second time period.

In this application scenario, only when there is no gear/function sensing electrode whose sensing value does not exceed the second trigger threshold in the second time period, it is determined whether there is at least one gear/function sensing electrode whose sensing value exceeds the second trigger threshold in the first time period, which may reduce workload and improve efficiency.

It should be noted that the identification method is described above in conjunction with the magnetic control knob in FIG. 3, but the identification method of the present disclosure may be also applicable to other magnetic control knobs, as long as the magnetic control knob is able to achieve both gear/function selection and confirmation.

Further referring to FIG. 47, the magnetic touch panel includes: a touch substrate, an auxiliary function sensing electrode, a plurality of gear/function sensing electrodes, a storage device, and a processing device. The auxiliary function sensing electrode and the gear/function sensing electrodes are arranged under the touch substrate, and are respectively configured to sense the manipulation of the auxiliary key and the gear/function selection sensing block in the magnetic control knob to generate corresponding sensing values. The storage device stores a program. The processing device is connected to the storage device, the auxiliary function sensing electrode, and the gear/function sensing electrodes to retrieve the program stored in the storage device for executing the operations in the identification method for detecting the manipulation of the magnetic control knob in any of the above embodiments, The detailed identification method for detecting the manipulation of the magnetic control knob may be referred to the above embodiments, which will not be repeated herein.

Figure 50:
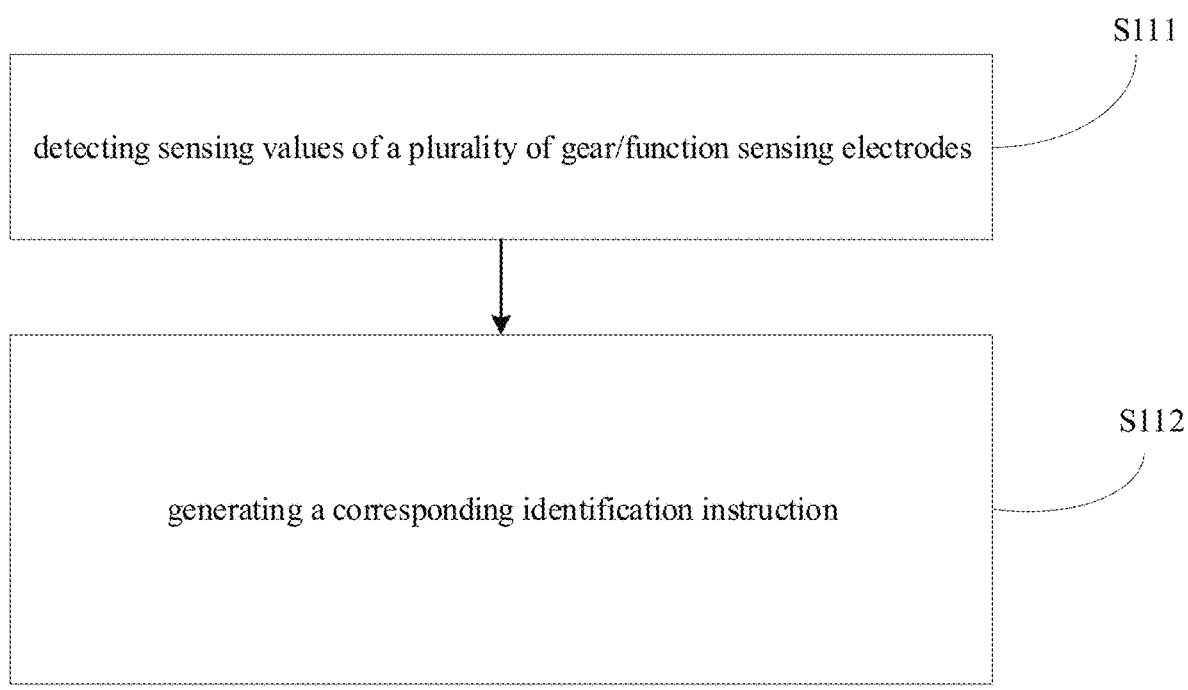
FIG. 50 is a flowchart of an identification method for detecting manipulation of a magnetic control knob according to another embodiment of the present disclosure.

Referring to FIG. 50, FIG. 50 is a flowchart of an identification method for detecting manipulation of a magnetic control knob according to another embodiment of the present disclosure. The execution subject of the identification method for detecting the manipulation of the magnetic control knob in the present disclosure may be a magnetic touch panel.

Specifically, the identification method includes operations at blocks illustrated herein.

At block S111: detecting sensing values of a plurality of gear/function sensing electrodes to determine whether there is a change in a sensing value of at least one gear/function sensing electrode in a first direction or a second direction that is greater than a first threshold.

At block S112: in response to determining that there is a change in the sensing value of at least one gear/function sensing electrode in the first direction or the second direction that is greater than the first threshold, generating a corresponding identification instruction; wherein the identification instruction includes a first identification instruction indicating the magnetic control knob is placed at a magnetic touch panel and/or a second identification instruction indicating the magnetic control knob is removed from the magnetic touch panel.

When the magnetic control knob is placed at the magnetic touch panel, due to the capacitive sensing effect between the gear/function selection sensing block and the gear/function sensing electrode, the sensing value of at least one gear/function sensing electrode generates a change in a direction greater than the first threshold. Compared with the magnetic control button being not placed at the magnetic touch panel, a sudden change will be formed. When the magnetic control button is removed from the magnetic touch panel, also due to the capacitive sensing effect, the sensing value of at least one gear/function sensing electrode also generates a change in a direction greater than the first threshold. Compared with the magnetic control knob being placed at the magnetic touch panel, a sudden change will also be formed.

In the above embodiments, the change of the sensing value of at least one fourth sensing element is configured to determine whether the knob is placed at the magnetic touch panel or removed from the magnetic touch panel according to the capacitive sensing effect, thereby determining the state of the knob without adding additional components to avoid additional costs.

In the embodiments, when it is determined that the sensing value of at least one gear/function sensing electrode generates a change in the first direction greater than the first threshold, the first identification instruction is generated; or, when it is determined that the sensing value of at least one gear/function sensing electrode generates a change in the second direction greater than the first threshold, the second identification instruction is generated.

It is understandable that when the magnetic control knob is placed at the magnetic touch panel, the change direction of the sensing value generated by the gear/function sensing electrode is opposite to the change direction of the sensing value when the magnetic control knob is removed. For details, reference may be made to FIG. 51 and FIG. 52.

Therefore, in an application scenario, when the magnetic control knob is placed, the change direction of the sensing value of at least one gear/function sensing electrode is the positive direction. When the magnetic control knob is removed, the change direction of the sensing value of at least one gear/function sensing electrode is the negative direction.

That is, in this application scenario, the first direction is the positive direction. In other words, when an increase in the sensing value of at least one gear/function sensing electrode 1200 is greater than the first threshold, the first identification instruction indicating that the magnetic control knob is placed at the magnetic touch panel is generated. The second direction is the negative direction. In other words, when a reduction in there is at least one gear/function sensing electrode, each of which has a sensing value greater than the first threshold, the second identification instruction indicating that the magnetic control knob is removed from the magnetic the touch panel is generated.

Figure 51:
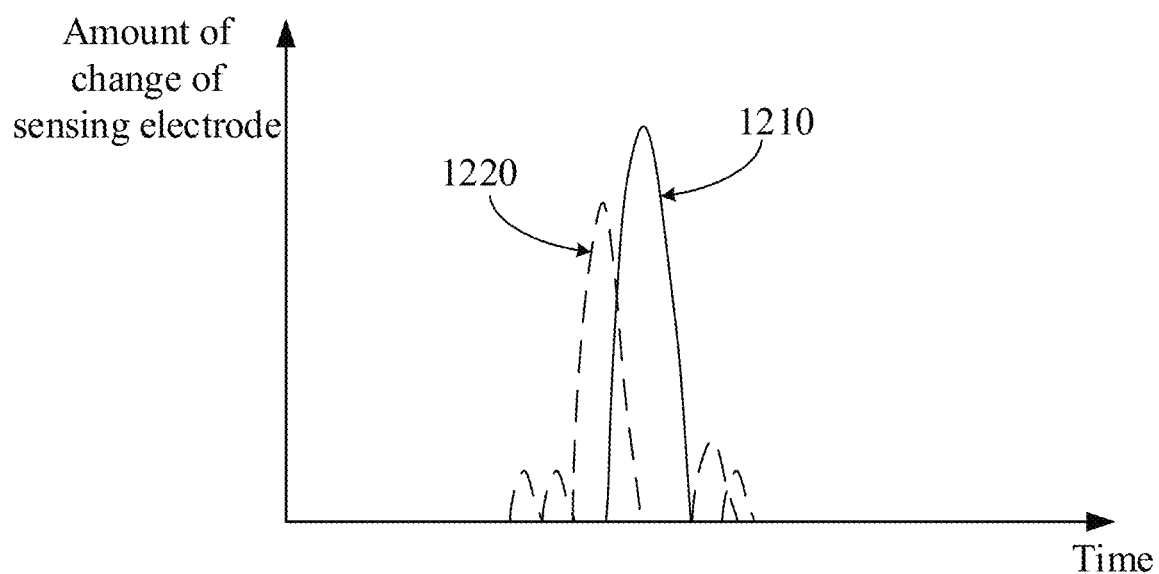
FIG. 51 is a schematic diagram showing change amount of a sensing electrode in a magnetic touch panel when a magnetic control knob is placed at the magnetic touch panel in an application scenario.
Figure 52:
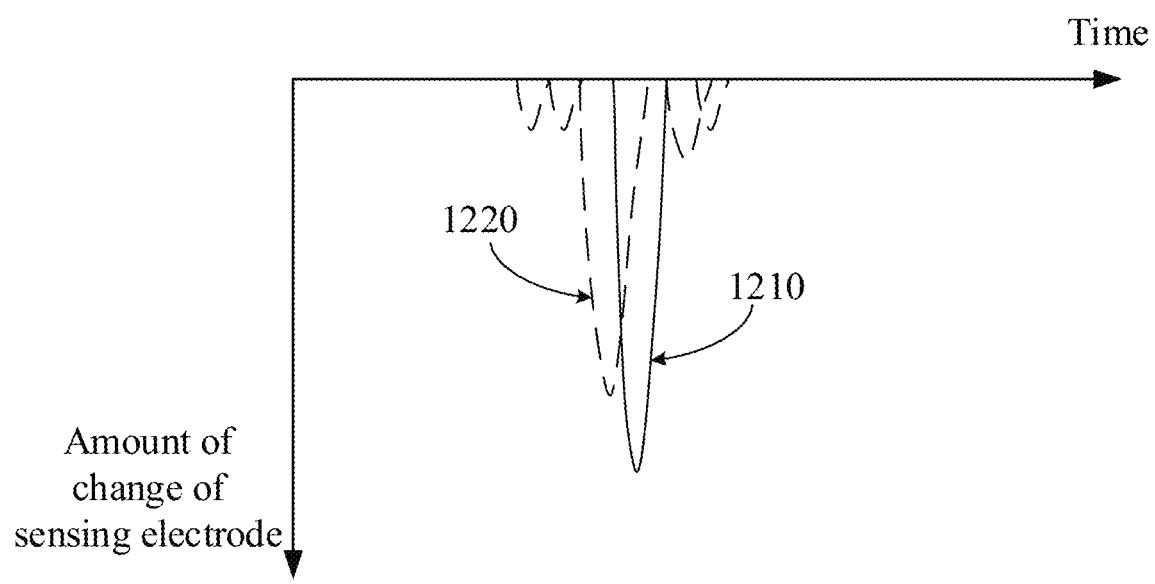
FIG. 52 is a schematic diagram showing change amount of a sensing electrode in a magnetic touch panel when a magnetic control knob is removed from the magnetic touch panel in an application scenario.

In the embodiments, referring to FIGS. 51 and 52, the operation S101 may further include: detecting the sensing values of the plurality of gear/function sensing electrodes to determine there is a change in the sensing value of a first gear/function sensing electrode and in the sensing value of a second gear/function sensing electrode in the first direction or the second direction that is greater than the first threshold; wherein the first gear/function sensing electrode is adjacent to the second gear/function sensing electrode; when the magnetic control knob, which may be placed or removed, is placed at the magnetic touch panel, a projection of the gear/function selection sensing block on the magnetic touch panel at least partially overlaps a region between the first gear/function sensing electrode and the second gear/function sensing electrode.

Specifically, when the magnetic control knob is placed at the magnetic touch panel, the gear/function selection sensing block is likely to be placed adjacent to two adjacent gear/function sensing electrodes at the same time. In this case, a first situation is that the projection of the gear/function selection sensing block on the magnetic touch panel is entirely between the adjacent first gear/function sensing electrode and the second gear/function sensing electrode. In a second situation, a part of the projection of the gear/function selection sensing block on the magnetic touch panel is between the adjacent first gear/function sensing electrode and the second gear/function sensing electrode, and the other part overlaps the first gear/function sensing electrode and/or the second gear/function sensing electrode; in this situation, when the magnetic control knob is placed and the magnetic control knob is removed, the sensing values of the first gear/function sensing electrode and the second gear/function sensing electrode may generate a change greater than the first threshold. Therefore, for the accuracy of identification, the state of the magnetic knob may be determined by the change of the sensing value of the adjacent first gear/function sensing electrode and the second gear/function sensing electrode.

The closer a gear/function sensing electrode is to the gear/function selection sensing block, the greater the change in the sensing value of the gear/function sensing electrode. For example, in the application scenarios of FIG. 51 and FIG. 52, the first gear/function sensing electrode is closer to the gear/function selection sensing block compared with the second gear/function sensing electrode. When the knob is placed or removed, the change in the sensing value 1210 of the first gear/function sensing electrode is greater than the change in the sensing value 1220 of the second gear/function sensing electrode.

In addition, in the application scenarios of FIG. 51 and FIG. 52, when the knob is placed or removed, except for the first gear/function sensing electrode and the second gear/function sensing electrode, the sensing values of remaining gear/function sensing electrodes may also change in the first direction or the second direction, but the changes are not large and will not exceed the first threshold.

In other embodiments, when it can be ensured that the magnetic control knob is placed at the magnetic touch panel, and the gear/function selection sensing block is arranged directly facing a gear/function sensing electrode, the operation S110 may specifically be: detecting the sensing values of the plurality of gears/function sensing electrodes to determine whether there is a change in a sensing value of a gear/function sensing electrode in a first direction or a second direction that is greater than a first threshold.

In the embodiments, the first threshold exceeds 20% of a noise floor.

Specifically, when the user manipulates the magnetic control knob to select a gear/function, the sensing value of the selected gear/function sensing electrode will change. While the sensing value of the unselected gear/function sensing electrode may also change, but the amount of change will not exceed the amount of change generated by the selected gear/function sensing electrode. That is, when the user selects a gear/function, the sensing value of the selected gear/function sensing electrode generates a maximum change. However, there is also an upper limit for the change. The upper limit may be defined as the noise floor. That is, the noise floor is the maximum change in the sensing value of the selected gear/function sensing electrode when the user manipulates the magnetic knob to select a gear/function.

However, in the embodiments, in order to eliminate the situation that the change in the sensing value of at least one gear/function sensing electrode in the first direction or the second direction that is greater than the first threshold is due to the manipulation of the user on the magnetic control knob for selecting a gear/function, the first threshold may be set to exceed 20% of the noise floor, for example, the first threshold exceeds 20%, 30%, or 40% of the noise floor.

In the embodiments, the identification method further includes operations as followed.

S121: detecting a sensing value of an auxiliary function sensing electrode to determine whether the sensing value generate a change in the first direction or the second direction greater than a second threshold.

S122: in response to determining that the sensing value of the auxiliary function sensing electrode generate a change in the first direction or the second direction greater than the second threshold, generating a corresponding auxiliary identification instruction; wherein the auxiliary identification instruction includes a first auxiliary identification instruction indicating that the magnetic control knob is placed at the magnetic touch panel and/or a second auxiliary identification instruction indicating that the magnetic control knob is removed from the magnetic touch panel.

In some embodiments, for detailed description of the user manipulating the auxiliary key, reference may be made to the above embodiments, which will not be repeated herein. The auxiliary key is the first assembly.

An auxiliary function sensing electrode is arranged in the magnetic touch panel. The auxiliary function sensing electrode faces the auxiliary key in the knob, that is, faces the first assembly. The auxiliary function sensing electrode and the gear/function sensing electrode are arranged at the same side of the substrate.

In an application scenario, the user first changes the state of the gear/function selection sensing block by rotating the conductive ring, thereby selecting from the multiple gear/function sensing electrodes. After the user selects the gear/ function, the user may confirm by touching the auxiliary key. The device adjusts the corresponding gear/function accordingly. That is, the auxiliary key is the confirmation button in this case, and the user may confirm by manipulating the auxiliary key. When the user manipulates the auxiliary key, the auxiliary function sensing electrode is triggered, and then a corresponding confirmation identification instruction is generated.

In another application scenario, the user may perform operations such as cancel and pause by manipulating the auxiliary key. For example, when the device is running, the user may pause the work of the device by manipulating the auxiliary key; or, after the user selects a gear or function, the user may cancel the previous selection of gear or function by manipulating the auxiliary key.

In a word, the present disclosure does not limit the functions of the auxiliary key.

Figure 53:
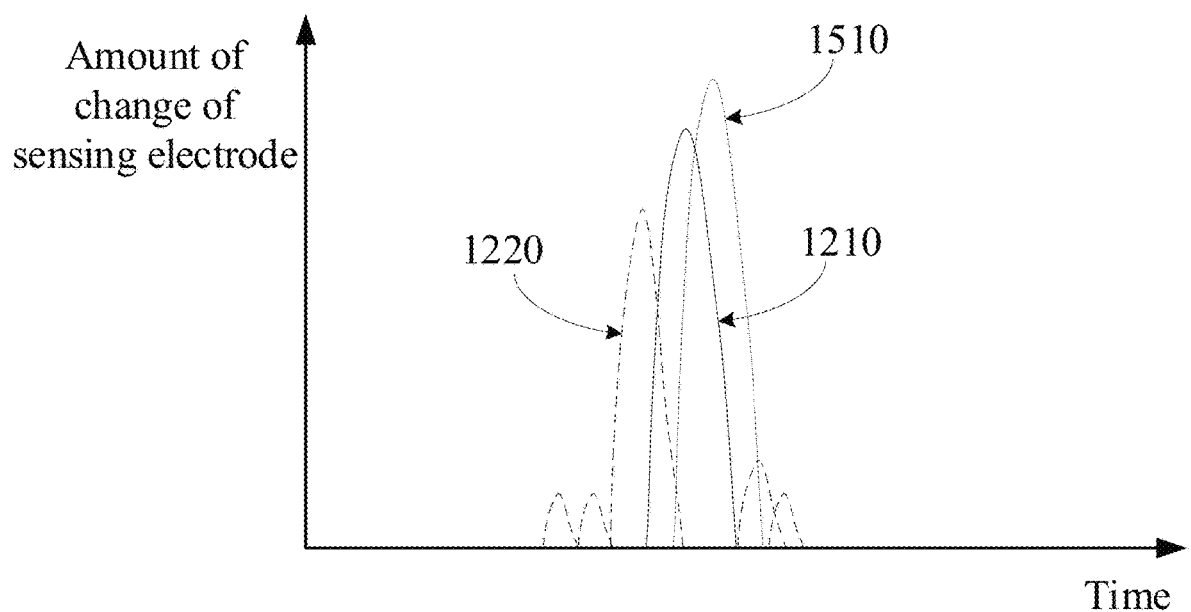
FIG. 53 is a schematic diagram showing change amount of a sensing electrode in a magnetic touch panel when a magnetic control knob is placed at the magnetic touch panel in another application scenario.
Figure 54:
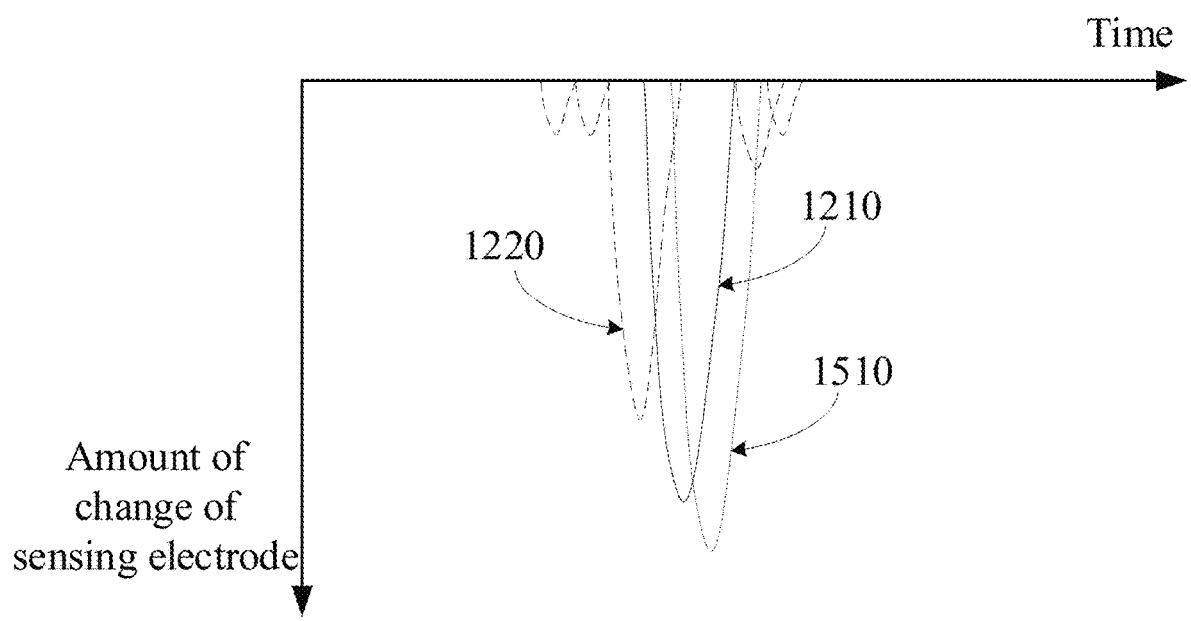
FIG. 54 is a schematic diagram showing change amount of a sensing electrode in a magnetic touch panel when a magnetic control knob is removed from the magnetic touch panel in another application scenario.
Figure 55:
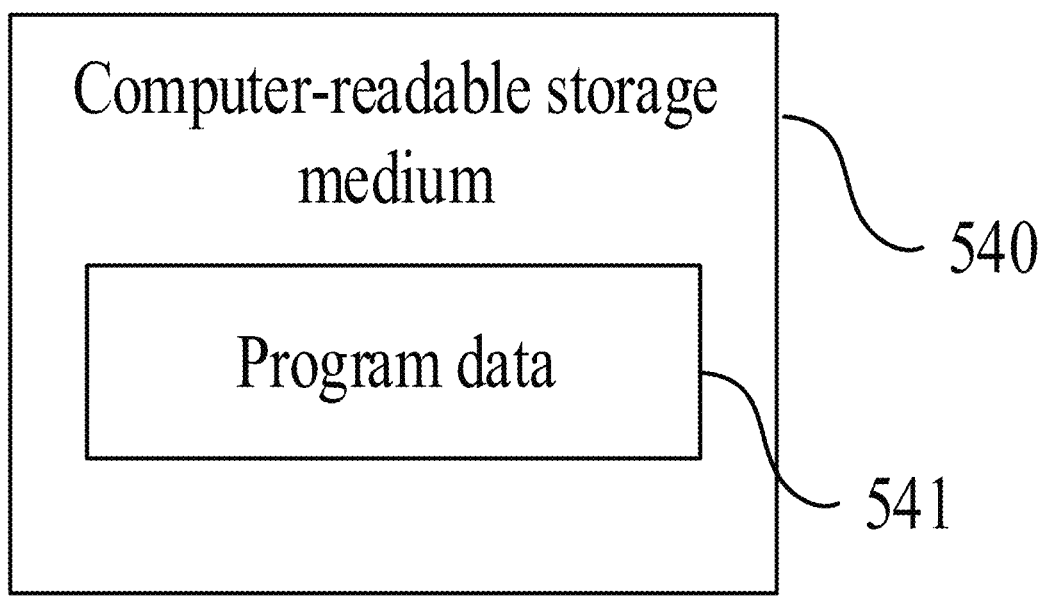
FIG. 55 is a schematic structural diagram of a computer-readable storage medium according to an embodiment of the present disclosure.

As for the auxiliary function sensing electrode, when the magnetic control knob is placed or removed, as illustrated in FIGS. 53 and 54, due to the capacitive sensing effect between the auxiliary function sensing electrode and the auxiliary key, the change of sensing value 1510 of the auxiliary function sensing electrode is a fixed value. Therefore, in the embodiments, the change of the sensing value 1510 of the auxiliary function sensing electrode is applied to perform auxiliary identification, which may avoid that the sensing value of at least one gear/function sensing electrode generating a change in the first direction or the second direction greater than the first threshold is not due to the placing/removing of the magnetic control knob but due to the interference of external factors (for example, oil stains on the magnetic control knob), thereby ensuring the accuracy of identification.

In the embodiments, when it is determined that the sensing value of the auxiliary function sensing electrode generates a change in the first direction greater than the second threshold, the first auxiliary instruction is generated; or, when it is determined that the sensing value of the auxiliary function sensing electrode generates a change in the second direction greater than the second threshold, the second auxiliary instruction is generated.

Similar to the change directions of the sensing value of the gear/function sensing electrode, the change directions of the sensing value of the auxiliary function sensing electrode when the magnetic control knob is placed and removed are opposite.

In the embodiments, the second threshold may be equal to the first threshold. In other embodiments, the second threshold may also be unequal to the first threshold, which is not limited herein.

It should be noted that the structure of the magnetic control knob described above is cited to describe the identification method of the present disclosure, but the identification method of the present disclosure may also be applied to magnetic control knobs of other structures. That is, the present disclosure does not limit the structure of the magnetic control knob.

Referring to FIG. 54, FIG. 54 is a schematic structural diagram of a computer-readable storage medium according to an embodiment of the present disclosure. A computer-readable storage medium 540 stores program data 541, and when the program data 541 is executed by a processor, the implementation of any one of the above methods is performed.

The computer-readable storage medium 540 may be a portable storage medium, such as a U disk, an optical disk, or a terminal, a server, a cooking device, a control panel, etc., which is not limited herein.

The above are only embodiments of the present disclosure, and do not limit the scope of the present disclosure. Any equivalent structure or equivalent process transformation made by using the contents of the description and drawings of the present disclosure, or directly or indirectly applied to other related technical fields, are included in the scope of the present disclosure.

What is claimed is:

1. A knob comprising:
a first assembly including a first sensing element, the first sensing element having a hollow structure;
a second assembly sleeved at the first assembly and including a second sensing element; and
an attachment element disposed within the hollow structure of the first sensing element;
wherein:
the first sensing element is configured to, when the second assembly rotates around a rotation axis, be fixed relative to the rotation axis;
the second sensing element is configured to, when the second assembly rotates around the rotation axis, move around the rotation axis;
the first assembly and the second assembly are conductive elements;
an insulation element is arranged between the second assembly and the first assembly;
the second assembly includes a conductive ring with the rotation axis as a central axis; and
the second sensing element is a conductive block arranged at an inner wall of the conductive ring.

2. The knob according to claim 1, wherein the first sensing element is a conductive column with the rotation axis as a central axis and passing through the second assembly.

3. The knob according to claim 1, wherein:
the conductive ring includes an upper opening and a lower opening opposite to each other along a direction of the rotation axis;
the conductive ring includes a protrusion arranged at the inner wall and protruding toward the rotation axis, an upper surface of the protrusion facing the upper opening forming a step surface;
the first assembly is clamped at the step surface; and
the insulation element is arranged between the first assembly and the step surface.

4. The knob according to claim 3, wherein:
a lower surface of the protrusion facing the lower opening forms an abutting surface;
an upper surface of the conductive block facing the upper opening and the upper surface of the protrusion are disposed at a same plane;
a lower surface of the conductive block facing the lower opening is closer to the lower opening than the lower surface of the protrusion; and
the insulation element includes:
a first insulation ring including:
an accommodation member disposed at the step surface through the upper opening; and
a perforated member connected to the accommodation member; and
a second insulation ring including:
a cover member abutting against the abutting surface through the lower opening; and
an opening member connected to the cover member and communicating with the perforated member.

5. The knob according to claim 4, wherein the cover member includes a slot, and the conductive block is clamped in the slot.

6. The knob according to claim 1, wherein:
the first assembly includes a button top surface and a button bottom surface opposite to each other in a direction of the rotation axis;
the second assembly includes a knob top surface and a knob bottom surface opposite to each other in the direction of the rotation axis;
the first assembly passes through the second assembly; and
the button bottom surface protrudes from the knob bottom surface.

7. The knob according to claim 1, further comprising:
a seat body including an accommodation cavity;
wherein the first assembly is arranged in the accommodation cavity, and the second assembly is sleeved at the seat body.

8. The knob according to claim 7, wherein:
the seat body includes a seat body top surface and a seat body bottom surface opposite to each other in a direction of the rotation axis;
an elastic element connected to the first assembly is arranged in the accommodation cavity;
the first assembly is movably arranged in the accommodation cavity and capable of moving relative to the seat body along the direction of the rotation axis; and
the elastic element is configured to elastically deform in response to the first assembly moving toward the seat body bottom surface.

9. The knob according to claim 7, wherein:
the second assembly is rotatably sleeved at the seat body;
the second assembly includes a first surface facing the seat body, and the seat body includes a second surface facing the first surface;
a first magnetic attraction element group is arranged at one of the first surface and the second surface, the first magnetic attraction element group including at least one first magnetic attraction element;
a second magnetic attraction element group is arranged at another one of the first surface and the second surface, the second magnetic attraction element group including at least two second magnetic attraction elements arranged at intervals; and
when the second assembly rotates relative to the seat body, an interaction force between the first magnetic attraction element group and the second magnetic attraction element group changes.

10. The knob according to claim 7, wherein:
the second assembly is rotatably sleeved at the seat body;
the second assembly includes a first surface facing the seat body, and the seat body includes a second surface facing the first surface;
at least one elastic protrusion is arranged at one of the first surface and the second surface, and a concave-convex structure is formed at another one of the first surface and the second surface;
when the second assembly rotates relative to the seat body, the elastic protrusion slides along the concave-convex structure.

11. A household appliance comprising the knob according to claim 1.

12. The household appliance according to claim 11, further comprising:
a control panel including:
a third sensing element facing the first sensing element; and
at least two fourth sensing elements facing the second sensing element and distributed facing a circumferential path of the second sensing element.

13. The household appliance according to claim 12, wherein the first sensing element and the third sensing element are configured as two electrodes of a first: capacitor, and the second sensing element and the fourth sensing elements are configured as two electrodes of a second capacitor.

14. A knob comprising:
a first assembly including a first sensing element; and
a second assembly sleeved at the first assembly and including a second sensing element;
wherein:
the first sensing element is configured to, when the second assembly rotates around a rotation axis, be fixed relative to the rotation axis;
the second sensing element is configured to, when the second assembly rotates around the rotation axis, move around the rotation axis;
the first assembly and the second assembly are conductive elements;
an insulation element is arranged between the second assembly and the first assembly;
the second assembly includes a conductive ring with the rotation axis as a central axis;
the second sensing element is a conductive block arranged at an inner wall of the conductive ring;
the conductive ring includes an upper opening and a lower opening opposite to each other along a direction of the rotation axis;
the conductive ring includes a protrusion arranged at the inner wall and protruding toward the rotation axis, an upper surface of the protrusion facing the upper opening forming a step surface;
the first assembly is clamped at the step surface; and
the insulation element is arranged between the first assembly and the step surface.

15. A knob comprising:
a first assembly including a first sensing element;
a second assembly sleeved at the first assembly and including a second sensing element; and
a seat body including an accommodation cavity;
wherein:
the first sensing element is configured to, when the second assembly rotates around a rotation axis, be fixed relative to the rotation axis; and
the second sensing element is configured to, when the second assembly rotates around the rotation axis, move around the rotation axis;
the first assembly is arranged in the accommodation cavity, and the second assembly is sleeved at the seat body;
the second assembly is rotatably sleeved at the seat body;
the second assembly includes a first surface facing the seat body, and the seat body includes a second surface facing the first surface;
at least one elastic protrusion is arranged at one of the first surface and the second surface, and a concave-convex structure is formed at another one of the first surface and the second surface;

when the second assembly rotates relative to the seat body, the elastic protrusion slides along the concave-convex structure.

* * * * *